(12) United States Patent
Parmar et al.

(10) Patent No.: US 12,328,895 B2
(45) Date of Patent: Jun. 10, 2025

(54) VERTICAL FIELD EFFECT DEVICE AND METHOD OF MANUFACTURING

(71) Applicant: IDEADED, S.L., Viladecans (ES)

(72) Inventors: Jemish Mahendrabhai Parmar, Viladecans (ES); Guillermo Albareda Piquer, Viladecans (ES); Eduard Puig Marti, Viladecans (ES)

(73) Assignee: IDEADED, S.L., Viladecans (ES)

( * ) Notice: Subject to any disclaimer, the term of this patent is extended or adjusted under 35 U.S.C. 154(b) by 0 days.

(21) Appl. No.: 18/855,293

(22) PCT Filed: Feb. 8, 2024

(86) PCT No.: PCT/EP2024/053214
§ 371 (c)(1),
(2) Date: Oct. 8, 2024

(87) PCT Pub. No.: WO2024/260586
PCT Pub. Date: Dec. 26, 2024

(65) Prior Publication Data
US 2025/0120111 A1    Apr. 10, 2025

(30) Foreign Application Priority Data
Jun. 20, 2023  (EP) .................................. 23382620

(51) Int. Cl.
*H10D 30/47*  (2025.01)
*H10D 30/01*  (2025.01)
(Continued)

(52) U.S. Cl.
CPC ......... *H10D 30/485* (2025.01); *H10D 30/017* (2025.01); *H10D 62/882* (2025.01); *H10D 62/883* (2025.01); *H10D 84/837* (2025.01)

(58) Field of Classification Search
CPC .. H10D 30/485; H10D 30/017; H10D 62/882; H10D 62/883; H10D 84/837;
(Continued)

(56) References Cited

U.S. PATENT DOCUMENTS 9,059,293 B2   6/2015  Gao et al.
10,325,814 B2  6/2019  Nyhus et al.
(Continued)

FOREIGN PATENT DOCUMENTS

| JP | 2004165297 | 6/2004 |
| TW | 201721862 A | 6/2017 |
| TW | 202218118 A | 5/2022 |

*Primary Examiner* — Mohammad A Rahman
(74) *Attorney, Agent, or Firm* — Perry + Currier Inc.

(57) ABSTRACT

The present disclosure relates to vertical field effect transistors (FET). The vertical FET according to the invention includes a substrate (101) and a first electrode (102) configured as either a source or a drain of the transistor. The device includes a second electrode (104) configured as the other of the source and the drain, where the second electrode at least partially overlaps the first electrode in an overlapping region. Moreover, the device comprises an active layer (103) that is sandwiched between the first electrode and the second electrode and a gate arrangement including a gate conductor portion (107) and a gate insulating layer (106), which is arranged between the active layer (103) and a gate conductor portion (107) so as to prevent direct contact between the active layer (103) and the gate conductor portion (107). The active layer (103) comprises a 1D material arranged with its longitudinal axis parallel to the substrate (101) and/or a 2D material arranged with its plane substantially parallel to the substrate (101) The present disclosure further comprises a method (3000) for the manufacture of such vertical field effect transistors as well as for the manufacture of complementary logic devices.

17 Claims, 44 Drawing Sheets

(51) Int. Cl.
   *H10D 62/80* (2025.01)
   *H10D 84/83* (2025.01)
(58) Field of Classification Search
   CPC ... H01L 29/06; H01L 29/786; H01L 21/8238; H01L 29/24
   See application file for complete search history.

(56) References Cited

U.S. PATENT DOCUMENTS

2006/0125025 A1\* 6/2006 Kawashima ........ H01L 29/0676
   257/401
2011/0045660 A1 2/2011 Romano et al.

\* cited by examiner

1249

1326  1327

1316

1317

VERTICAL FIELD EFFECT DEVICE AND METHOD OF MANUFACTURING

The present disclosure relates to field effect devices such as field effect transistors (FET), and more particularly, to vertical field effect transistors, and to methods of manufacturing the same. TEST

BACKGROUND

Semiconductor devices used for integrated circuits have scaled down drastically over the last decades as predicted by Moore's law. Transistor channel length has gone from a few micrometers to just a few nanometers. This downscaling has allowed increased integration of transistors in a single chip and has improved the performance of the manufactured devices.

A field effect transistor (FET) comprises three main terminals: source, drain and gate. A fourth terminal is associated with the body or substrate but is commonly connected to the source, so that the FET is controlled as a three-terminal device. Current can flow from the source to the drain via a channel created in an active (e.g., semiconducting) material, the conductivity of which is controlled by the voltage applied to the gate.

In a conventional design, both source and drain are arranged on a two-dimensional plane and formed on the surface of a semiconducting substrate, providing a so-called planar transistor. A conductive channel is then created on the semiconducting substrate, the length of the channel being defined by the distance between the source and the drain. In order to modulate the conductivity of the channel, voltage is applied to a gate electrode, which is arranged in an area between the source and the drain and which is separated from the semiconducting substrate by means of a dielectric. Upon application of the voltage, current flows (mainly) horizontally, i.e. parallel to the plane containing source, drain and channel.

The length of the channel influences the performance of the transistor in relation to different indicators such as speed or power. In particular, the switching speed of planar transistors can be increased by shrinking the channel, i.e. reducing the length of the channel. Nevertheless, the shrinking of conventional planar transistors has reached its physical limits. Indeed, short-channel effects (SCEs), such as leakage current, and drain-induced barrier lowering or velocity saturation, can occur as the channel length becomes of the same order of magnitude as the depletion-layer widths of the source and drain junctions. As a result, the ability of the gate to properly control the flow of current in the channel is reduced.

In order to mitigate SCEs, a variety of gate device architectures, such as FinFETs or Gate-All-Around (GAA) FETs, have been proposed that enable an improved gate control by providing a larger contact area between the gate and the channel region. Those designs comprise 3D geometries, which permit an improved "wrapping" of the channel by the gate. Thus, in the FinFET transistor, the gate wraps around the channel on three sides of a silicon fin, instead of just a single side as in planar arrangements. This wrapping results in improved control capabilities that allow shorter channel lengths and faster switching times. The GAA FET transistor goes one step further as all four sides of the channel are surrounded by the gate, which results in even better controllability at even shorter channel lengths and hence faster switching times. Overall, such 3D architectures have allowed channel length reduction to a level of a few nanometers. Nevertheless, the manufacturing processes involved are complex and require sophisticated techniques such as extreme ultraviolet (EUV) lithography. Furthermore, the 3D geometries impose new limits on the downscaling due to the mechanical and structural properties of the resulting structures.

As a further move to increase integration of transistors in a substrate, vertical transport field effect transistors (VT-FETs) have been proposed (e.g., in U.S. Pat. No. 10,134, 893B2 or U.S. Pat. No. 10,134,642B2). In these designs, the source and the drain are no longer arranged in the same horizontal two-dimensional plane. Instead, they are defined at different heights with respect to the substrate so that current flows along at least a portion of the channel in a direction substantially perpendicular to the surface of the substrate. Such an arrangement allows for a larger integration of transistors per unit area of the substrate.

Throughout the present disclosure Vertical Field Effect Transistors (VFET) refers to a transistor in which source and drain are not arranged in the same horizontal plane i.e., a channel between source and drain extends at least partially vertically.

Apart from new gate architectures, materials other than silicon, Si, are being evaluated as active material. Indeed, the electron mobility in bulk materials like Si drops significantly as one moves into the nanoscale, so a shift to different materials seems necessary to continue with the downscaling. Hence, semiconducting carbon nanotubes (CNT) or two-dimensional (2D) materials like metal chalcogenides (TMDs) have been proposed as candidates to replace Si for the channel in modern FETs. The use of such new materials comes with its own challenges, which relate particularly to the manufacture of the materials themselves and to their integration in functionally operating devices.

In summary, the continued need for increased integration of field effect devices has resulted in a large number of transistor geometries and architectures using a range of different materials. There is still a need for a transistor design that preserves, or even improves, the performance of FET transistors while enabling even larger integration, leading to channel scaling towards the sub-nanometer scale. There is also a need for a corresponding manufacturing process.

SUMMARY

In an aspect of the present disclosure, a vertical field effect transistor (FET) is provided. The vertical FET comprises a substrate and a first electrode arranged on the substrate and configured as either a source or a drain of the transistor. The transistor further comprises a second electrode, configured as the other of the source and the drain of the transistor, which at least partially overlaps the first electrode in an overlapping region. An active layer is sandwiched between the first electrode and the second electrode. The vertical FET includes a gate having a gate conductor portion and a gate insulating layer, the gate insulating layer being arranged between the gate conductor and the active layer. The active layer may comprise a 1D material arranged with its longitudinal axis substantially parallel to the substrate and/or the active layer may comprise a 2D material arranged with its plane substantially parallel to the substrate.

According to this aspect, a vertical FET with current flowing from the source to the drain through the active layer is presented. The direction of the current flow is substantially perpendicular to the plane defined by the substrate and the channel length is determined by the thickness of the active layer. In other words, in the case of 1D materials, the current flows transversally to the longitudinal axis of the 1D materials. In case 2D materials are used, the current flows transversally to the plane of 2D materials. Transversal transport may thus be regarded as transport along a direction in which the respective material exhibits quantum confinement. The VFETs according to this aspect can increase integration of the number of transistors in a given area of a substrate while reducing the channel length.

In accordance with this aspect, the gate insulating layer is arranged between the gate conductor portion and the active layer so as to prevent direct contact between the gate conductor and the active layer i.e., the gate insulating layer forms a barrier between the gate conductor and the active layer. The gate insulating layer however does not prevent the active layer from experiencing the field effect.

Throughout the present disclosure, the term active material refers to a material whose conductivity can be actively modulated by, e.g. applying a voltage, so that a conducting channel can be created. In particular, said active material may comprise a semiconductor material. Accordingly, an active layer refers to a layer comprising such an active material.

Throughout the present disclosure the term "overlapping region" may be understood as an area or region along which the second electrode is arranged on top of the first electrode, i.e. in a top view, the second electrode blocks at least part of the first electrode. Such overlapping regions may exhibit multiple shapes and dimensions. An outer overlapping perimeter may be regarded as an outer edge of the overlapping region, i.e. the edge encompassing the overlapping region. It should be understood that overlapping does not, by any means, imply any direct contact between the electrodes in such overlapping region.

Throughout the present disclosure the terms "sandwiching" and a "sandwich" structure may be used to refer to an arrangement in which the active layer is arranged between and directly adjacent to the two electrodes. Thus, throughout this disclosure, a sandwich arrangement is understood as meaning that the active layer extends over the overlapping region so as to prevent any direct contact between the electrodes.

Throughout the present disclosure, a 1D material is to be understood as a material comprising 1D elements, e.g. nanotubes. Accordingly, references to the longitudinal axis of a 1D material is to be understood as referring to the longitudinal axis of the 1D elements forming de 1D material.

In a further aspect of the disclosure, a method of manufacturing a vertical field effect transistor is provided. The method comprises: forming a first electrode on a substrate; forming an active layer on the first electrode and forming a second electrode on the active layer thus creating a sandwich structure with an overlapping region having an outer perimeter. The method further comprises defining a gate region, the gate region exposing at least a portion of the active layer. A gate insulating layer is then deposited covering at least the exposed portion of active layer and a gate conductor is deposited on the gate insulating layer. Finally, the method comprises defining electrical contacts for the first electrode, the second electrode and the gate.

According to examples of this further aspect of the disclosure, methods of manufacturing a vertical FET with minimal or reduced process steps are provided. The method examples allow channel downscaling and/or larger contact length between channel and source/drain electrodes, which reduces contact resistance and improved performance.

BRIEF DESCRIPTION OF THE DRAWINGS

FIGS. 3A-3L schematically illustrate a sequence of steps in an example of a method for manufacturing a vertical field effect transistor;

DETAILED DESCRIPTION OF EXAMPLES

Figure 1:
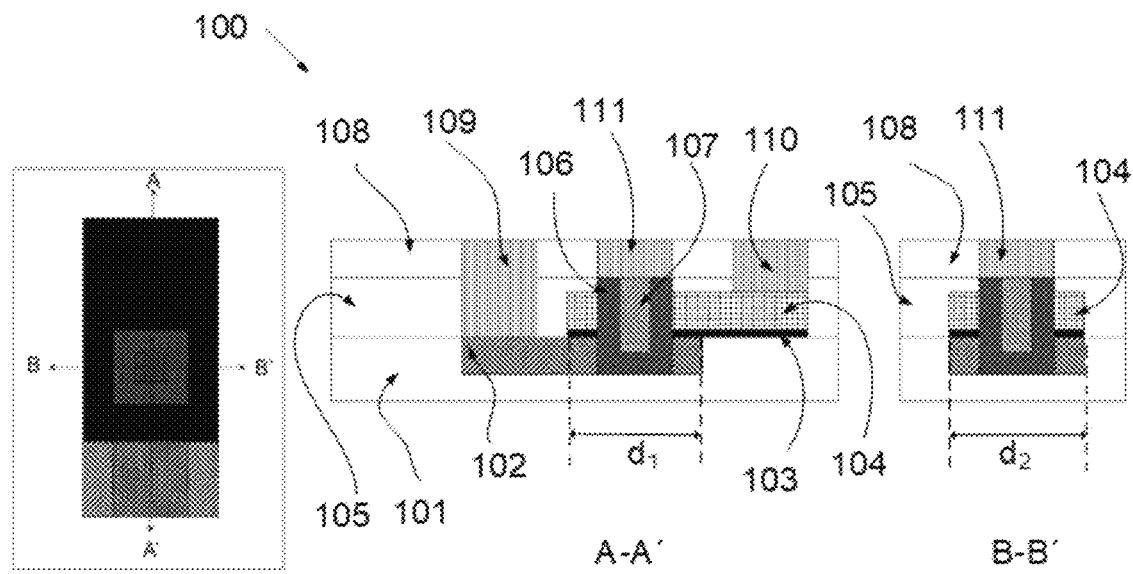
FIG. 1 schematically illustrates a top view and cross-sectional side (A-A') and front (B-B') views of a vertical field effect transistor according to an example.

Reference now will be made in detail to embodiments, one or more examples of which are illustrated in the drawings. Each example is provided by way of explanation only, not as a limitation. In fact, it will be apparent to those skilled in the art that various modifications and variations can be made in the present disclosure. For instance, features illustrated or described as part of one embodiment can be used with another embodiment to yield a still further embodiment. It is intended that the present disclosure covers such modifications and variations as come within the scope of the appended claims and their equivalents. Furthermore, drawings are intended to illustrate the different embodiments and manufacturing process. For the sake of clarity, dimensions of the different elements are not at scale to facilitate identification of the different components.

FIG. 1 is a view of an example of a vertical field effect transistor 100. The figure shows three different views of the transistor: a top view (on the left-hand side), a side cross-sectional view (i.e. along plane A-A' indicated in the top view) and a front cross-sectional view (i.e. along plane B-B' indicated in the top view). The arrangement of top view and cross-sectional views is repeated for many of the other figures.

The vertical FET 100 includes a substrate 101. The substrate 101 may be a silicon, Si, wafer but other substrates known in the art may also be employed, such as silicon germanium (SiGe) or III-V semiconductor wafer. A first electrode 102 is arranged on the substrate 101 in FIG. 1. Said first electrode acts as either the source or the drain of the transistor 100. Different conducting materials may be used for the first electrode 102 including metals (Pd, Rh, Mo, Sc, Au, Pt, W, Ti, etc.), Nitrides (TiN), Oxides (TCOs), 2D materials (e.g. graphene) or 1D materials (e.g. metallic CNTs).

Throughout the present disclosure 2D materials may be regarded as crystalline materials consisting of single- or few-layer atoms. In 2D materials, two dimensions are outside the nanoscale. 2D materials include e.g. graphene, nanofilms, nanolayers, and nanocoatings. 1D materials may be regarded as materials having only one dimension outside the nanoscale. 1D materials include e.g. nanotubes (e.g. CNTs, $MoS_2$ nanotubes or $WS_2$ nanotubes), nanorods, nanowires and others.

Throughout the present disclosure, low dimensional materials may be regarded as materials that have at least one dimension small enough (at the nanoscale) for the physical properties of the material lay somewhere between that of individual atoms and the bulk material. They may include, 0D, 1D, 2D and 3D materials.

The first electrode may be obtained by standard semiconductor manufacturing techniques, including chemical vapor deposition (CVD), Atomic Layer Deposition (ALD), Physical Vapor Deposition (PVD) or ink-based additive methods.

An active material (e.g. semiconductor) layer 103 is arranged on top of the first electrode. In the example of FIG. 1, the active layer 103 is only partially covering the first electrode 102. Nevertheless, as shown in further embodiments, different configurations may be possible. As for the active material used in the active layer 103, different options are feasible, including: 2D materials (TMDs [MX2] such as $MoS_2$, $WS_2$, $WSe_2$); semimetals, such as semi-metallic graphene; Xenes (e.g. phosphorene, silicene); MXenes; semiconductor alloys; amorphous silicon; 1D materials (such as semiconducting CNTs, $MoS_2$ nanotubes, $WS_2$ nanotubes, nanowires or nanorods); organic semiconductors; perovskites, and further inorganic semiconductors like Indium gallium zinc oxide (IGZO).

As shown in FIG. 1, a second electrode 104 is deposited on the active layer 103. The same materials as those mentioned in regard to the first electrode 102 may also be used for the second electrode 104. Different materials may be used for the first electrode 102 and the second electrode 104 of the same transistor. For example, this allows for a way of using different conductors for work function engineering for tuning electrical resistance at the contacts with the active material The active layer 103 acts as the channel of the transistor, whose channel length is then dependent on the thickness of the active layer 103.

The second electrode 104 overlaps the first electrode 102 in a certain overlapping region. In this example, the overlapping region forms a rectangular ring. The overlapping region defines an outer perimeter which, in the embodiment shown in FIG. 1, defines a rectangular shape with length and width, $d_1$ and $d_2$ respectively as observed in the Figure. The sum of the overlapping region $d_1$ and $d_2$ (perimeter) is similar to the channel width concept in traditional planar FETs.

Also shown in the figure is a first interlayer dielectric layer 105. Different dielectric materials may be employed for the interlayer dielectric (ILD) layer, including a number of both organic and inorganic oxides or other low-K materials. The ILD layer may be obtained by standard deposition techniques such as chemical vapor deposition (CVD) or atomic layer deposition (ALD), sputtering, spin coating (e.g. SOD).

The vertical field effect transistor further comprises a gate having a gate conductor portion and a gate insulating layer, the gate insulating layer 106 having a U-shaped cross-section and surrounding the gate conductor portion 107 and arranged in contact with the active layer 103.

The gate insulating layer 106 is in contact with a portion of the active layer 103 along the thickness of the latter. A material with a high dielectric constant is preferable for the gate insulating layer 106. Thus, $SiO_2$, $SiO_xN_y$A, or, preferably, high-K materials (e.g. $HfO_2$, $Al_2O_3$, HfSiON, $ZrO_2$, $La_2O_3$, $Ta_2O_5$, $TiO_2$, $BaTiO_3$) may be used. The gate structure further comprises a gate conductor 107, which is arranged in the inner volume defined by the U-shaped gate insulating layer 106.

As shown in FIG. 1, the gate conductor 107 is deposited (i.e. formed or grown) on top of the gate insulating layer 106 so that direct contact between the gate conductor 107 and any of the electrodes, 102 and 104, or the active layer 103 is prevented. The application of a certain voltage to the gate conductor 107 determines the current flow between the first electrode 102 and the second electrode 104 via the active layer 103.

As observed in FIG. 1, a feature of this design is that the current flows in a directional substantially perpendicular to the substrate, i.e. vertically when assuming that the substrate is arranged on a flat horizontal surface. A second interlayer dielectric (ILD) 108 may be arranged in the transistor 100. The same dielectric materials as for the first dielectric layer 105 may be used for the second dielectric 108 although it is understood that different dielectrics may be employed for each dielectric in the same transistor.

Finally, three contacts defining the three terminals of the transistor may be provided. In particular, a first source/drain contact 109 is used to contact the first electrode 102, a second source/drain contact 110 is used for the second electrode 104, and a third contact 111 is used for the gate conductor 107. Similarly to the electrodes, different materials may also be used for the contacts. These include metals (e.g. Ti, Ru, W, Co, Ni), Nitrides (TiN, TaN), Binary alloys, metallic CNTs or conductive 2D materials like graphene.

Figure 2:
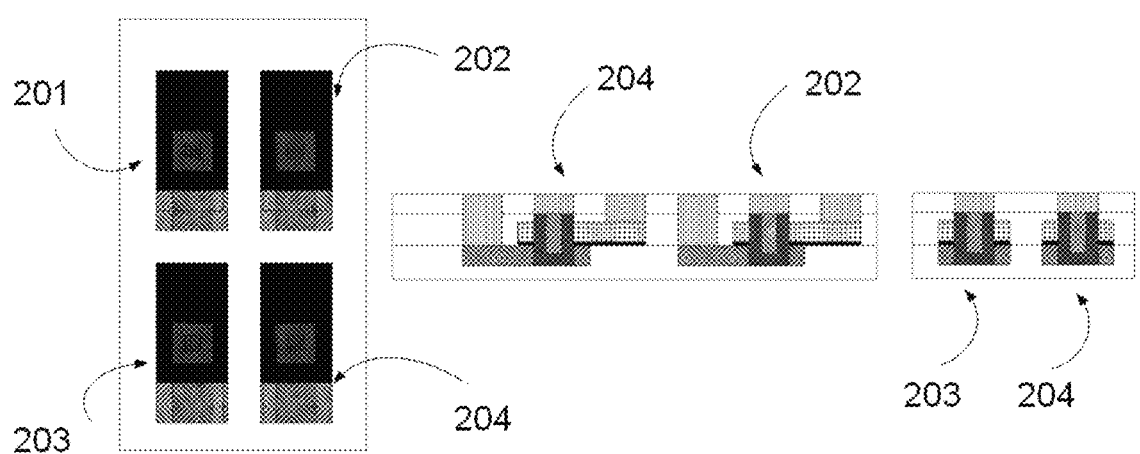
FIG. 2 schematically illustrates an example of an arrangement of four vertical FETs on a substrate.

FIG. 1 provides a schematic view of a single transistor 100. As is well known to those skilled in the art, a very large number of such transistors may actually be manufactured in a single substrate. Just for illustration purposes, FIG. 2 provides a view of a set of four transistors 201-204, which might represent a small portion of the overall substrate.

Figure 3A:
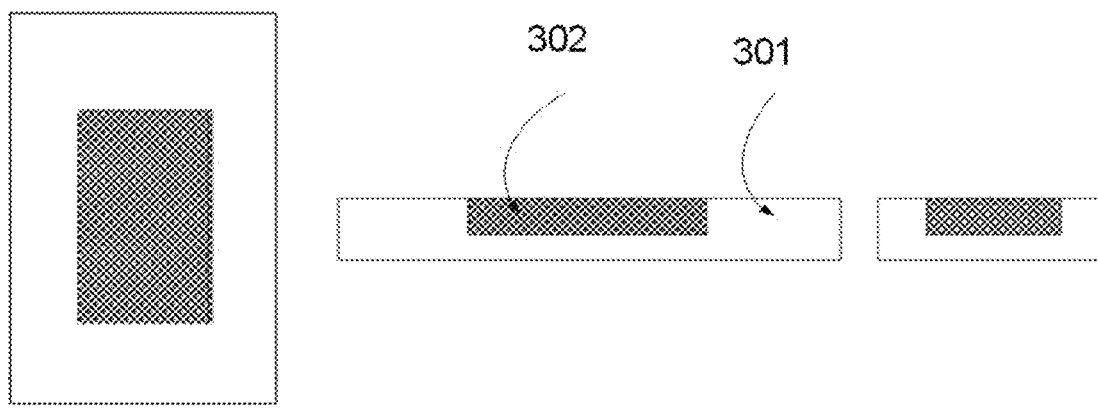
Figure 3C:
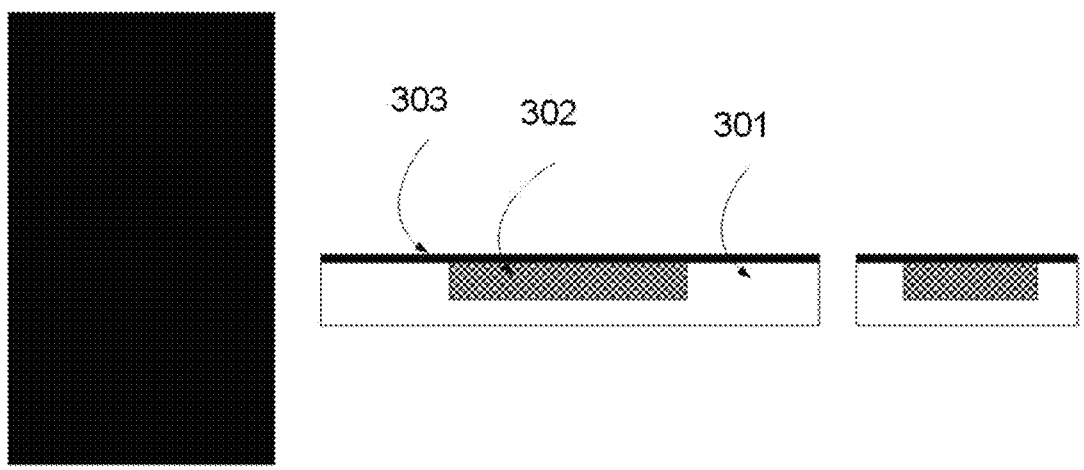
Figure 3C:
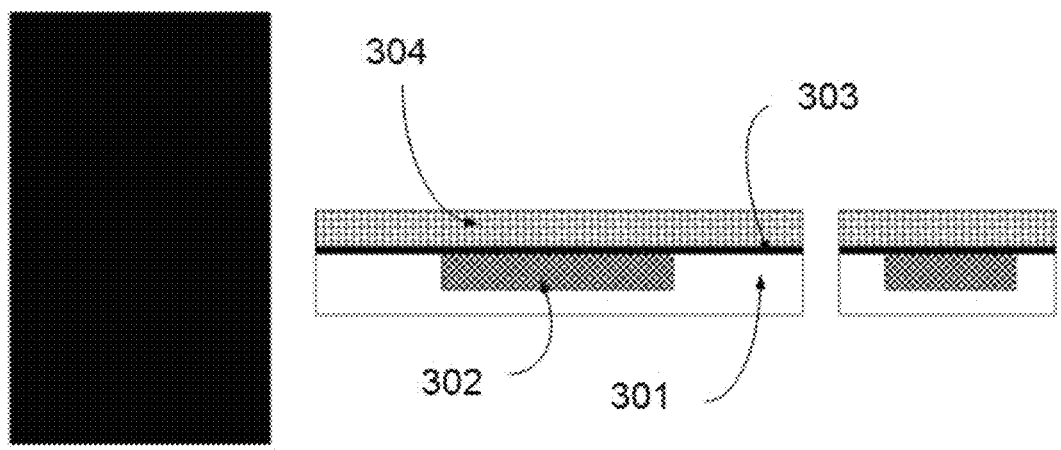
Figure 3D:
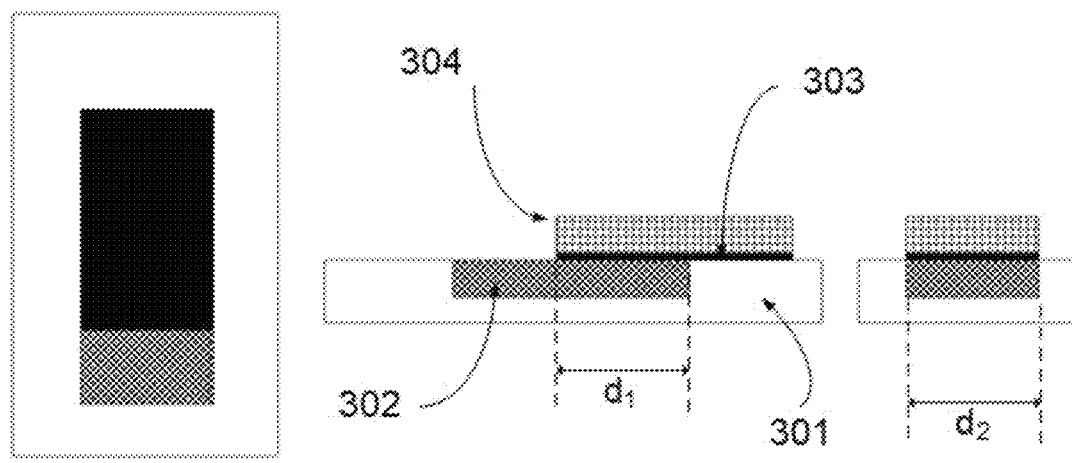

Reference will be now made to FIGS. 3A-3L to explain an example of a manufacturing sequence to obtain a vertical field effect transistor like the one presented in reference to FIG. 1. FIG. 3A shows the first step in the sequence, which is the formation of the first electrode 302 on a substrate 301. The present invention is in no way limited to any specific substrate.

In some examples, the substrate 301 may be silicon, Si. Furthermore, the substrate may comprise a dielectric layer such as a thermally grown oxide. Alternatively, a dielectric layer may be deposited with standard deposition techniques such as chemical vapor deposition (CVD), physical vapor deposition (PVD), atomic layer deposition (ALD), etc.

As already mentioned with reference to FIG. 1, different materials may be used for the first electrode 302. The selection of one material or another may also impact the technique used for its formation. Lithography along with lift-off and/or etching based processes as well as additive methods can be used for desired pattern shaping. In some examples, the substrate 301 may first be patterned by means of a photolithography and dry etching step. Subsequently, the material for the first electrode 302 may be deposited (e.g. by chemical vapor deposition (CVD), physical vapor deposition (PVD), atomic layer deposition (ALD), etc.). Afterwards, a chemical mechanical planarization (CMP) process may be used to obtain a smooth surface and remove necessary amount of material.

A possible next step is shown in FIG. 3B. This step comprises the deposition (i.e. formed, coated, grown) of an active layer 303. The active layer 303 in this example is deposited over the whole area of the substrate so that it completely covers the first electrode 302. Different materials, including 1D and 2D materials, may be used for the active layer 303 as already described with reference to FIG. 1.

The next step (FIG. 3C) is the deposition of the second electrode 304 which, in this particular embodiment, is also deposited over the whole area. Similar materials and techniques as those already mentioned with respect to the first electrode 302 and mentioned with reference to FIG. 1, may be used for the second electrode 304. At this stage of the manufacturing process, a sandwich structure is created with the first electrode 302 at the bottom, the second electrode 304 at the top, and the active layer 303 in between.

In a further step (FIG. 3D), photolithography and/or dry etching may be used to define the area of the transistor. Etch masks maybe used to facilitate etching as known by those skilled in the art. In particular, this step defines the dimensions of the active layer 303 and of the second electrode 304. This step further defines, shape and dimensions of an overlapping region, i.e. a region where the second electrode 304 overlaps the first electrode 302. This overlapping region defines an outer overlapping perimeter which, in the embodiment shown, corresponds to a rectangle with sides $d_1$ and $d_2$.

Figure 3E:
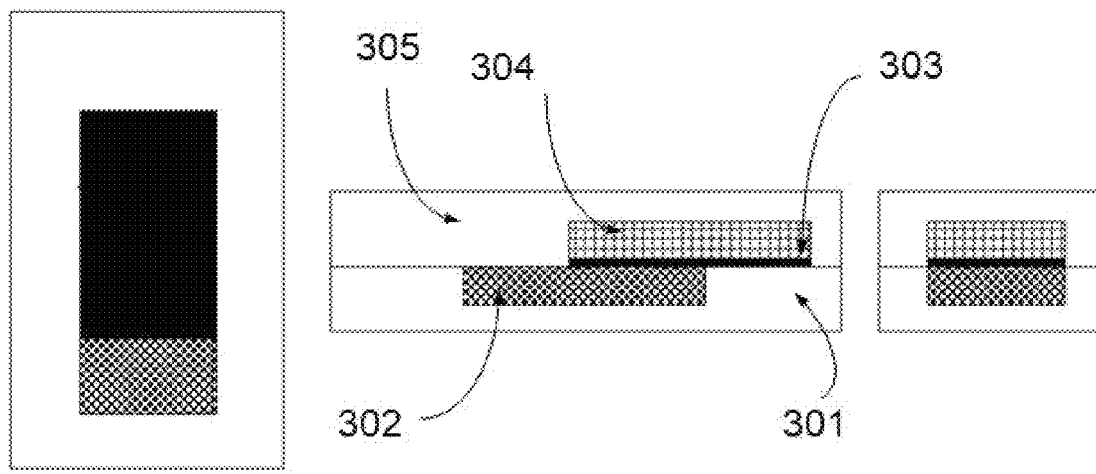
Figure 3F:
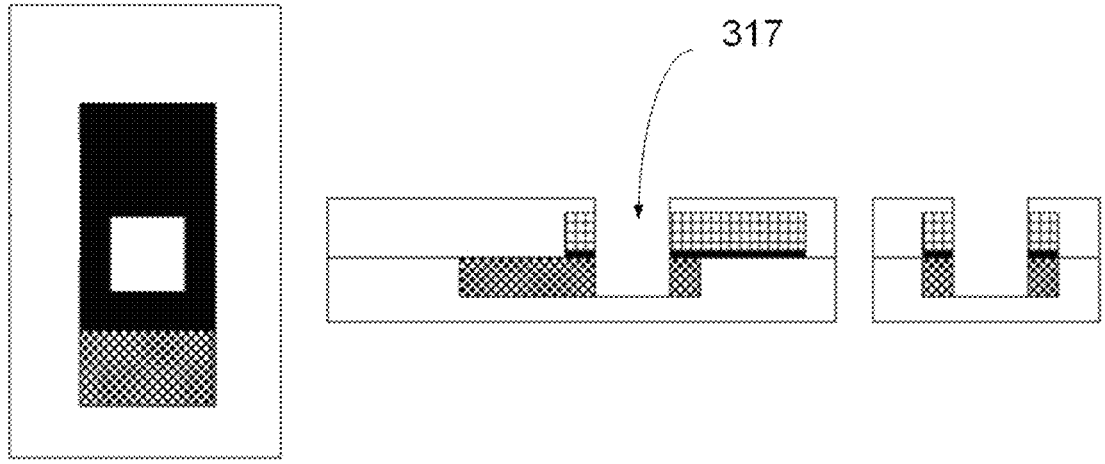

Upon completion and definition of the sandwich structure, the next step may comprise the deposition of a first interlayer dielectric, ILD, layer 305 (FIG. 3E). Such ILD may be useful for the preparation of the next step which, as shown in FIG. 3F, consists in defining a gate region 317, which resembles a cavity or well in this case, by means of photolithography and dry etching steps. Etch masks maybe used to facilitate etching as known by those skilled in the art. As shown in FIG. 3F, the gate region 317 in this particular example is completely inside or embedded within the outer perimeter of the overlapping region. As a result, the gate in this transistor is completely surrounded by the semiconductor, thus providing a Semiconductor-All-Around (or SAA) arrangement. Such an arrangement provides a large surface area between the gate and the active layer 303, which allows for a better ability of the gate to control current flow in the channel defined by the active layer 303.

Figure 3G:
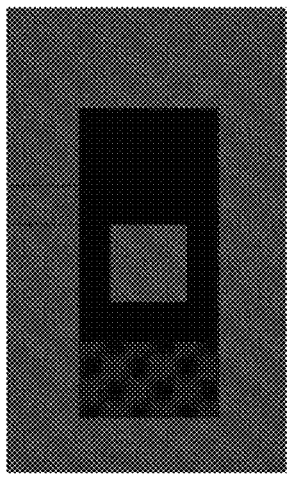
Figure 3G:
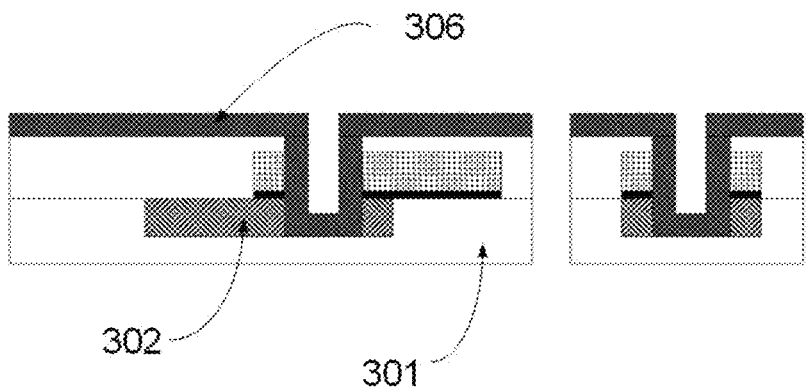

After definition of the gate (cavity-like) region 317, a next step (FIG. 3G) may be the formation or deposition of the gate dielectric to form a gate insulating layer 306 with a U-shaped cross-section. As shown in FIG. 3G, in this manufacturing process, the gate dielectric is first deposited over the whole substrate, i.e. not only in the gate region 317 but also on top of the ILD layer 305. The gate dielectric 306 may comprise different materials such as, but not limited to, silicon oxide, aluminum oxide, titanium oxide, tantalum oxide, yttrium oxide, silicon oxynitride, silicon nitride, boron nitride, zirconium silicon oxide, hafnium silicon oxide, zirconium oxide, lanthanum oxide or, preferably, high-K materials (e.g. $HfO_2$, $HfSiO_4$ or $O_4SiZr$). Depending on the selected material, the gate insulating layer 306 may be formed with standard techniques such as chemical vapor deposition (CVD), physical vapor deposition (PVD), spin coating or preferably atomic layer deposition (ALD) as known by those skilled in the art.

Figure 3H:
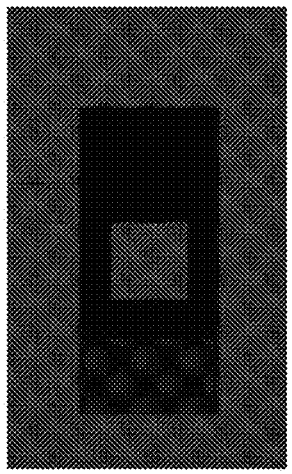
Figure 3H:
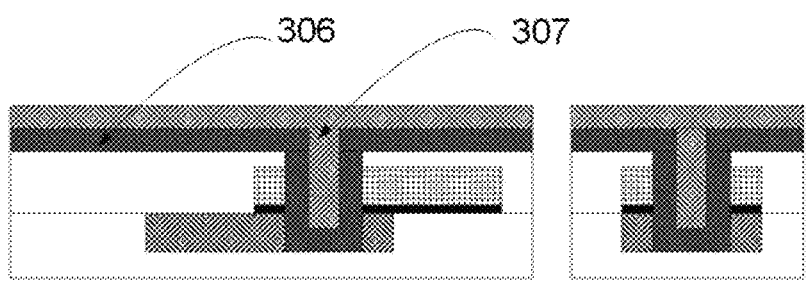

After deposition of the gate insulator, the gate conductor 307 is deposited in the next step (FIG. 3H). As with the deposition of the gate insulator, the gate conductor in this example is also deposited over the whole area, i.e. over the previously deposited insulating layer.

Figure 3I:
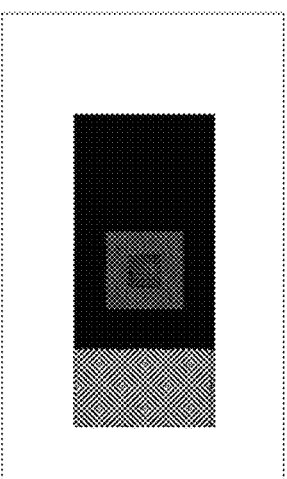
Figure 3I:
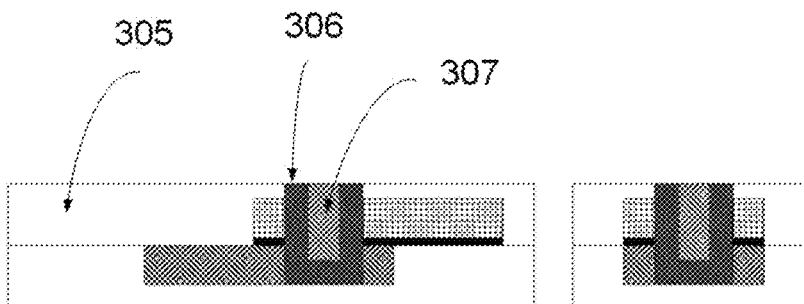

FIG. 3I shows the step of removing superfluous portions of both the insulating layer and the gate conductor i.e., removing material from those areas extending beyond the borders of the gate region 317 shown in FIG. 3F. For that purpose, an etching, and a chemical mechanical planarization (CMP) process may be used. This step can also be used directly after gate insulator deposition and repeated after gate conductor deposition.

Figure 3J:
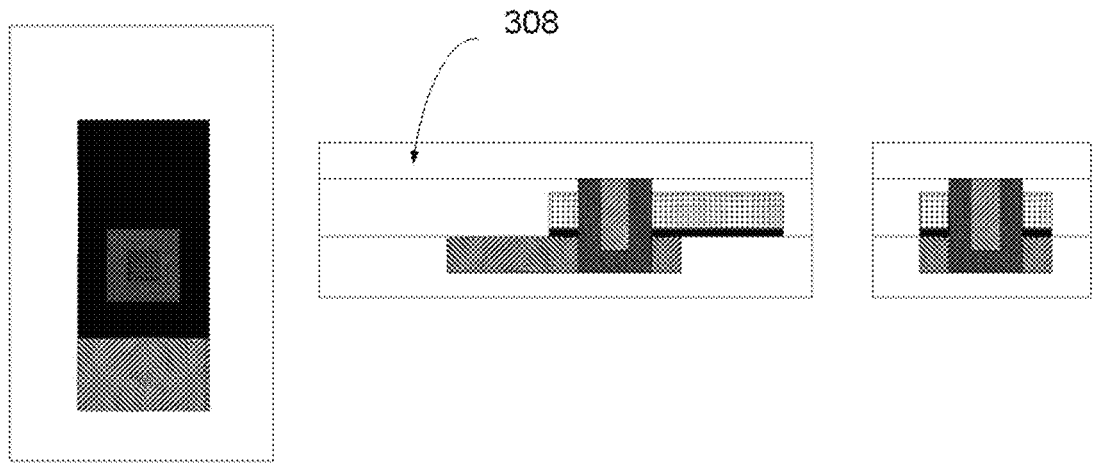
Figure 3K:
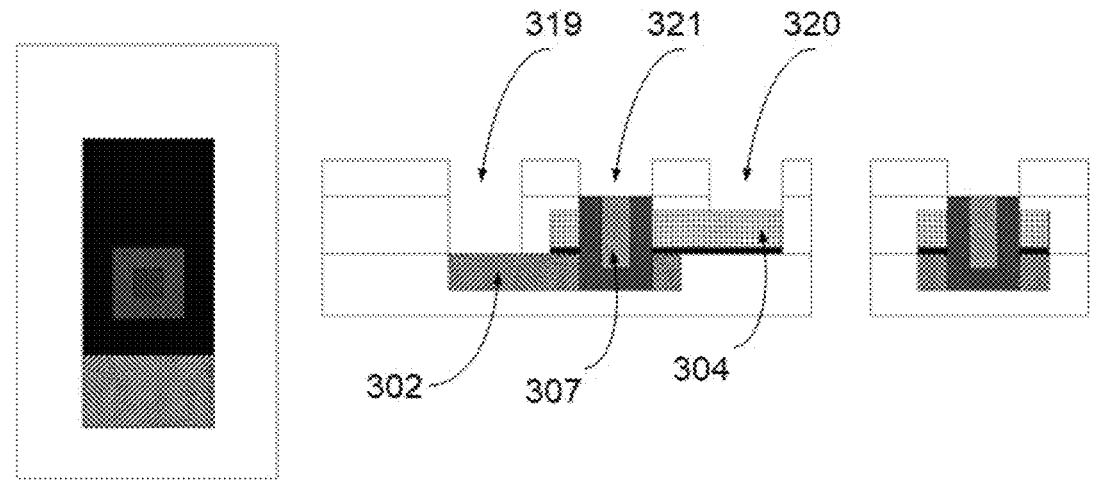

A second interlayer dielectric (ILD) layer 308 may then be deposited as shown in FIG. 3J. This precedes the formation of the contact regions 319, 320 and 321 for the electrodes and for the gate. FIG. 3K shows the patterning of the ILD layers 305 and 308 This process involves photolithography and dry etching and it exposes the first electrode 302 by creating a contact region 319, the second electrode 304 in contact region 320 and the gate structure 307 in contact region 321.

Figure 3L:
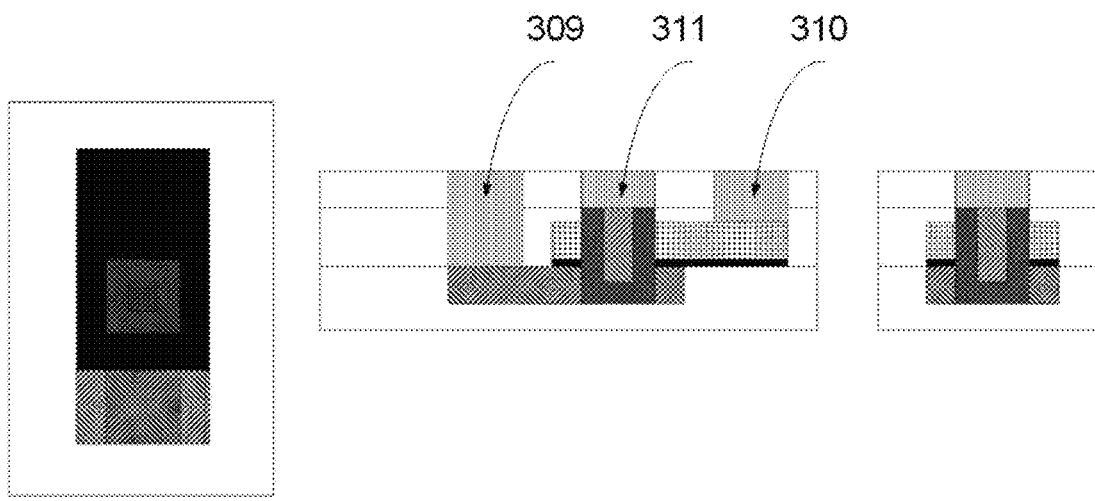

Finally, contact material may be deposited to create a first electrode contact 309, a second electrode contact 310 and a gate structure contact 311 as shown in FIG. 3L. In this case, although not shown in the sequence, the contact material may be deposited over the whole surface (equivalent to the deposition of the insulating material and the gate conductor presented in FIGS. 3G and 3H) and then selectively removed from the areas not aligned with the electrodes and with the gate by means of a chemical mechanical planarization (CMP) process. Multiple contact material stacks may be used, such as barrier layer (TiN, Ti) by PVD or ALD and subsequent material (such as but not limited to Al, Cu, W by ALD, PVD or CVD, 2D or 1D by CVD or coating like deposition). Other conductors such as ruthenium oxide, tantalum nitride can be also employed.

The method described above requires relatively few process steps which can be as little as three photolithography steps for transistor fabrication and one more step for contact opening. Another advantage is that sub 10 nm scaling can be achieved while using single exposure (no multi patterning necessary) dry DUV (Deep Ultraviolet) lithography methods without using expensive immersion lithography or EUV (Extreme ultraviolet) lithography. Use of EUV would allow for higher resolution and reduction in overall dimensions.

Figure 4A:
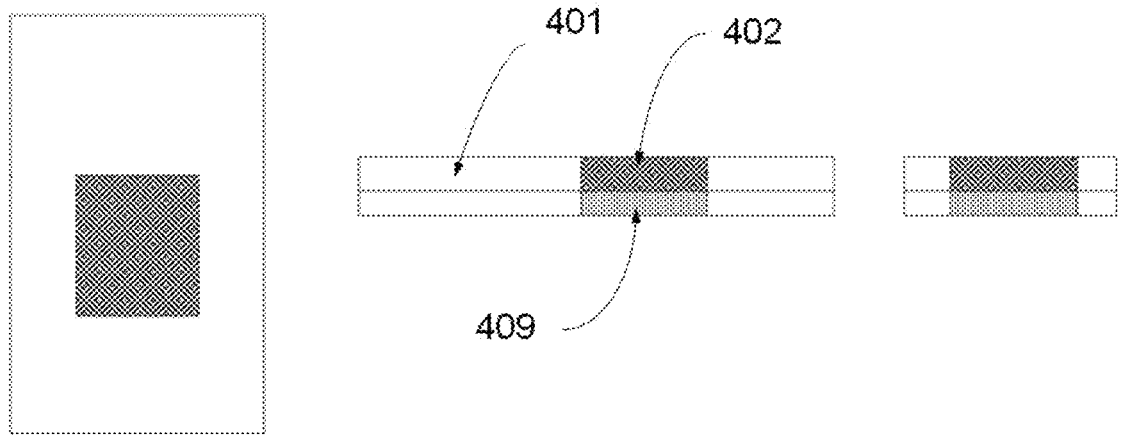
FIGS. 4A-4L schematically illustrate a sequence of steps in another example of a method for manufacturing a vertical field effect transistor comprising fins.

FIGS. 4A-4L show a manufacturing sequence for a second example of a vertical FET. Although all the steps are also presented, this description will focus on those aspects that differ from the previously explained sequence (with reference to FIGS. 3A-3L), In a first step, FIG. 4A shows the formation of a first electrode 402 on a substrate 401. Note that, in this sequence, the contact 409 for the first electrode 402 is carried out at an early stage in the process. In this example, the transistor comprises a bottom contact whereas the transistor shown in reference to FIG. 1 (and manufacturing sequence 3A-3L) comprised all contacts at the top. In any case, as will be appreciated by those skilled in the art, both configurations may be combined and, e.g. the first contact 109 in FIG. 1 may also be arranged as a bottom contact. Conversely, the bottom contact 409 in FIG. 4A may also be arranged as a top contact by following the steps shown for the equivalent contact in regard to the example of FIG. 3.

FIGS. 4B to 4E relate to manufacturing steps that are generally the same or equivalent to those already described with regard to FIGS. 3B to 3E, so no further explanation is deemed necessary. In particular, an interlayer dielectric (ILD) layer 405 is deposited after the patterning of the second electrode 404 and the active layer 403.

Figure 4B:
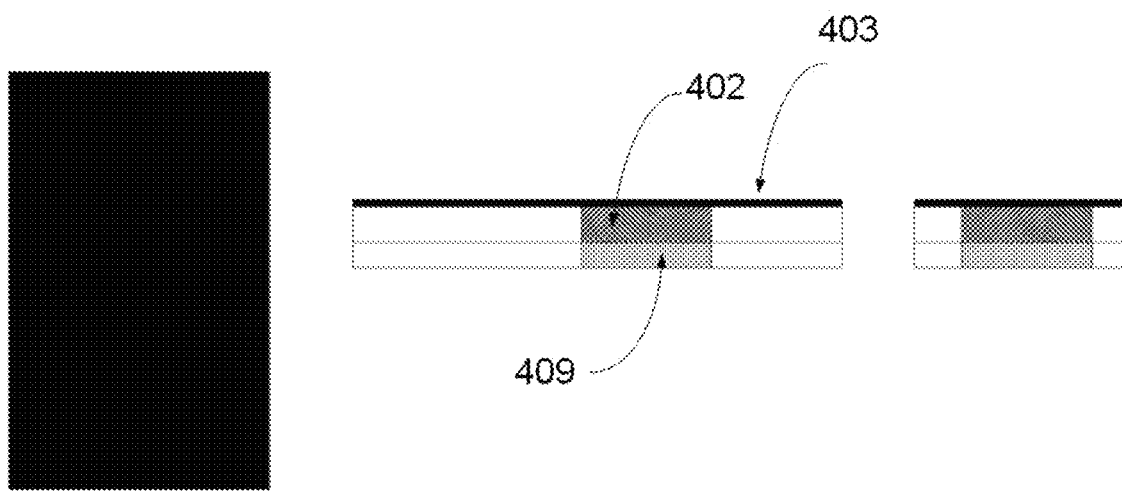
Figure 4C:
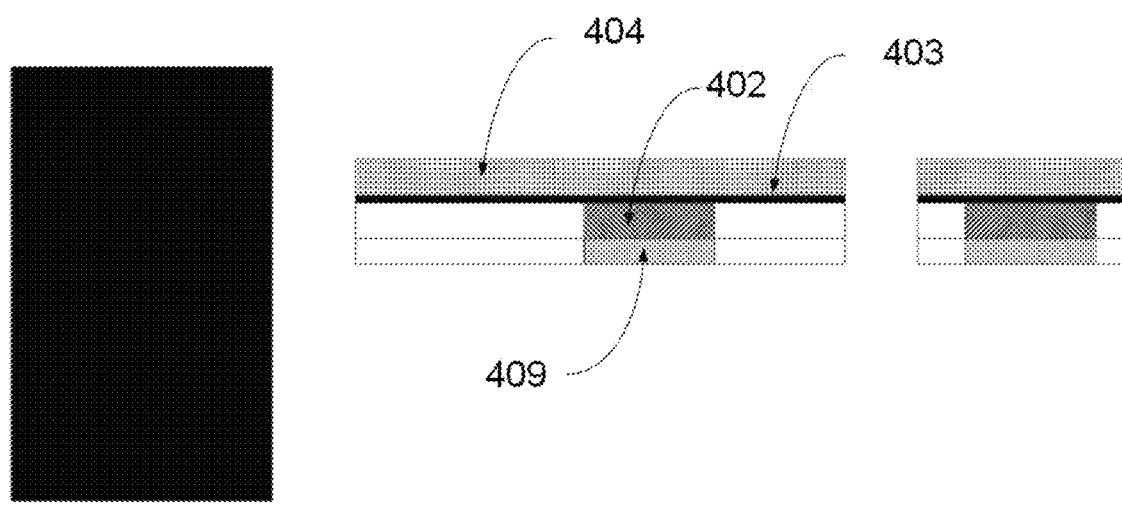
Figure 4D:
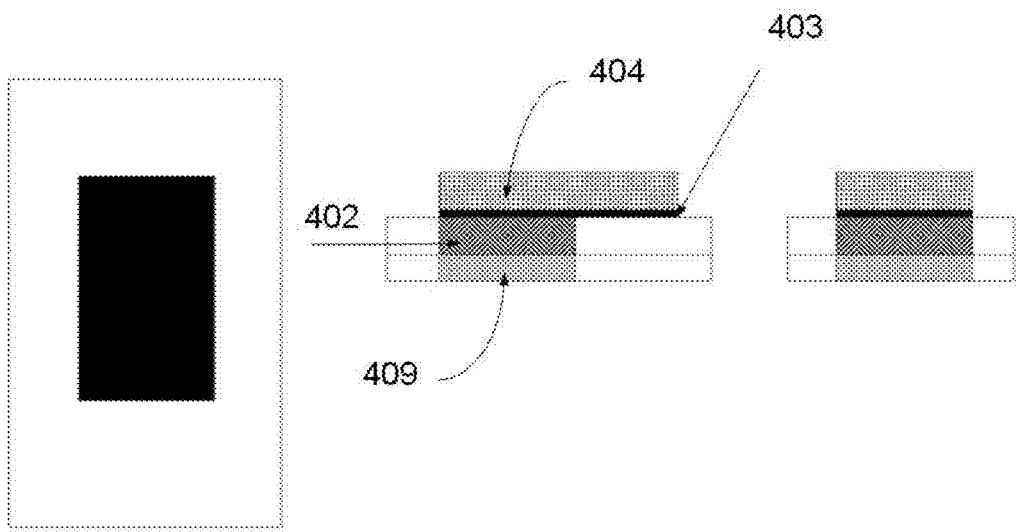
Figure 4E:
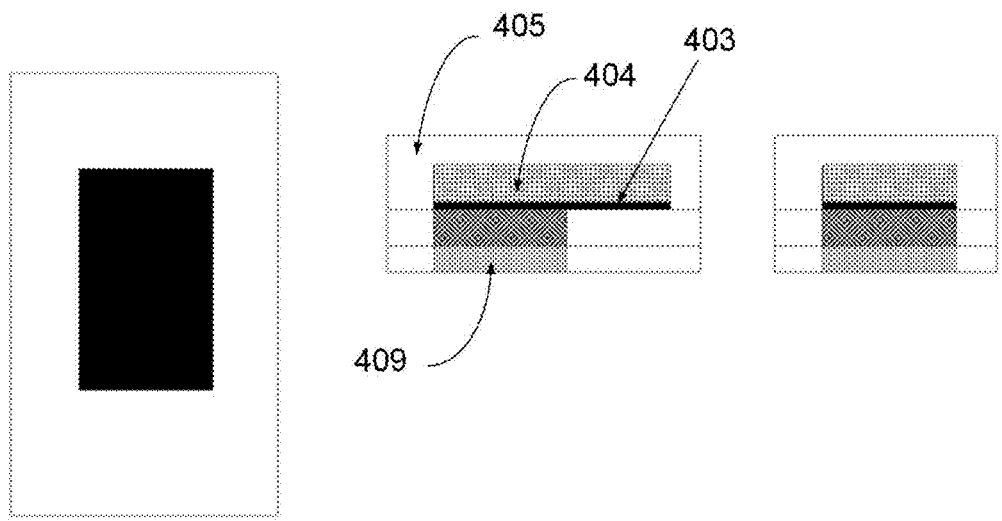
Figure 4F:
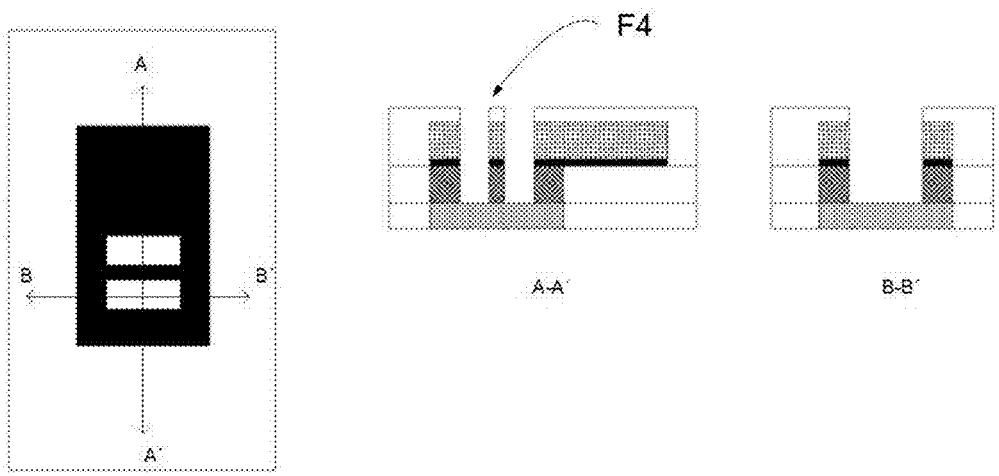
Figure 4G:
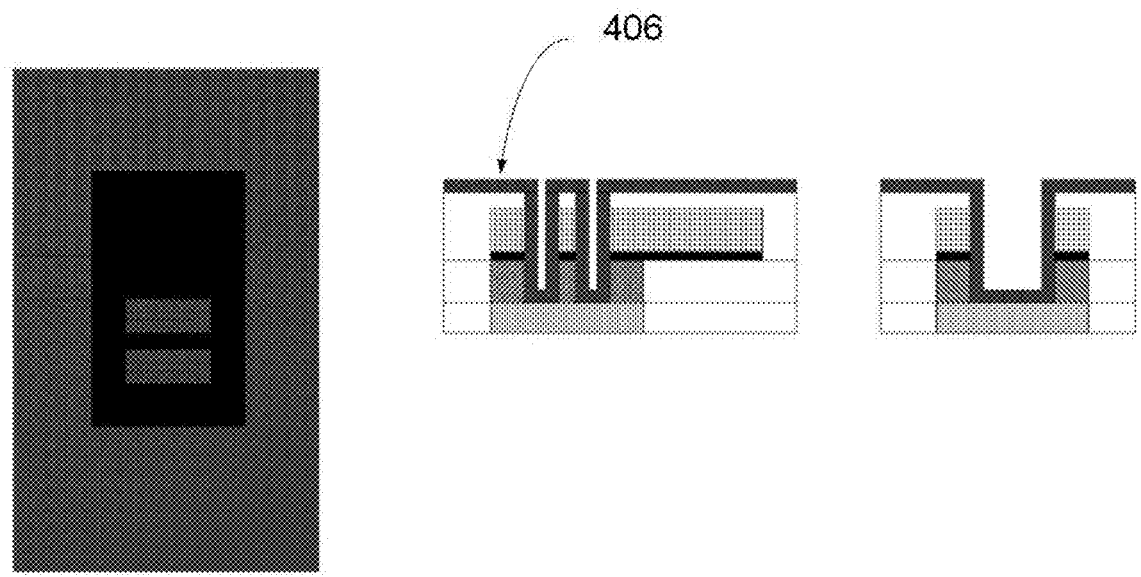
Figure 4H:
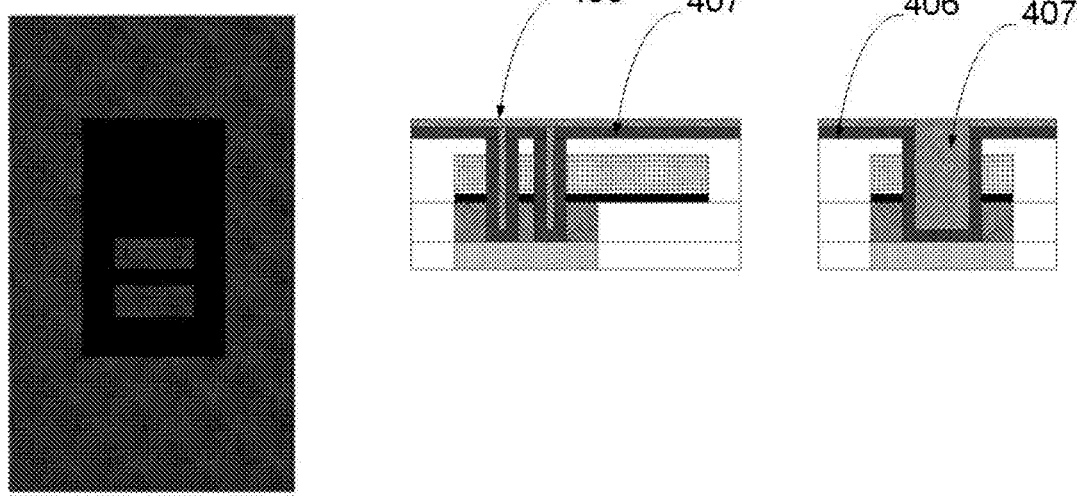
Figure 4I:
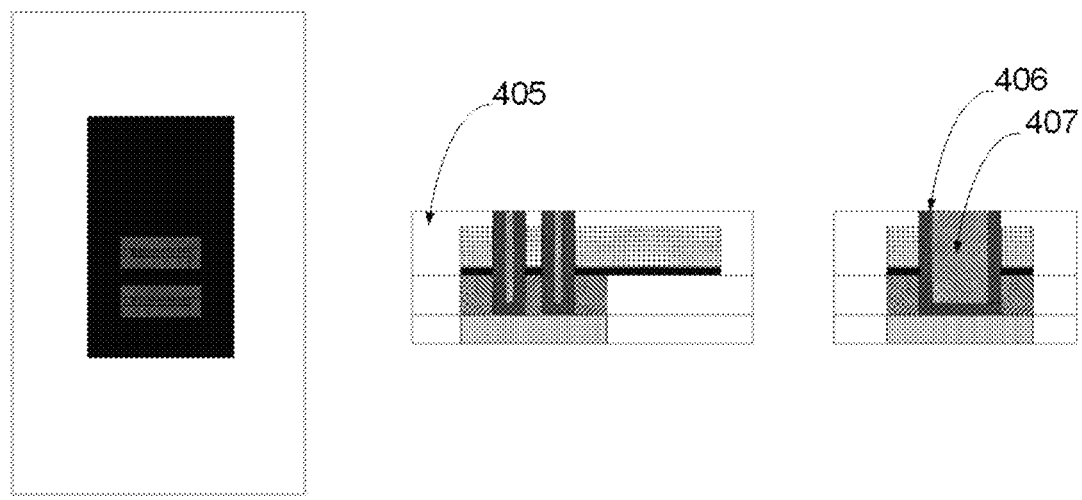

FIG. 4F differs from FIG. 3F as the transistor of the present example comprises a fin F4. It is understood that, even if this embodiment comprises a single fin, alternative designs with a larger number of fins may be realized in the same manner. For the sake of clarity, the term fin refers to the fin-like structure that originates in the space between two cavities. Thus, FIG. 4F shows how, unlike in FIG. 3F, two gate regions or cavities are defined in the structure. More than two cavities may be made in similar way.

Figure 4J:
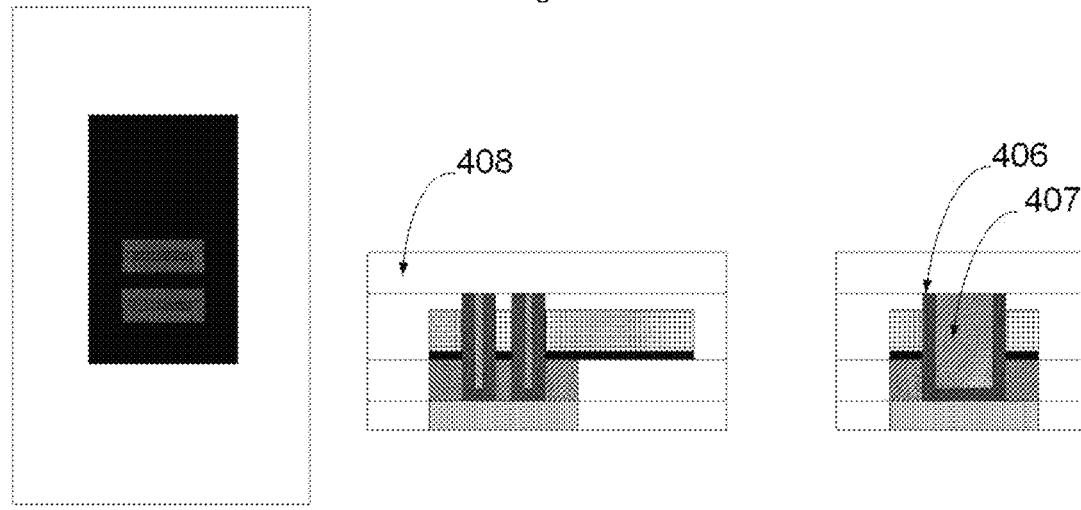
Figure 4K:
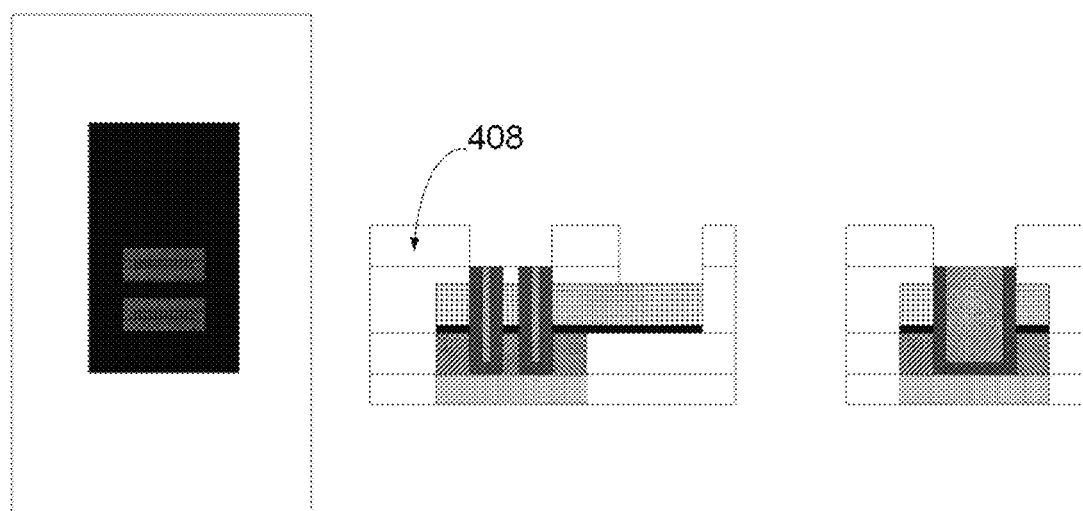
Figure 4L:
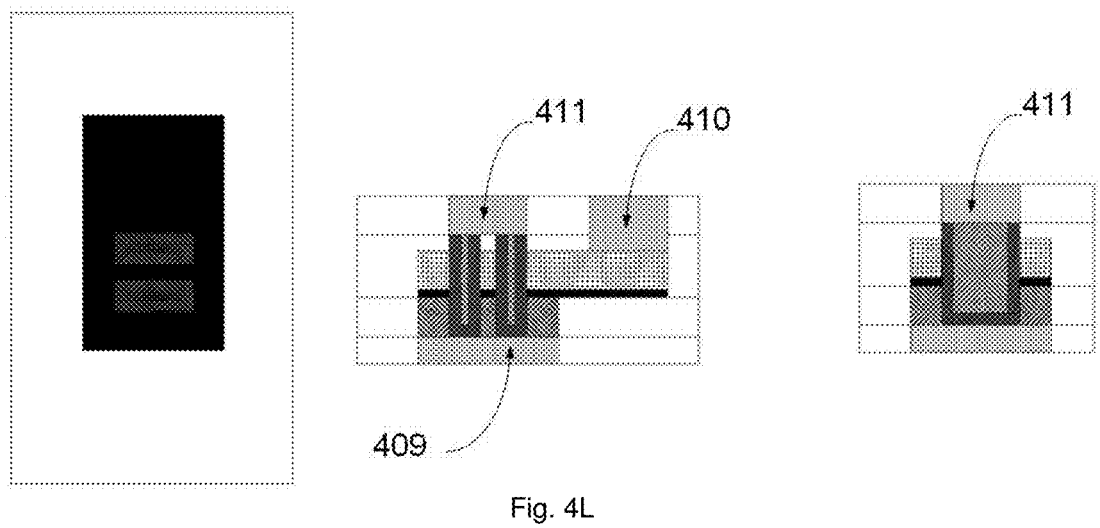

As a result, a portion of the first electrode 402, the second electrode 404 and the active layer 403, remains in the space between the two cavities and forms a fin F4. The use of such fins allows for a larger area of contact between the gate and the active layer. This larger contact area improves the ability of the gate to control current flow in the transistor. Once the two regions or cavities have been created, the following steps for this example are shown in FIGS. 4G to 4L. Those steps are equivalent to those already shown in FIGS. 3G to 3L, with the only significant difference that a fin is provided, and there are thus two cavities for depositing the gate insulator and the gate conductor material. A gate insulating layer 406 and a gate conductor 407 are used to create the gate structure of the transistor and contacts are created for the different terminals of the transistor after depositing a second dielectric layer 408 as shown in FIG. 4J. In particular, FIG. 4L shows the terminals for the first electrode 409, second electrode 410 and gate 411. Needless to mention, the same materials and techniques cited in regard to the embodiment of FIG. 3 would be also applicable to this design.

Figure 5A:
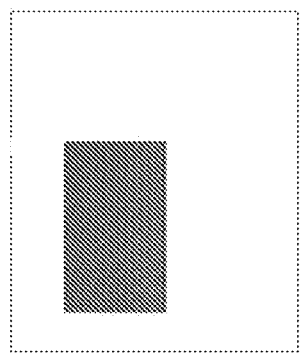
FIGS. 5A-5O schematically illustrate a sequence of steps in a further example of a method for manufacturing a vertical field effect transistor comprising fins, a side gate, and gate alignment for minimal overlapping with the source and/or drain.
Figure 5A:
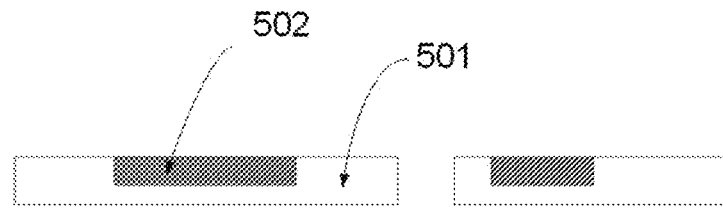
Figure 5B:
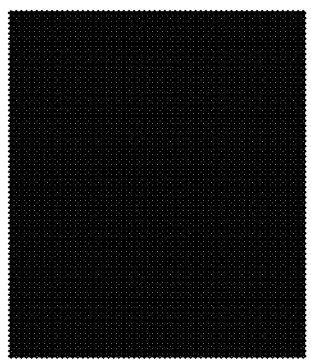
Figure 5B:
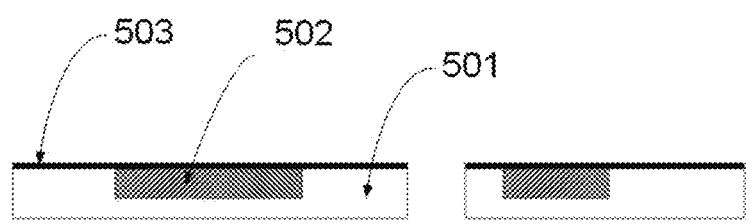
Figure 5C:
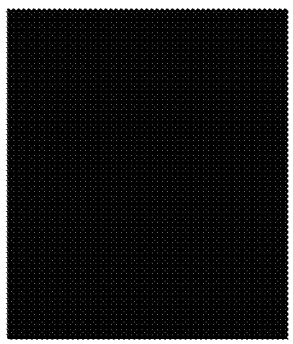
Figure 5C:
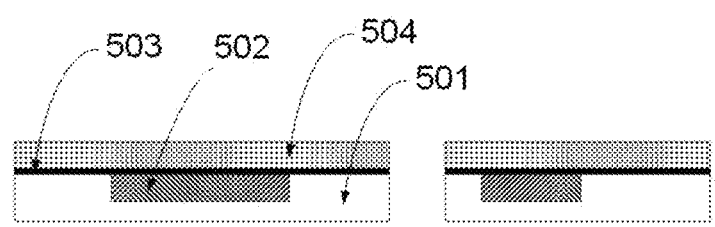
Figure 5D:
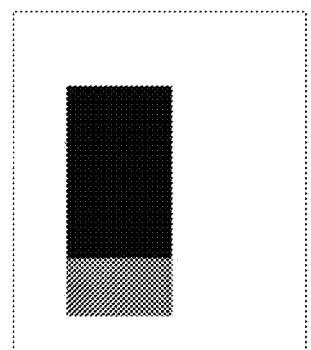
Figure 5D:
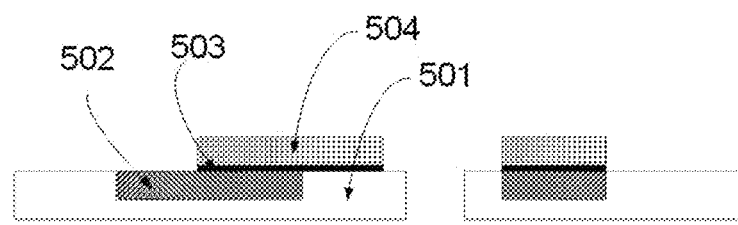
Figure 5E:
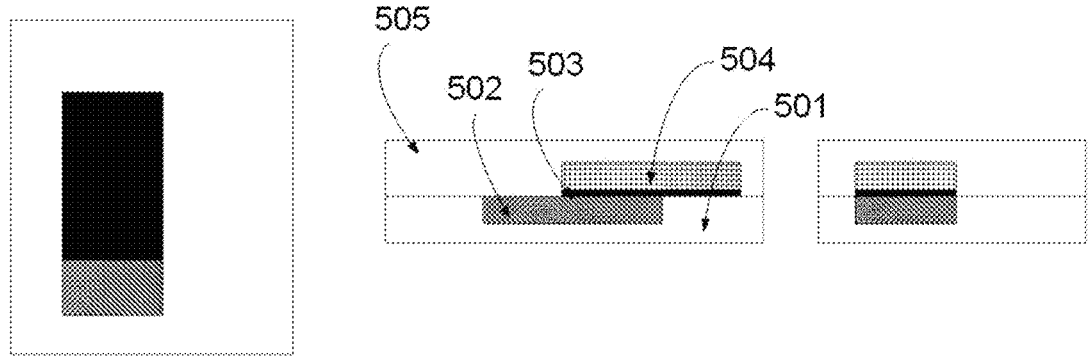
Figure 5F:
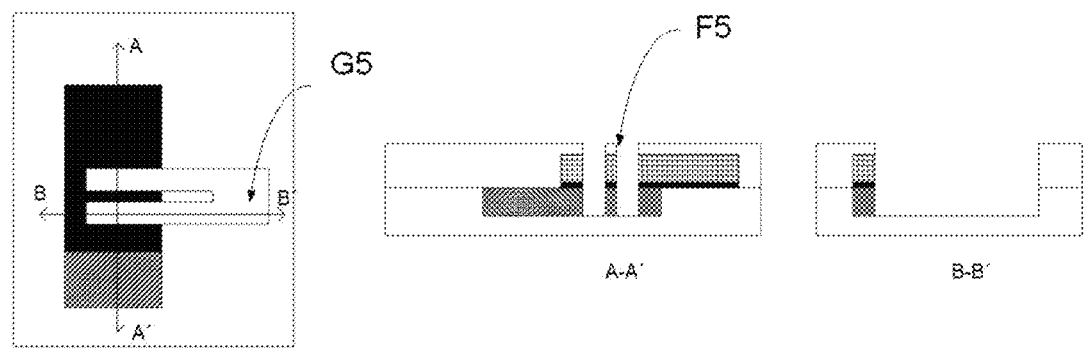
Figure 5G:
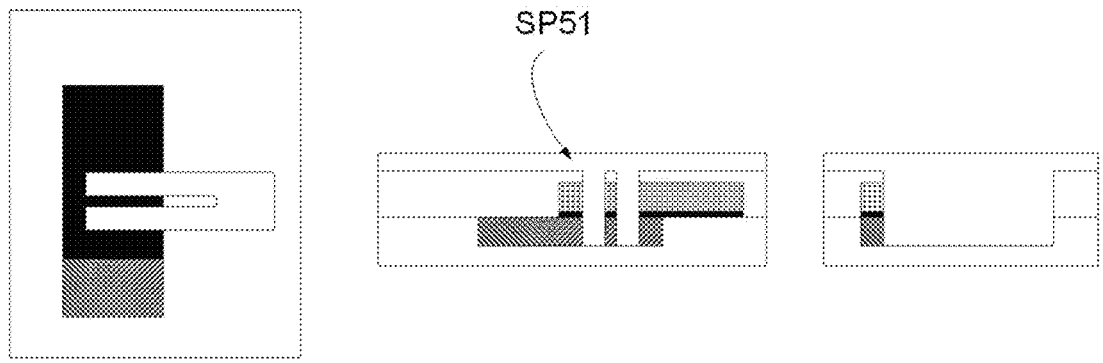
Figure 5H:
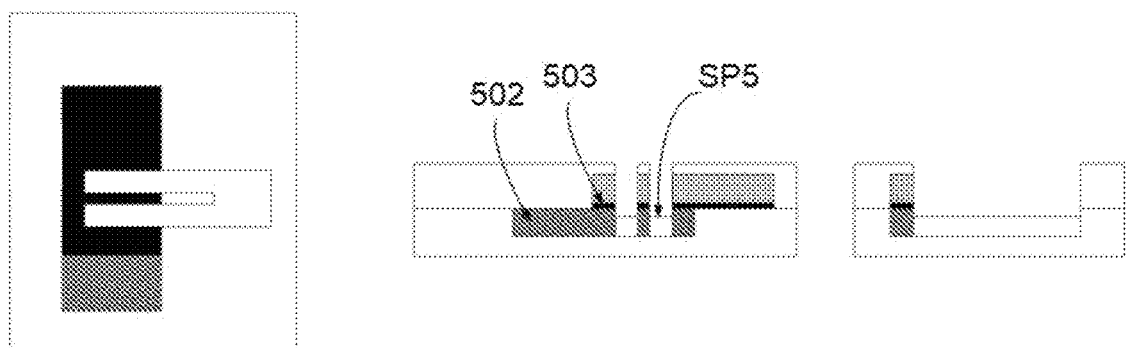
Figure 5I:
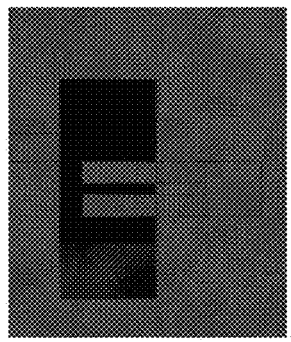
Figure 5I:
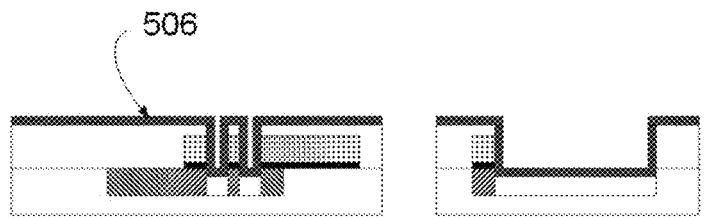
Figure 5J:
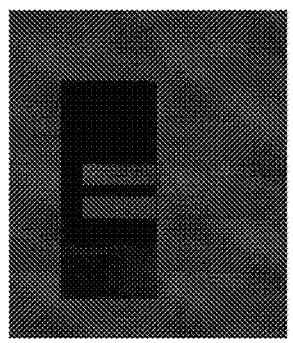
Figure 5J:
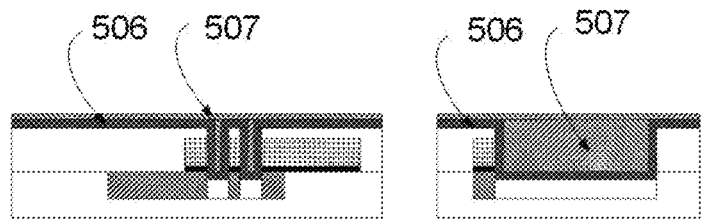
Figure 5K:
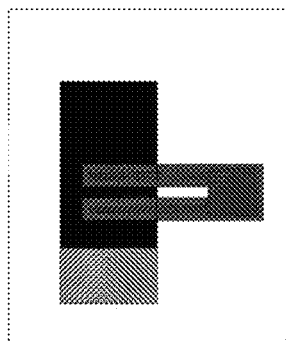
Figure 5K:
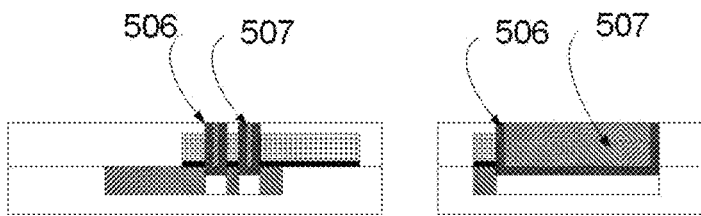
Figure 5L:
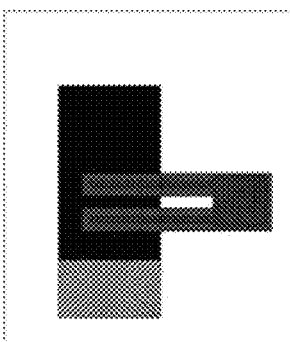
Figure 5L:
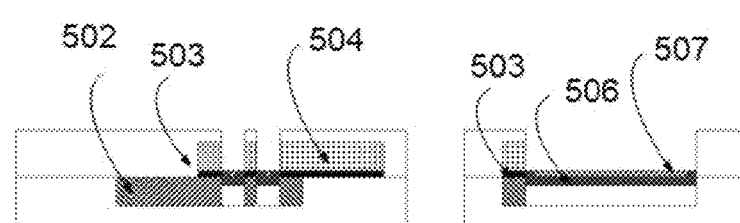
Figure 5M:
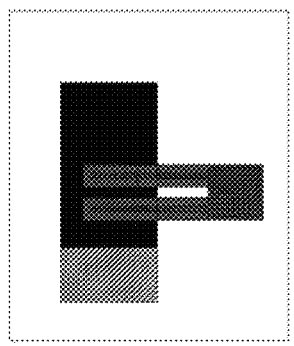
Figure 5M:
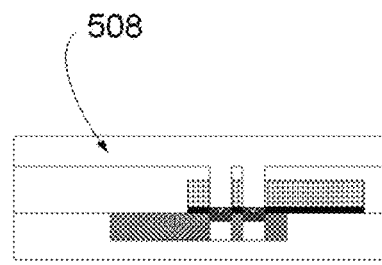
Figure 5M:
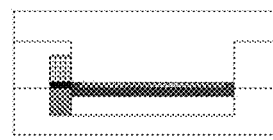
Figure 5N:
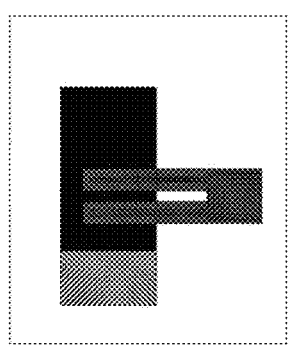
Figure 5N:
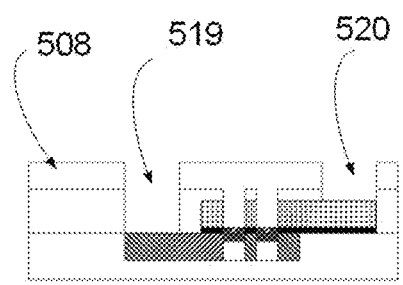
Figure 5N:
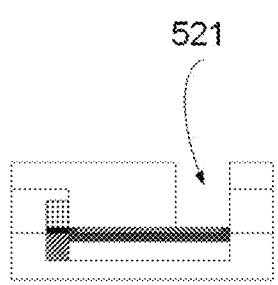
Figure 5O:
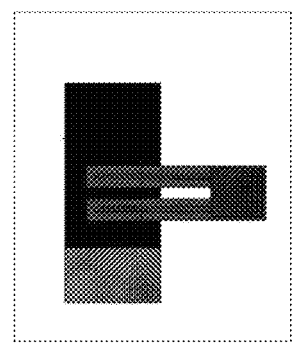
Figure 5O:
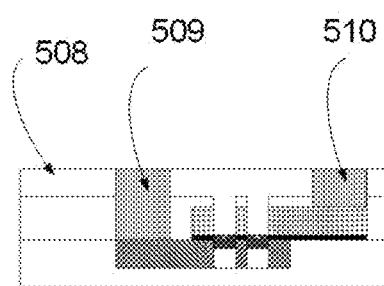
Figure 5O:
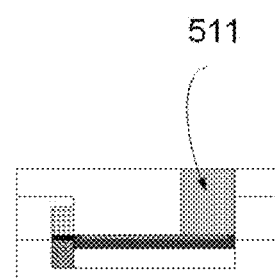

FIGS. 5A to 5O show the sequence for yet a further embodiment of a vertical transistor according to an example. As with the previous process, only the relevant changes with respect to the basic process will be detailed. In this case, a vertical transistor is manufactured whose gate contact is arranged at one side and extending beyond the overlapping region, thus providing a so-called "side-gate" arrangement. Such a "side-gate" arrangement allows for a horizontal alignment of the gate structure with the active layer, which results in less parasitic capacitance between the gate conductor and the electrodes. In this particular manufacturing process, a vertical transistor comprising a fin is produced. Nevertheless, it is understood that this is just an optional feature and the same side-gate arrangement with a horizontally aligned gate may be used with a transistor with multiple fins or no such fins. Referring to the figures, it should be clear that FIGS. 5A to 5E are equivalent to previously mentioned FIGS. 3A to 3E so no further explanations are necessary. Thus, FIG. 5E shows a first electrode 502, a second electrode 504, an active layer 503, a substrate 501 and a first dielectric layer 505.

FIG. 5F shows the formation of the gate region for the gate. Similarly to FIG. 4F, in this case a fin F5 is also present, as some portions of the first electrode 502, which is formed on the substrate 501, the second electrode 504, and the active layer 503 lay in the space between two elongated sections of the gate region or cavity. As opposed to previous embodiments, the gate in this manufacturing process is not entirely circumscribed by the outer perimeter of the overlapping region. On the contrary, a section of the gate region (G5 in FIG. 5F) extends laterally beyond the overlapping region. This difference enables the side-gate arrangement of this embodiment.

A further distinctive step can be explained with reference to FIGS. 5G and 5H. Unlike in previous examples, the gate insulating layer and gate conductor are not deposited or formed right after formation of the region gate. Instead, an interlayer dielectric (ILD) layer SP51 is deposited (FIG. 5G) and then etched (FIG. 5H). Etching of the ILD layer SP51 may be carried out by atomic layer etching, ALE, or reactive ion etching, RIE.; (with or without plasma etching) and it is controlled so that a spacer SP5 is created at the bottom of the region (which resembles a cavity or well). This spacer ensures that the vertical overlap between the gate structure and the first electrode 502 is reduced or minimized. For that, the height of the spacer is controlled so that its top surface is arranged slightly below the bottom surface of the active layer 503 such that the gate conductor deposited at a later stage is at substantially the same level as the active layer 503. In particular, the spacer SP5 is such that a gap exists between the plane of the top surface of the spacer SP5 and the plane of bottom surface of the active layer 503. The width of this gap corresponds to the thickness of an insulating layer 506 deposited at a later stage as described below.

After definition of the spacer, the process proceeds with the formation of the gate insulating layer 506 and the deposition of the gate conductor 507. Due to the presence of the spacer SP51 and to the existence of a gap between its top surface and the bottom surface of the active layer 503, this deposition results in a gate insulating layer whose upper surface is substantially aligned with the bottom surface of the active layer 503 and in a gate conductor 507 that is substantially flush, i.e. levelled, with the active layer 503 at their respective bottom surfaces This is followed by the etching and planarization of the same gate insulating layer 506 and the gate conductor 507
    in the regions outside of the gate region. These process steps are depicted in FIGS. 5I to 5K and are equivalent to those already explained with regard to previous fabrication processes.

A further particular aspect of this example is illustrated in FIG. 5L. The gate structure comprising the gate insulating layer 506 and the gate conductor 507 is etched with a controlled etching process so that the upper surface of the gate is substantially arranged flush or level with the upper surface of the active layer 503. The corresponding technical effect is that the gate structure is aligned with the active layer 503 so that minimal overlap with the second electrode 504 exists. This has the beneficial effect of reducing the parasitic capacitances in the transistor. After formation of the gate structure, the process continues with the deposition of an ILD layer 508 and the definition of the contacts. This is shown in FIGS. 5M to 5O, which are equivalent to FIGS. 3J to 3L so no further details are deemed necessary. Thus, contact regions 519, 520 and 521 are opened by photolithography and dry etching for the contact of the first electrode 509, the contact of the second electrode 510 and the contact of the gate 511.

In this example, the expression flush is to be understood as meaning that the gate conductor 507 is arranged at substantially the same level as the active layer 503 at both the bottom and upper surfaces. The thickness of the gate conductor 507 is substantially the same as the thickness of the active layer 503 and their respective position is such that overlapping of the gate conductor 507 with either the bottom electrode 502 or top electrode 504 is minimized. In a further variant of this same concept, the design may comprise a gate conductor 507 with a thickness smaller than the active layer 503. By properly adjusting the height of the spacer SP51 and the etching after the deposition of the gate insulating layer 506 and the gate conductor 507, one may have a gate conductor 507 whose thickness lies within the thickness of the active layer 503 or, in other words, the active layer 503 may overlap the gate conductor 507 at both the bottom and top surfaces.

Figure 6A:
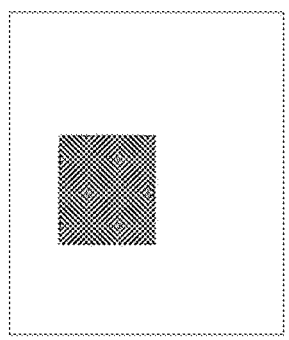
FIGS. 6A-6O schematically illustrate a sequence of steps in an example of a method for manufacturing a vertical field effect transistor comprising a gate-all-around (GAA) arrangement with gate alignment for minimal overlapping with the source and/or drain.
Figure 6A:
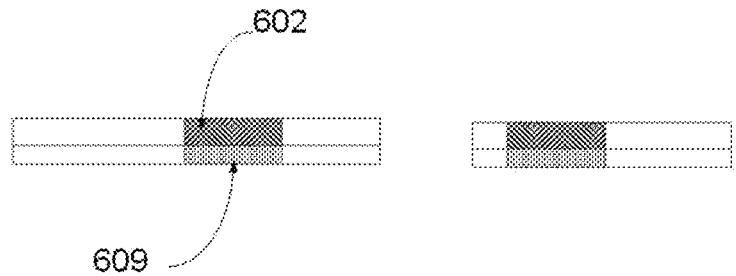
Figure 6B:
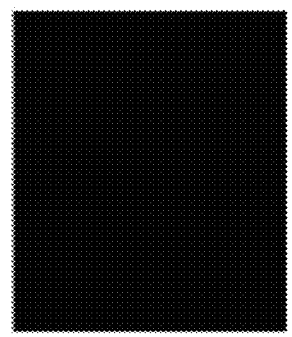
Figure 6B:
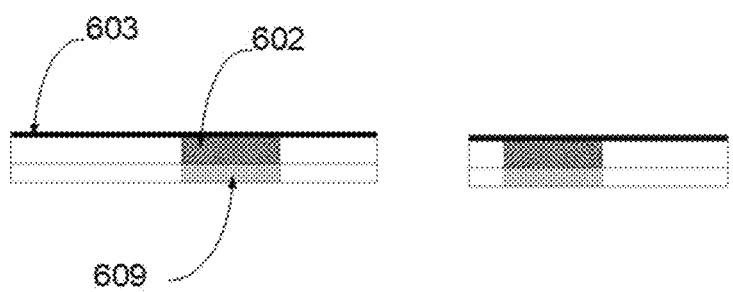
Figure 6C:
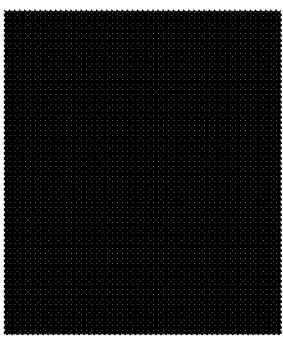
Figure 6C:
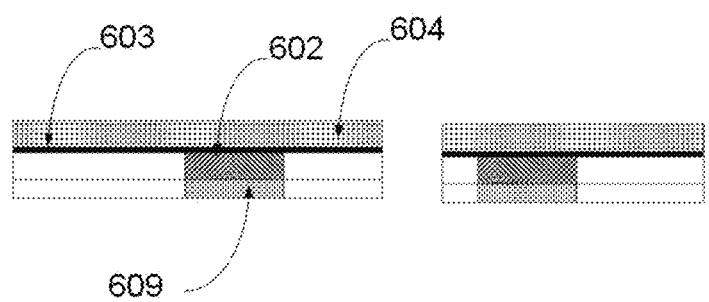
Figure 6D:
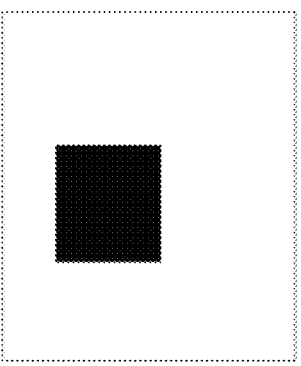
Figure 6D:
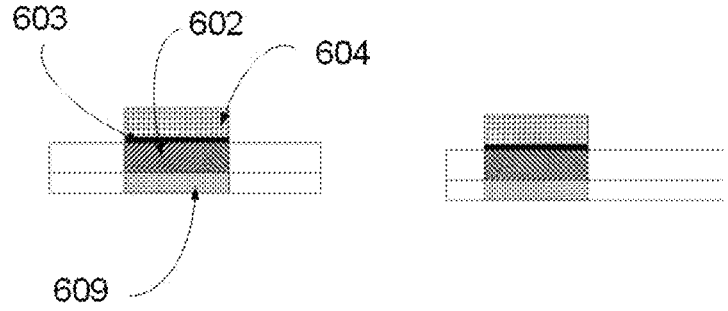
Figure 6E:
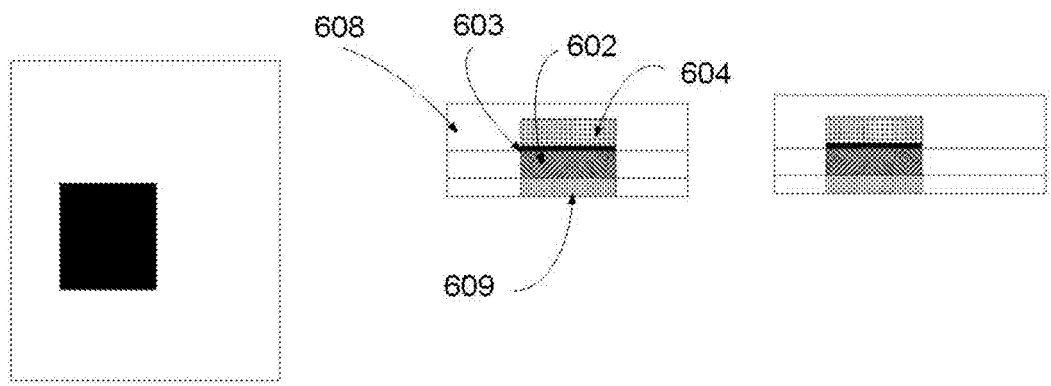
Figure 6F:
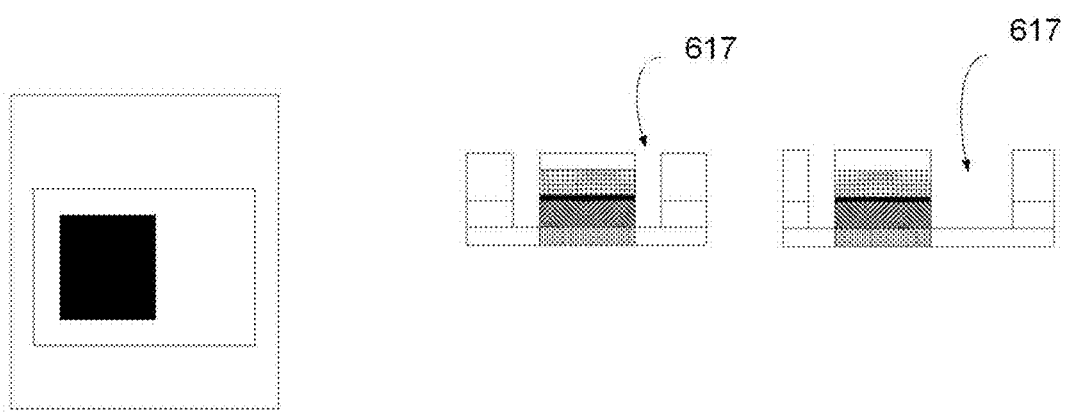
Figure 6G:
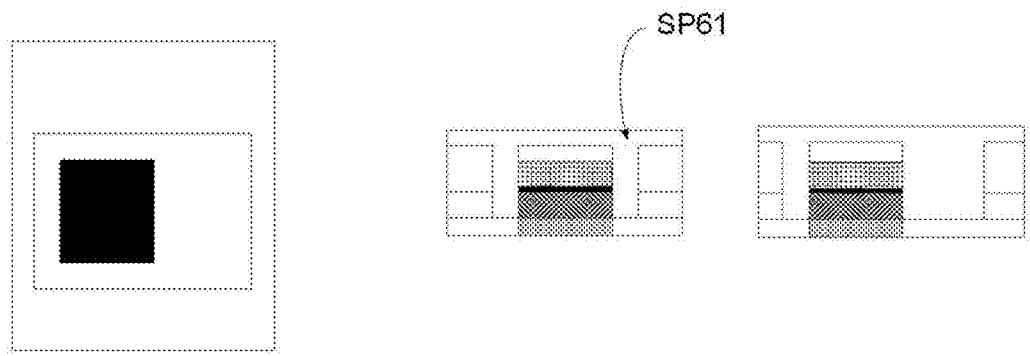
Figure 6H:
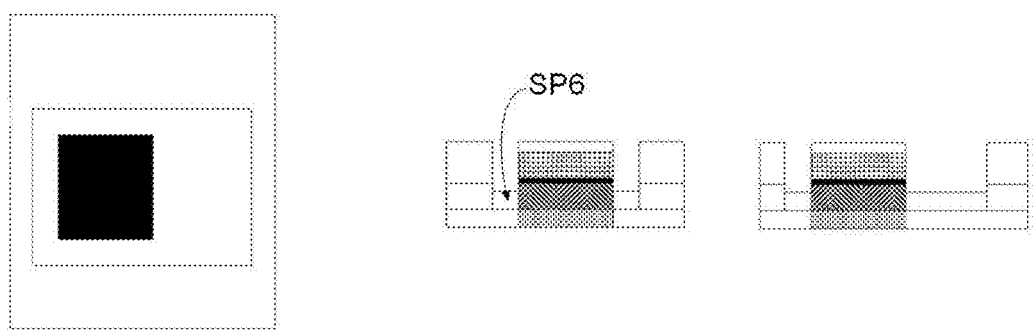
Figure 6I:
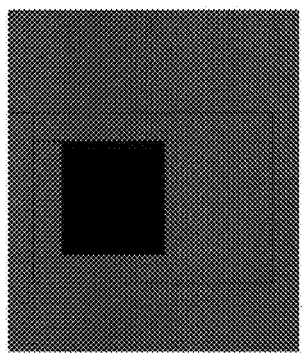
Figure 6I:
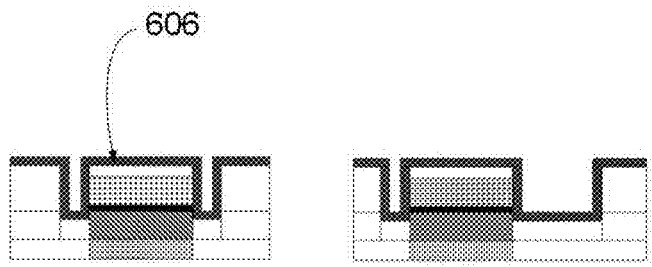
Figure 6J:
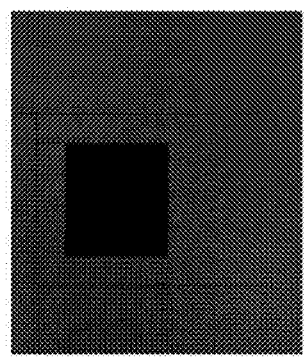
Figure 6J:
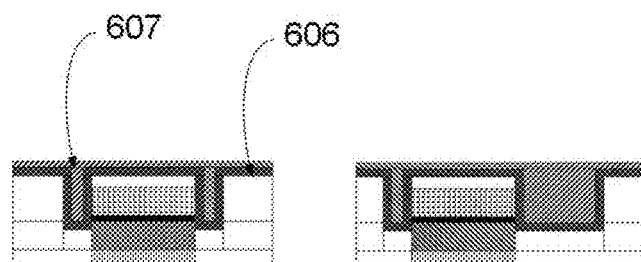
Figure 6K:
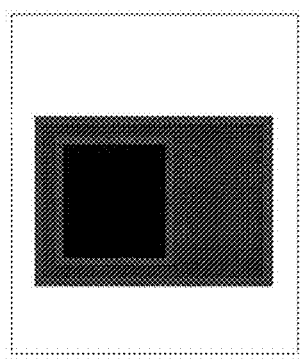
Figure 6K:
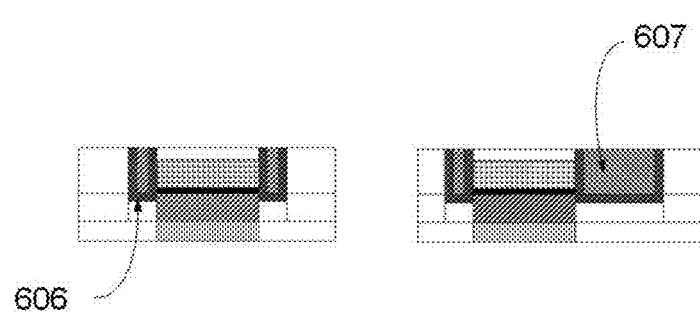
Figure 6L:
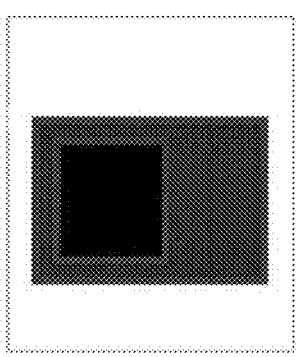
Figure 6L:
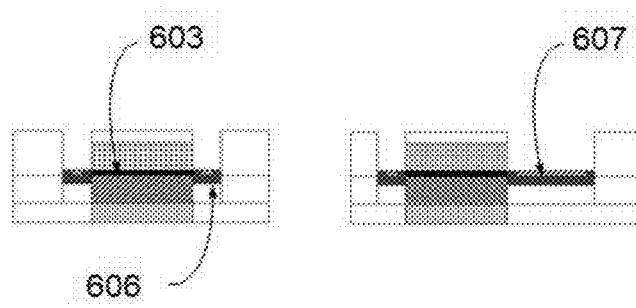
Figure 6M:
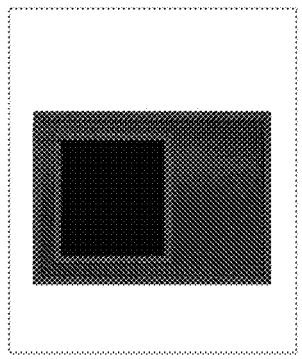
Figure 6M:
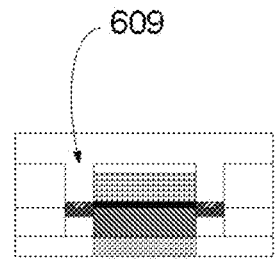
Figure 6M:
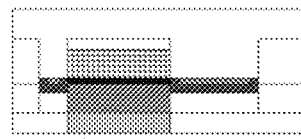
Figure 6N:
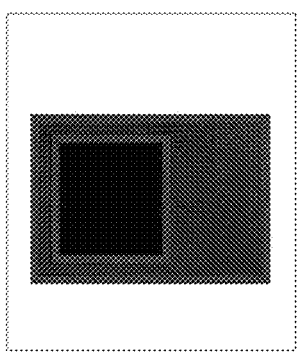
Figure 6N:
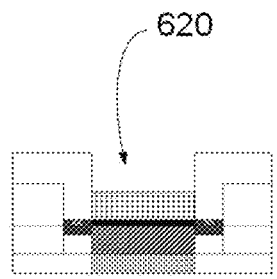
Figure 6N:
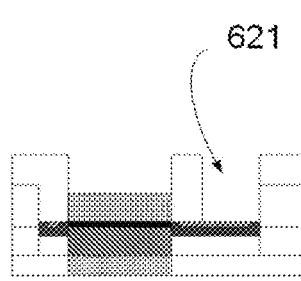
Figure 6O:
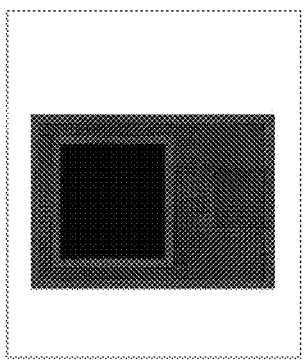
Figure 6O:
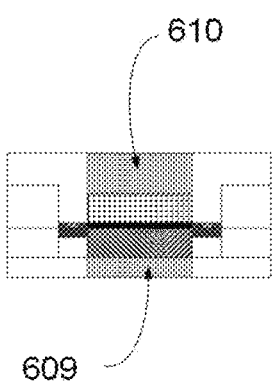
Figure 6O:
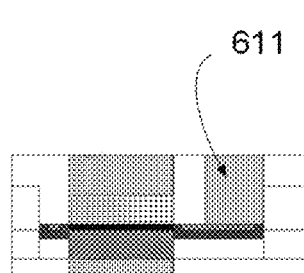

A further example, comprising a Gate-All-Around (GAA) configuration, will now be presented with reference to FIGS. 6A to 6O. In this example, a gate is defined that surrounds the semiconductor. In particular, the gate is arranged surrounding the outer perimeter of the overlapping region between the electrodes. Similarly to previous examples, this example also allows a large area of contact between the gate and the active layer, which facilitates operation of the transistor. More than one gate can be realized in a variant of GAA configuration where each side can act as a separate control gate.

Similarly to the example illustrated in FIGS. 5A to 5O, the FIG. 6 example also features a side gate that is aligned with the active layer. For this reason, only the novel aspects of this realization will be explained in the following.

FIGS. 6A to 6C are generally equivalent to FIGS. 4A to 4C so no further explanation is deemed necessary. In particular, in this case a bottom electrode 609 is also used for the first electrode 602. FIG. 6D shows a patterning step to define the overlapping region. As in previous examples, this patterning steps comprises photolithography and dry etching.

In this case, the first electrode 602, the second electrode 604 and the active layer 603 are overlapping perfectly, i.e. they all have substantially the same dimensions so that none of them extends beyond the others in the horizontal plane after the patterning.

FIG. 6F shows the patterning of the region 617 for the gate arrangement after deposition of the ILD layer 608. As mentioned, this is a GAA embodiment so, unlike in previous designs, the region for the gate is no longer inside or embedded in the overlapping region but surrounding it, i.e. the region is arranged adjacent to the outer perimeter but outside of it. Furthermore, as also shown in FIG. 6F, the groove practiced for the gate region extends laterally so that a side gate is defined. The remaining steps (from FIGS. 6G to 6O) involve the formation of a spacer SP6 by using an additional dielectric SP61 and the etching of the gate structure (gate insulating layer 606 and gate conductor 607) to enable alignment of the gate with the active layer 603 as shown in FIG. 6L. The steps needed to achieve this alignment are equivalent to the ones described with reference to FIGS. 5A to 5O so no further details are deemed necessary.

The alignment of the gate conductor 607 and the active layer 603 is such that the bottom/top surface of the gate conductor 607 is aligned with the bottom/top surface of the active layer 603 if the thickness of the gate conductor 607 is substantially the same as the thickness of the active layer 603. In variants of this example, the thickness of the gate conductor 607 may be smaller than the thickness of the active layer 603 so that the latter is overlapping the former. In other words, by having a gate conductor 607 whose thickness is smaller than the thickness of the active layer 603, one may have a design where the bottom surface of the gate conductor 607 is slightly above the bottom surface of the active layer 603 whereas the top surface of the gate conductor 607 is at a slightly lower level than the top surface of the active layer 603. In this manner, an improved performance may be obtained by further minimization any overlapping of the gate conductor 607 with the first electrode 602 or the second electrode 604.

The remaining steps involve the definition of the contacts for the first electrode 609, second electrode 610 and gate 611 after the contact openings for the second electrode 620 and for the gate 621 are practiced These steps are equivalent to those explained in reference to FIG. 5G to 5O so no further explanation is deemed necessary.

FIGS. 21A to 21H illustrate the steps of still a further example to manufacture a vertical FET. In this example, the gate region is defined differently as will be explained in the accompanying figures.

Figure 21A:
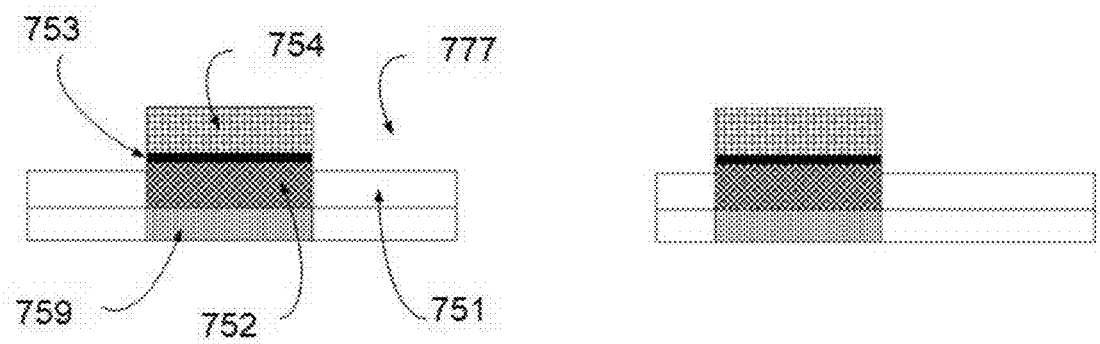
FIG. 21 schematically illustrates still a further sequence of steps in an example of a method for manufacturing a vertical field effect transistor.

FIG. 21A corresponds to a similar situation as the one already explained above with reference to FIG. 6D. At this stage of the manufacturing process, the system comprises a first electrode 752, formed on a substrate 751. The contact for the first electrode 752 in this example is a bottom electrode 759. On the other hand, an active layer 753 and a second electrode 754 are also present.

Figure 21B:
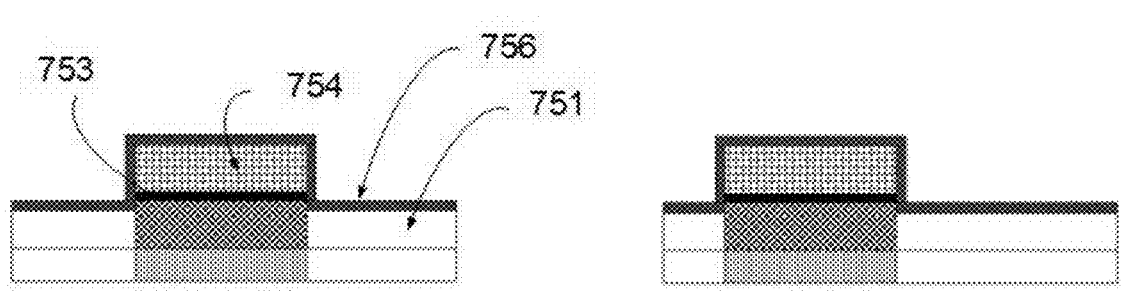

Note that, referring to previous FIGS. 6C and 6D, the stage shown in FIG. 21A may be achieved after etching the second electrode 754 and the active layer 753 over the area not overlapping with the first electrode 752 so that the first electrode 752, the second electrode 754 and the active layer 753 overlap perfectly. Nevertheless, the patterning and etching in this case may also remove some material of the substrate 751. Thus, as also shown in FIG. 21A, the upper surface of the substrate 751 after the etching step is not aligned with the lower surface of the active layer 753. In particular, a gap exists between the upper surface of the substrate 751 and the lower surface of the active layer 753 whose width corresponds substantially to the thickness of the gate insulating layer 756, as shown in FIG. 21B. As a result of the etching, at least a portion of the active layer 753, which corresponds to the thickness of the active layer 753, is exposed and a certain region 777 is present which, in this example, acts as the gate region.

Figure 21C:
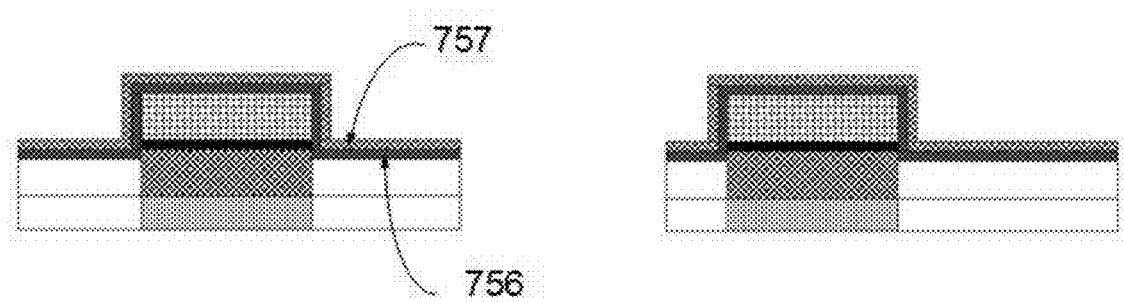
Figure 21D:
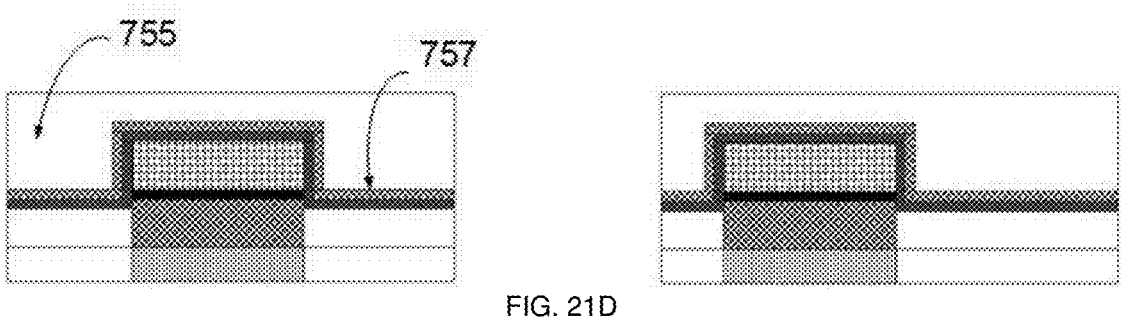

Next possible steps in this example are presented in FIGS. 21B and 21C, which comprise the deposition of a gate insulating layer 756 over the whole substrate and a subsequent deposition of a gate conductor 757 over the previously deposited insulating layer 756. In this manner, the insulating layer 756 is arranged in between the gate conductor 757 and all the other parts (i.e. the active layer 753, the substrate 751 and the second electrode 754). Note that, because of the gap created between the upper surface of the substrate 751 and the lower surface of the active layer 753 during the etching process shown in FIG. 21A, the upper surface of the gate insulating layer 756 is aligned with the lower surface of the active layer which allows the lower surface of the conductor 757 to be substantially aligned with the active layer 753 in their respective lower surfaces.

Figure 21E:
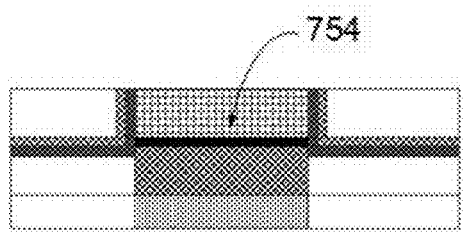
Figure 21E:
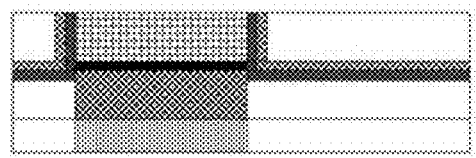
Figure 21F:
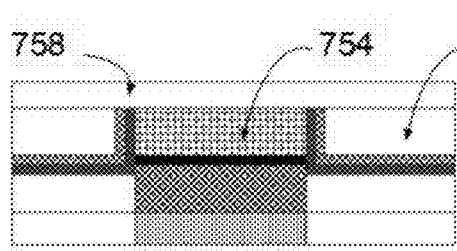
Figure 21F:
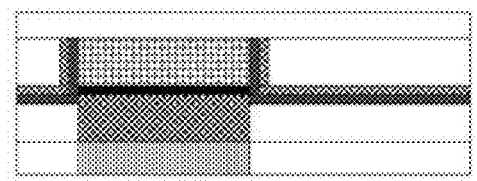
Figure 21G:
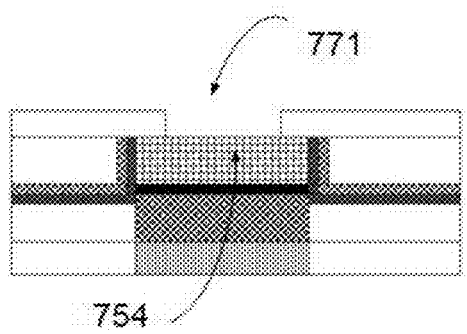
Figure 21G:
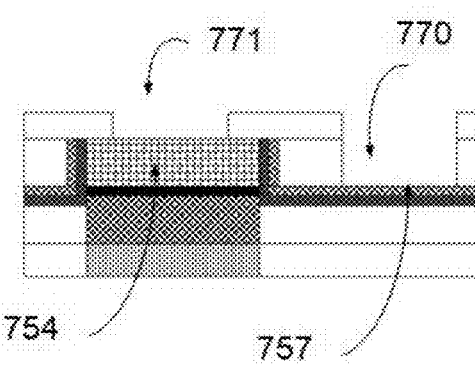
Figure 21H:
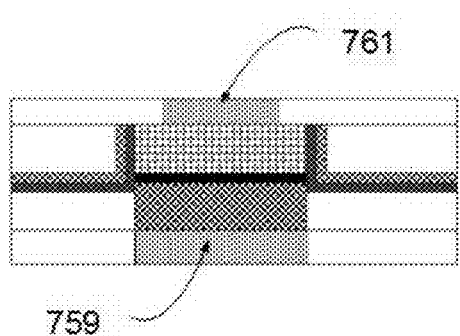
Figure 21H:
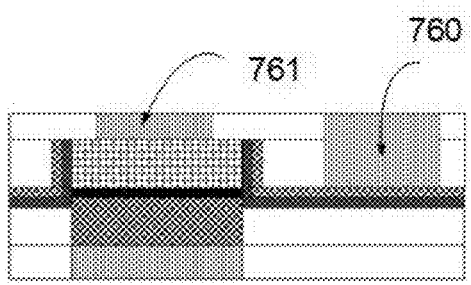

An ILD layer 755 is deposited over the whole surface to provide a flat surface which is subsequently etched in the step depicted in FIG. 21E. The etching, which may be followed by a CMP process, is such that both the gate conductor 757 and the gate insulating layer 756 are removed from the area on top of the second electrode 754, thus enabling subsequent contact on this electrode. In order to define the contacts for both the second electrode 754 and the gate conductor 757, an additional dielectric layer 758 may be deposited in preparation of the patterning of the contacts. This can be seen in FIG. 21G and results in the formation of the cavities 771 and 770 which are intended for contacting the second electrode 754 and the gate conductor 757 respectively. The deposition of the dielectric layer 758 is optional. The transistor is in this example finalized with the step in FIG. 21H, in which the contact material is deposited to create the contact 761 for the second electrode 754 and the contact 760 for the gate conductor 757.

A combination of a Gate-All-Around (GAA) and a Semiconductor-All-Around (SAA) may be realized using similar methods. Such a design may increase the gate area even further for better gate induced field effect control of the active channel material (e.g. a semiconductor). This combination may be particularly convenient for designs comprising a relatively large overlapping area. The gate surrounding the semiconductor may provide a large contact area but, in some cases, it may be difficult to induce the field effect over the whole semiconducting layer in the overlapping region. For that reason, a combination with an internal gate may allow, not only for a larger contact surface, but also for a better distribution of the electric field. Such a combination will be now described with reference to FIGS. 22A to 22N.

Figure 22A:
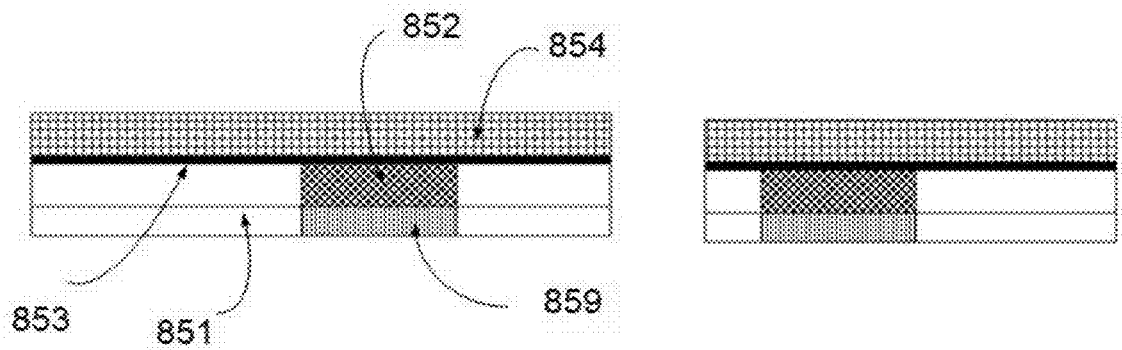
FIGS. 22A-22P schematically illustrate a sequence of steps in an example of a method for manufacturing a vertical field effect transistor comprising a dual gate structure.
Figure 22B:
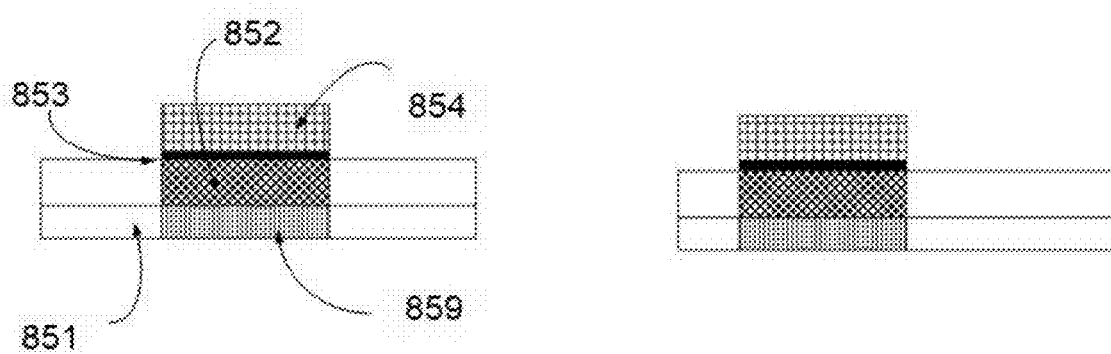
Figure 22C:
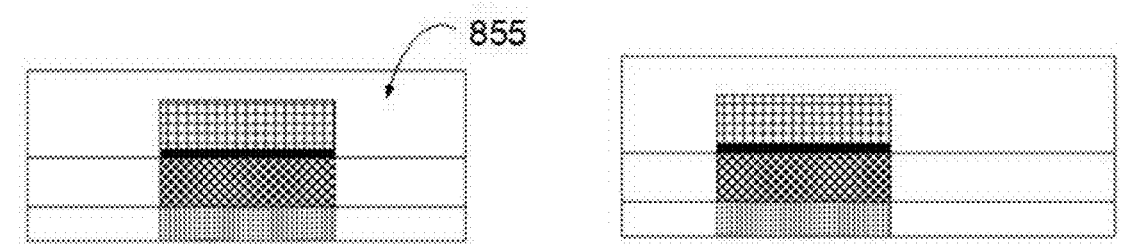

FIG. 22A shows a similar stage as the one already depicted in previous figures (e.g. FIG. 6C). A first electrode 852 is formed on a substrate 851. In this example, the first electrode 852 has a bottom contact 859. On top of the first electrode 852, an active layer 853 is deposited, which is sandwiched between the first electrode 852 and a second electrode 854. A patterning and etching step is carried out as shown in FIG. 22B so that, in this example, the first electrode 852, the active layer 853 and the second electrode 854 overlap over the same overlapping region, i.e. they overlap substantially perfectly. The next step in the manufacturing sequence according to this example is presented in FIG. 22C, in which an interlayer dielectric 855 is deposited.

Figure 22D:
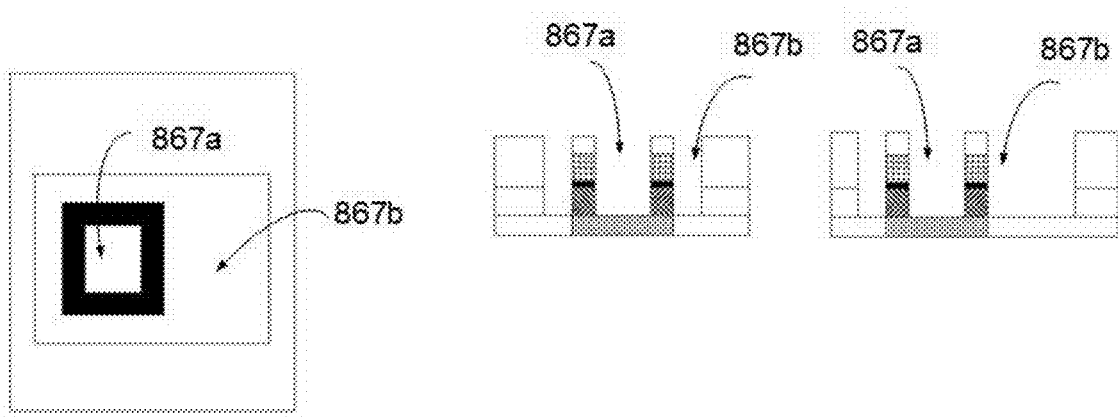

FIG. 22D schematically illustrates the main difference with respect to other examples described. Thus, not only a single gate region is defined but a combination of a SAA and a GAA approach is used by defining two regions. In particular, a first region 867a is defined which is arranged inside the outer perimeter of the overlapping region. This first gate region 867a is thus similar to the gate region defined in reference to FIGS. 3A-3L (i.e. in a SAA configuration). A second gate region 867b is defined surrounding the active layer 853. This second gate region 867b is then featuring a Gate-All-Around (GAA) concept, which resembles the example shown in regard to FIGS. 6A-6O. By combining both approaches, a large contact area between the gate and the active layer 853 is achieved, which results in a more uniform formation of the channel and better control capabilities of the transistor.

Figure 22E:
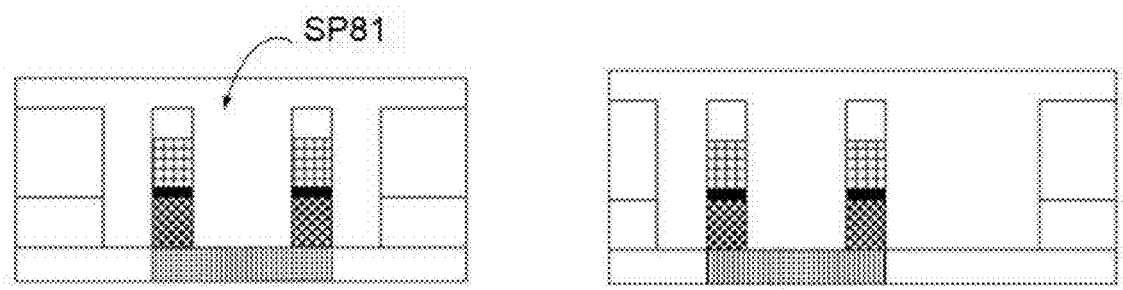
Figure 22F:
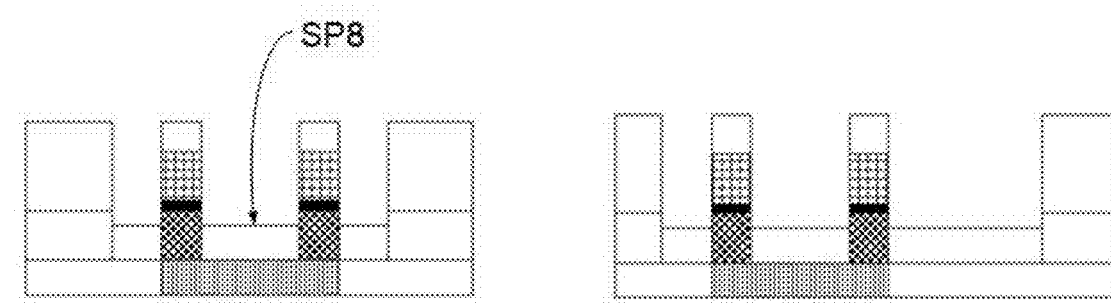

In order to improve the behavior of the transistor, previous examples (see FIGS. 5L or 6L) have already shown the use of an aligned gate configuration, i.e. an arrangement where the gate conductor of the gate is substantially aligned with the active layer. This is also shown in this example. Thus, FIG. 22E shows the deposition of a dielectric SP81, which is subsequently etched to form a spacer, SP8, as shown in FIG. 22F. The process to manufacture the spacer SP8 is equivalent to the one already described with reference to previous examples so no further details are deemed necessary.

Figure 22G:
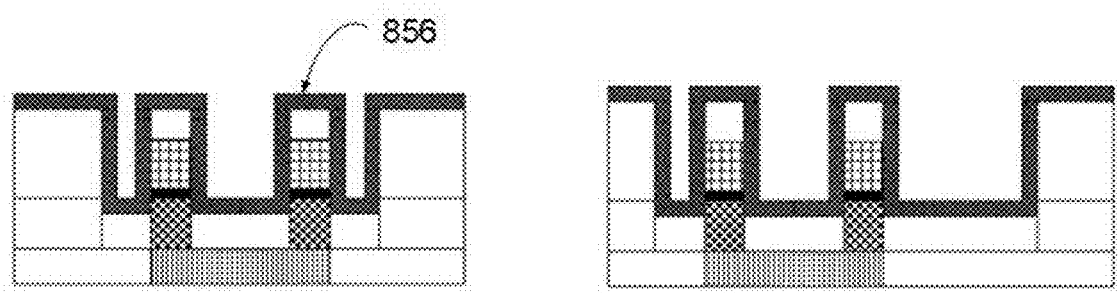
Figure 22H:
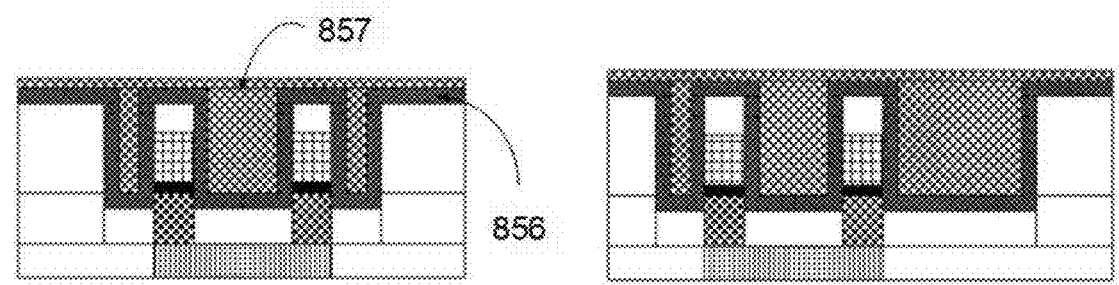
Figure 22I:
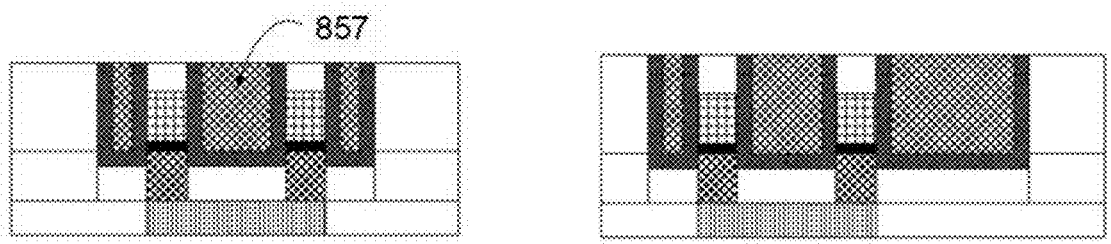
Figure 22J:
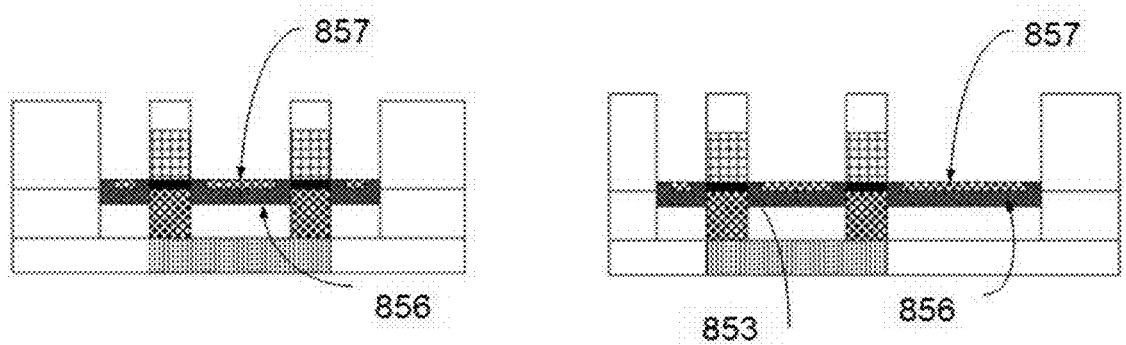

FIGS. 22G and 22H show the deposition of the gate insulating layer 856 and the gate conductor 857. Then, the portions of the gate insulating layer 856 and the gate conductor 857 not lying on the gate regions 867a and 867b are removed (see FIG. 22I) as already explained in previous examples. Furthermore, in order to reduce parasitic capacitance and optimize the performance of the device, the gate insulating layer 856 and the gate conductor 867 are etched as shown in FIG. 22J, so that their upper surface is substantially aligned with the upper surface of the active layer 853.

Figure 22K:
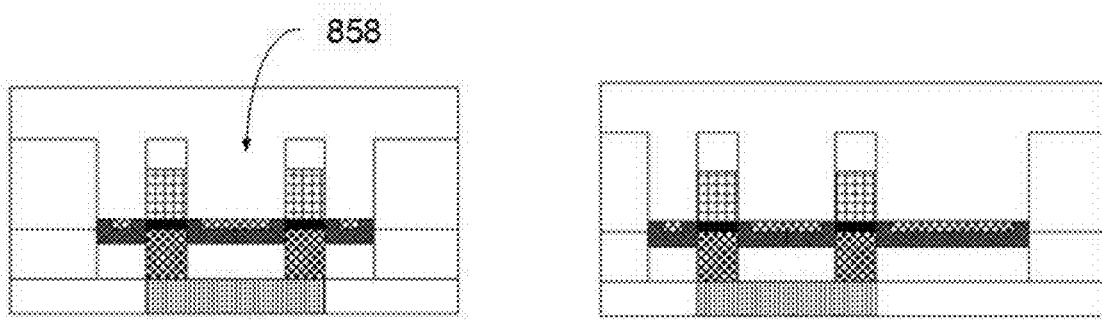
Figure 22L:
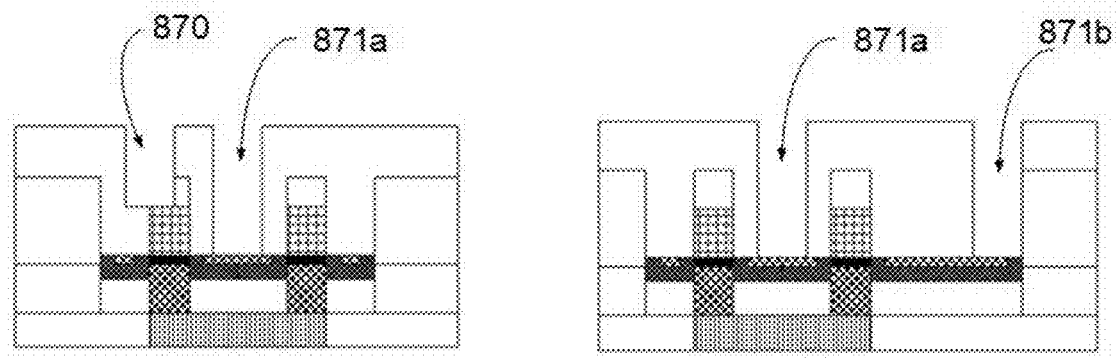
Figure 22M:
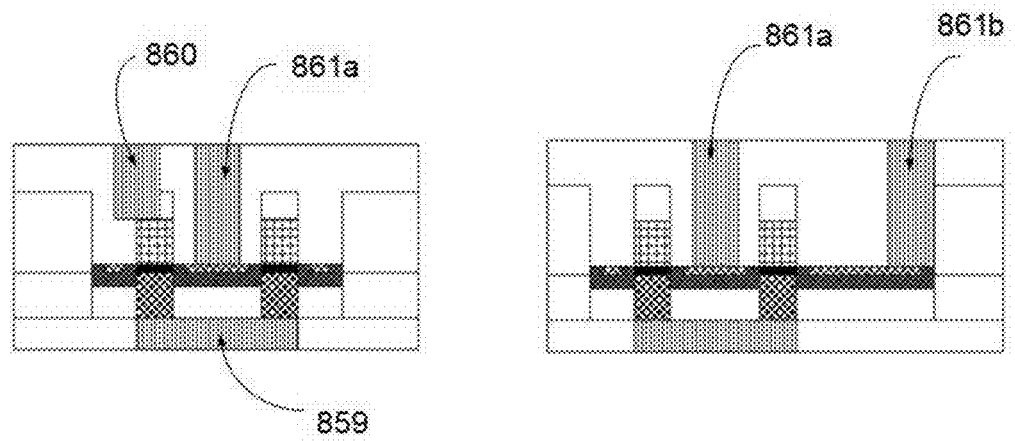

The final steps correspond to the formation of the electrical contacts. Following an equivalent process to the one already described an interlayer dielectric 858 (FIG. 22K) is deposited and a patterning step is conducted as shown in FIG. 22L to create the cavities for the contacts. In particular, a cavity 870 is created for the contact of the second electrode 854. Note how, in this example, two cavities are used for the gate as we have two gate regions. Indeed, a first gate cavity 871a is formed for the gate region that is arranged within the overlapping region (i.e. the SAA gate) and a second gate cavity 871b is formed to enable the contact with the gate region surrounding the active layer 853. Finally, a conductor material is deposited to create the contacts. In particular, a contact 860 is formed for the second electrode and two contacts 861a and 861b are formed for both the gate conductor arranged in the inner region 867a and for the gate conductor arranged in the outer regions 867b respectively.

Figure 22N:
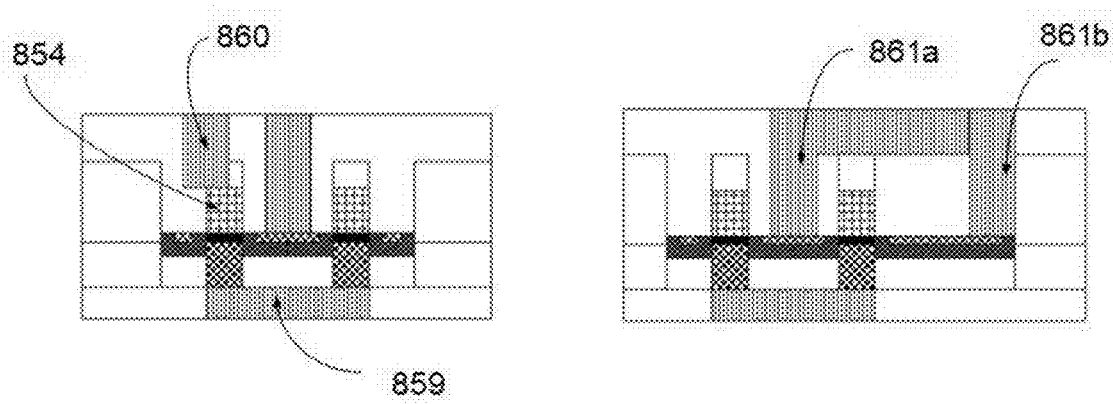

In a variant of this example, the gate conductors 861a and 861b may be connected as illustrated in FIG. 22N.

Figure 22O:
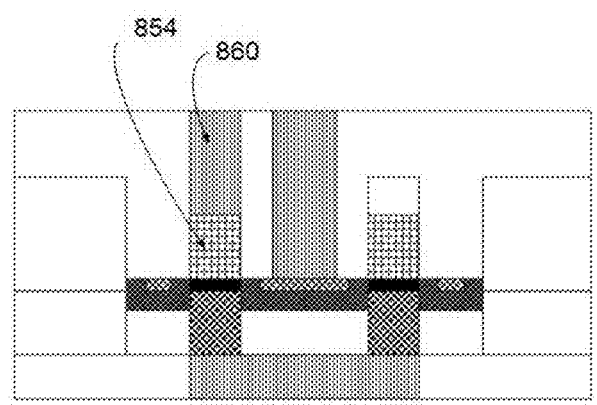
Figure 22P:
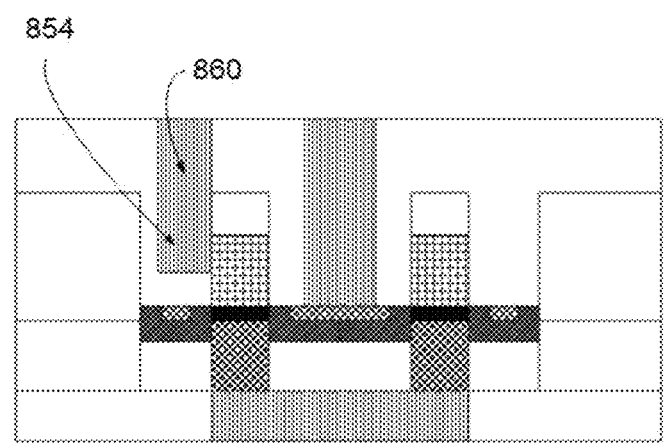

In this example, the contact 860 for the second electrode 854 is not fully aligned. This is preferred in this particular example due to the small horizonal dimensions of the second electrode 854 in the contacting area. Nevertheless, in further variants, the contact 860 and the second electrode 854 may be aligned. In still further variants, the contact 860 may contact the second electrode 854 at one side. Those variants are respectively schematically illustrated in FIG. 22O (aligned top contact) and FIG. 22P (side contact).

Up to this point, different manufacturing processes have been disclosed which result in vertical field effect transistors comprising different gate architectures. Apart from that, further variations are possible depending on the particular active material used for the active layer. In the following examples, designs comprising different materials will be described. Even if they will be presented with reference to one of the previous designs (in particular, the design corresponding to FIG. 3A to 3L) this is by no means intended to constitute a limitation as the same materials may be used with any of the previously disclosed variants or with further variants also covered by the claims.

FIGS. 7A to 7D exhibit the initial steps of the manufacturing process for a vertical field effect transistor according to another example where single wall carbon nanotubes (SWCNTs) are used as active material. In particular, the transistor of this example has a single row of SWCNTs, which are arranged with their longitudinal axis parallel to the substrate, i.e. they are arranged horizontally if the substrate is also arranged in a horizontal position. As a result of this arrangement, the current flows transversally to the SWCNT and not only along its own axis, which can result in channel lengths in the range of ~1 nm (thickness of the active material such as CNT). In a further example, multi-walled CNTs or other 1D materials such as $MoS_2$ nanotubes, $WS_2$ nanotubes, nanowires or nanorods, may be used.

Figure 7A:
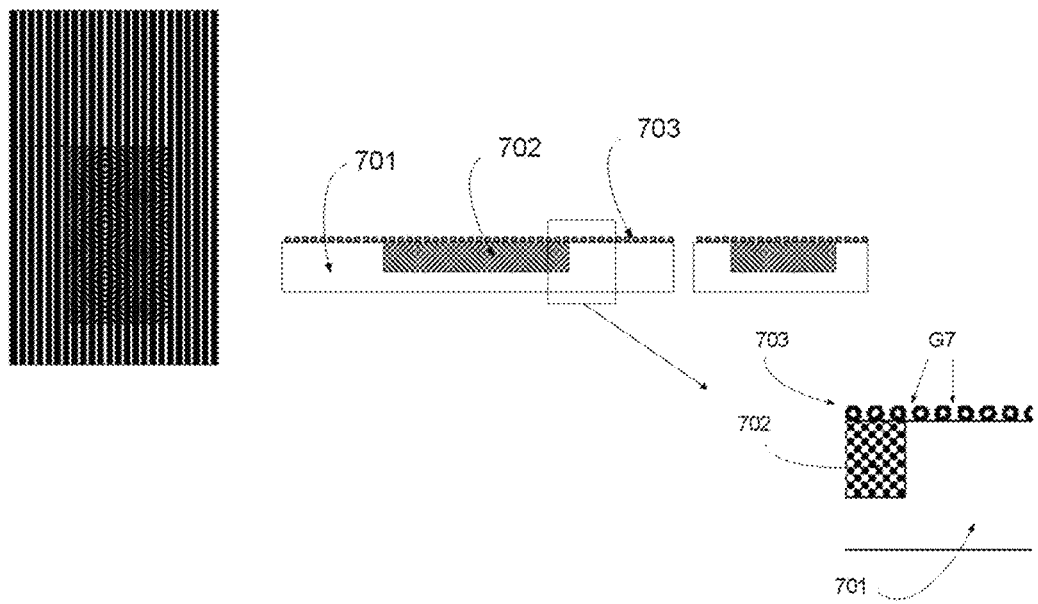
FIGS. 7A-7D schematically illustrate the initial steps (up to the deposition of the second electrode) in an example of a method for manufacturing a vertical field effect transistor comprising carbon nanotubes (CNTs) as active material.

The first step of the process (FIG. 7A) comprises the formation of the first electrode 702 on the substrate 701, so this is equivalent to the previous methods. Subsequentially, as also shown in FIG. 7A, a single row of SWCNTs 703 is formed on the substrate. SWCNTs may be obtained by e.g. chemical vapor deposition (CVD), Arc discharge and then pre-purified prior to their deposition on the substrate. Alternatively, carbon nanotubes may also be grown directly on the substrate. It is important to note that, when using CNTs as active material, a certain risk exists of shorts between the first electrode 702 and the second electrode 704. Indeed, some gaps G7 (see enlarged image in FIG. 7A) may exist in the single row of SWCNTs 703. In order to mitigate this risk, some additional steps are proposed in the present example.

Figure 7B:
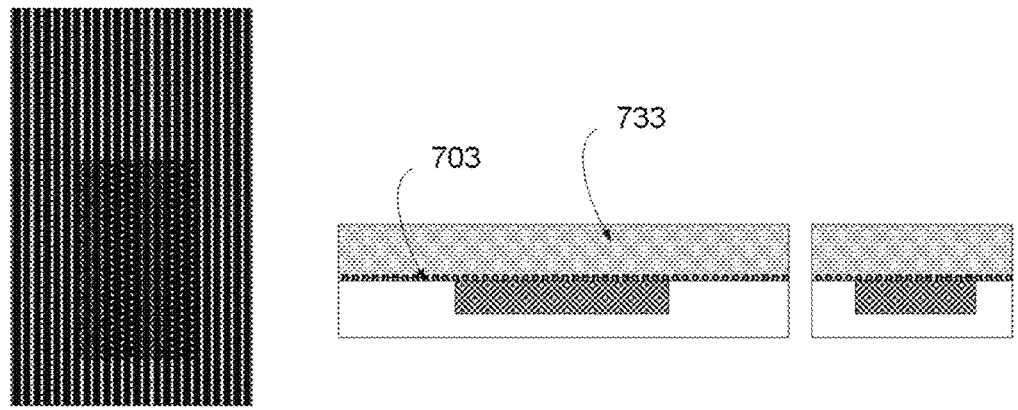
Figure 7C:
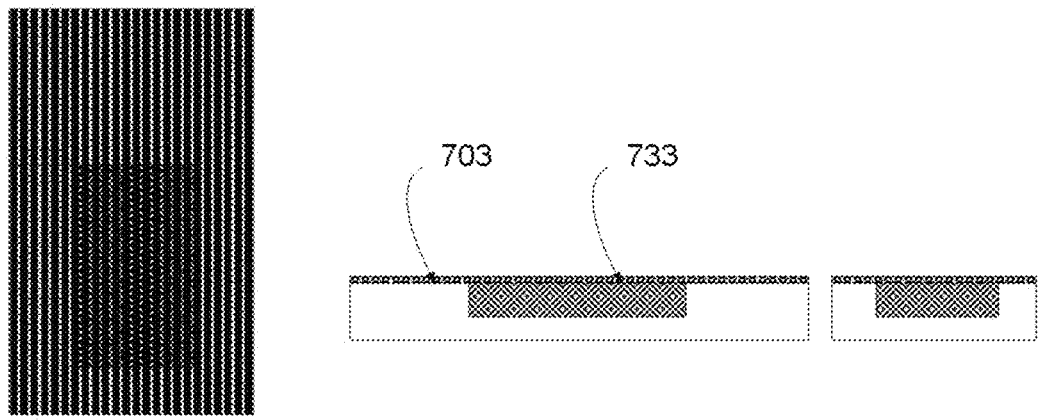
Figure 7D:
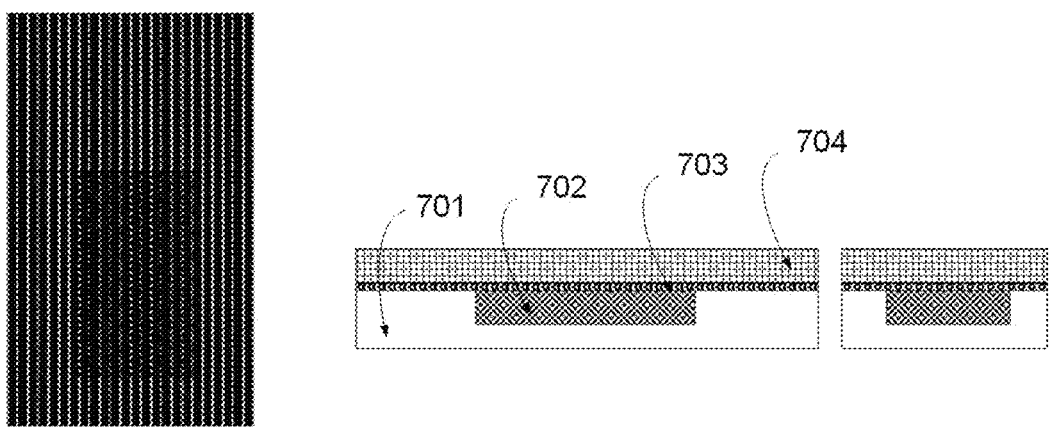

These additional steps are explained with reference to FIGS. 7B and 7C. Thus, upon deposition of the SWCNTs 703, a conformal insulator material 733 (e.g. $SiO_2$) may be deposited on the SWCNTs 703 (FIG. 7B). Standard techniques such as chemical vapor deposition (CVD) may be used for the deposition of the conformal dielectric 733, ALD is a preferred technique. This dielectric material 733 is a filling material that fills all the voids or gaps in between the SWCNTs 703 so as to create a compact structure. Of course, direct contact between the second electrode 704 and the active material, i.e. the single row of SWCNTs 703, is needed in operation. For that reason, the method may further comprise etching of the dielectric material 733, e.g. by atomic layer etching (ALE), etching environment can also be vapor based etching, wet etching, plasma etching, until the SWCNTs 703 are exposed. Selective etching that does not affect CNTs can be used or non-selective or limited selective precise etching environment can be used. It is worth noting that insulator deposition by ALD can have less preference for nucleation and growth on materials like CNTs, allowing for the etching process (if necessary) and CNT exposing process without etching CNTs. As a result of the process steps shown in FIGS. 7B and 7C, a compact active layer comprising a row of SWCNTs 703 in a matrix of dielectric material 733 is obtained. Subsequent steps start with the deposition of the second electrode 704 on the formed active layer and conclude with the formation of the final contacts. Nevertheless, these steps are equivalent to those already explained in relation to, e.g. FIGS. 3C to 3L so no further explanation is deemed necessary.

Previous FIGS. 7A to 7D referred to the use of a single row of SWCNTs 703. Nevertheless, the same process may be used for other 1D materials such as multi-walled CNTs, $MoS_2$ nanotubes, $WS_2$ nanotubes, nanowires or nanorods.

Figure 8A:
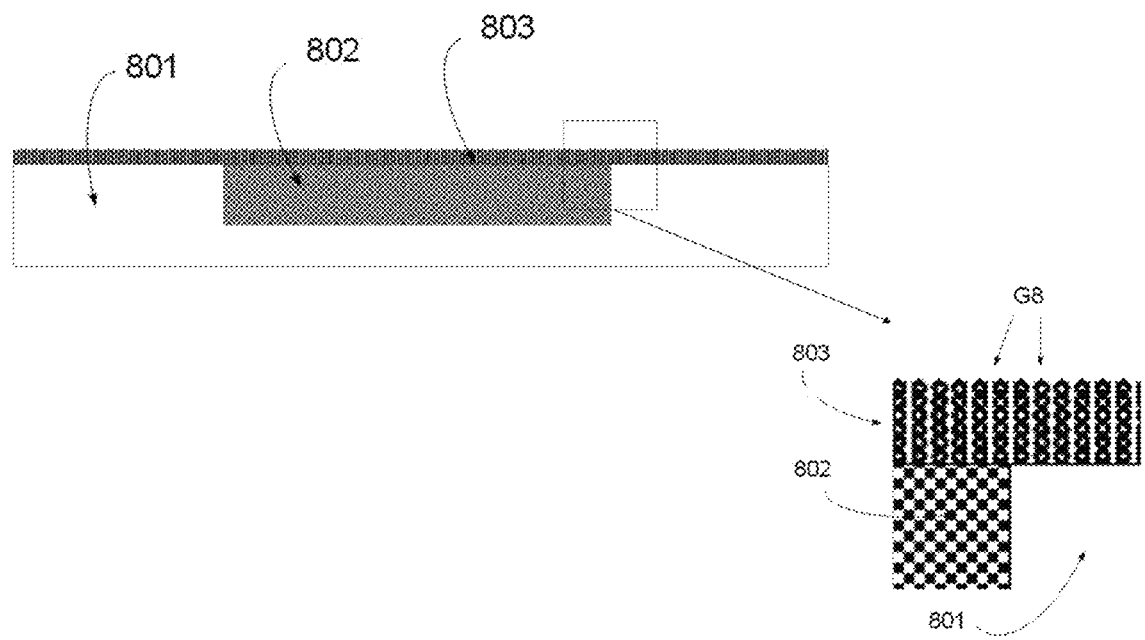
FIGS. 8A-8D schematically illustrate the initial steps (up to the deposition of the second electrode) in another example of a method for manufacturing a vertical field effect transistor comprising a stack of single-wall carbon nanotubes (SWCNTs) as active material.
Figure 8B:
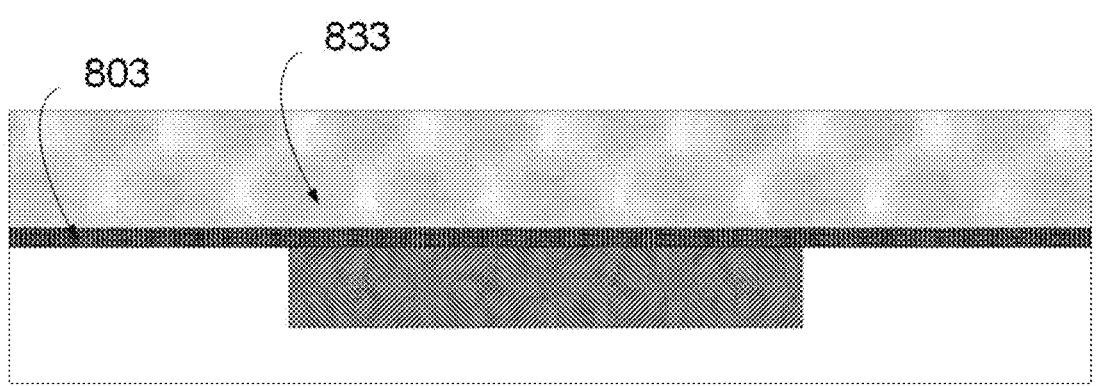
Figure 8C:
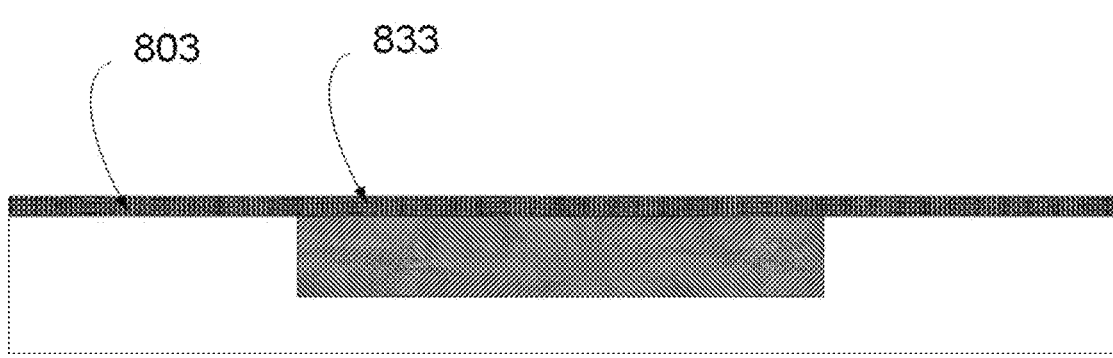
Figure 8D:
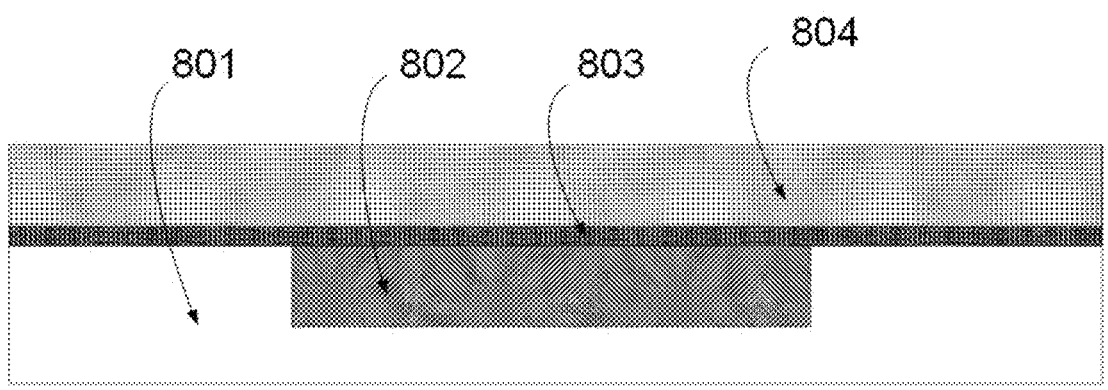

FIGS. 8A to 8D show the situation where SWCNTs are used in a stacked configuration. In this case, multiple, preferably at least five, rows of aligned SWCNTs 803 are used as active material. SWCNTs are provided on a substrate 801. The use of aligned SWCNTs may increase the density of the nanotubes between the electrodes, thus improving charge carrier density. In alternative examples, multi-walled CNTs or other 1D materials may be used instead of SWCNTs. Aligned nanotubes may be pre-purified and aligned during the deposition process or they may be grown directly on the first electrode. As in the previous case, certain gaps (G8 in the enlarged image in FIG. 8A) may exist in the structure. For this reason, FIGS. 8B and 8C show the deposition of a conformal dielectric material 833 and the subsequent etching process (FIG. 8C) as already explained with respect to the previous example.

The use of a plurality of rows of SWCNTs 803 in the active layer, as opposed to a single row, offers a significant advantage in terms of immunity of the transistor to the presence of metallic carbon nanotubes. It is known that, during the manufacturing process of SWCNTs, some of them may adopt metallic character. The use of such a SWCNT in a configuration with a single row of SWCNTs (like the one shown in FIG. 7) would result in a short between the first electrode and the second electrode, thus damaging the transistor. By using multiple rows of CNTs in the manner shown in FIG. 8, the risk of a short between the first electrode 802 and the second electrode 804 is mitigated as the current is flowing transversally to the SWCNTs and the probability of having full electrical path of metallic CNTs between source and drain is extremely low. Using aligned CNTs also allows to increase the current density.

Figure 9A:
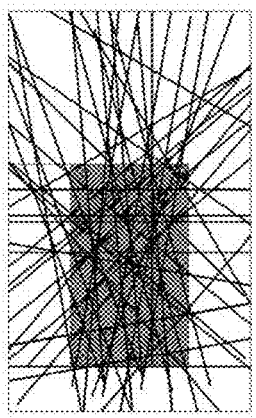
FIGS. 9A-9D schematically illustrate the initial steps (up to the deposition of the second electrode) in a further example of a method for manufacturing a vertical field effect transistor comprising a network (web) of SWCNTs as active material.
Figure 9A:
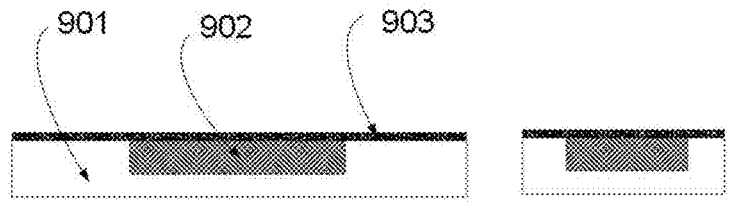
Figure 9B:
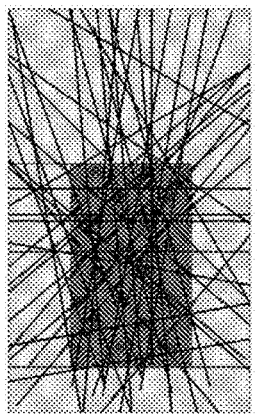
Figure 9B:
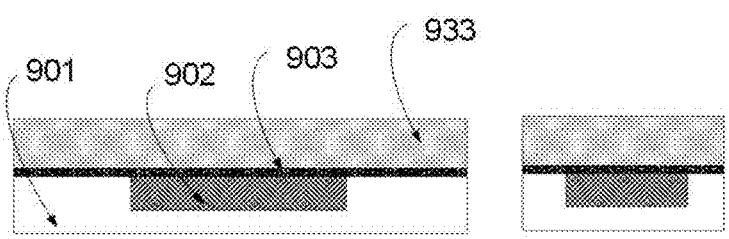
Figure 9C:
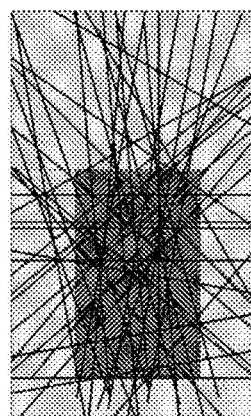
Figure 9C:
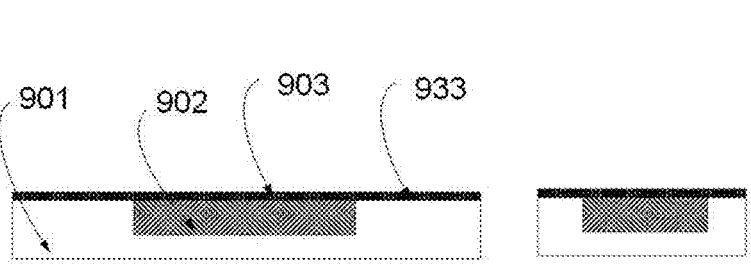
Figure 9D:
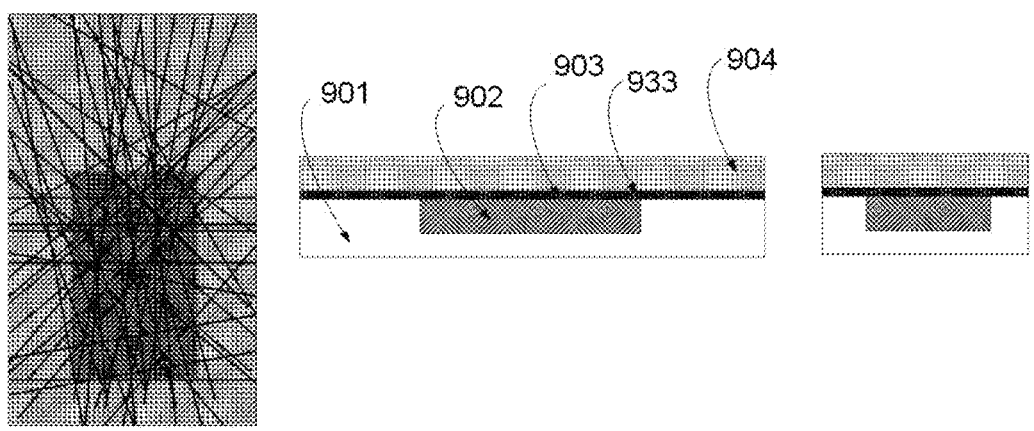

FIGS. 9A to 9D refer to another variant where SWCNTs are used as active material. In this case, a network or web of carbon nanotubes 903 is used and provided on a substrate 901. The carbon nanotubes may be pre-purified and deposited during the process The density of SWCNTs in this embodiment is lower than in previous embodiments. Nevertheless, this solution offers advantages in terms of ease of manufacturing. In any case, as also shown in FIGS. 9B and 9C, some steps are proposed to achieve a compact active layer. As in previously explained cases, a conformal dielectric 933 is used to provide a compact structure so that shorts between the first electrode 902 and the second electrode 904 are prevented. Similarly to the previous example, by using multiple rows of CNTs in the manner shown in FIG. 9, the risk of a short between the first electrode 902 and the second electrode 904 is mitigated as the current is flowing transversally to the SWCNTs and the probability of having full electrical path of metallic CNTs between source and drain is extremely low. Furthermore, as in previous examples, networks or webs of other 1D materials may be employed in different examples.

Figure 10A:
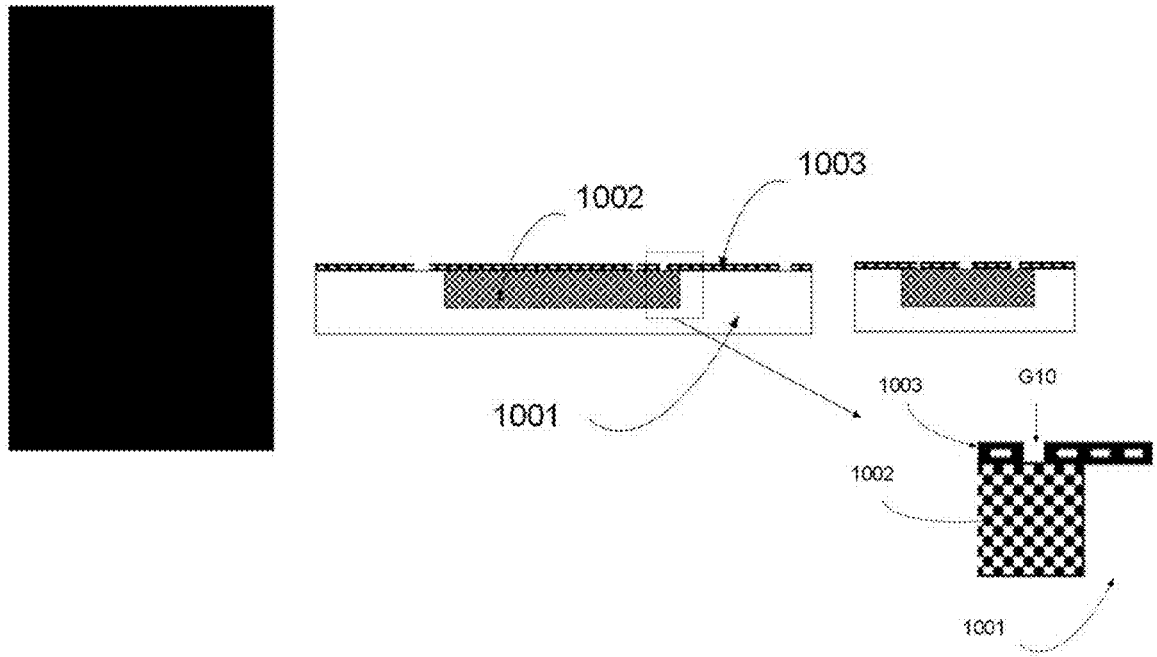
FIGS. 10A-10D schematically illustrate the initial steps (up to the deposition of the second electrode) in yet a further example of a method for manufacturing a vertical field effect transistor comprising a two-dimensional transitional metal dichalcogenide (TMD) as active material.
Figure 10B:
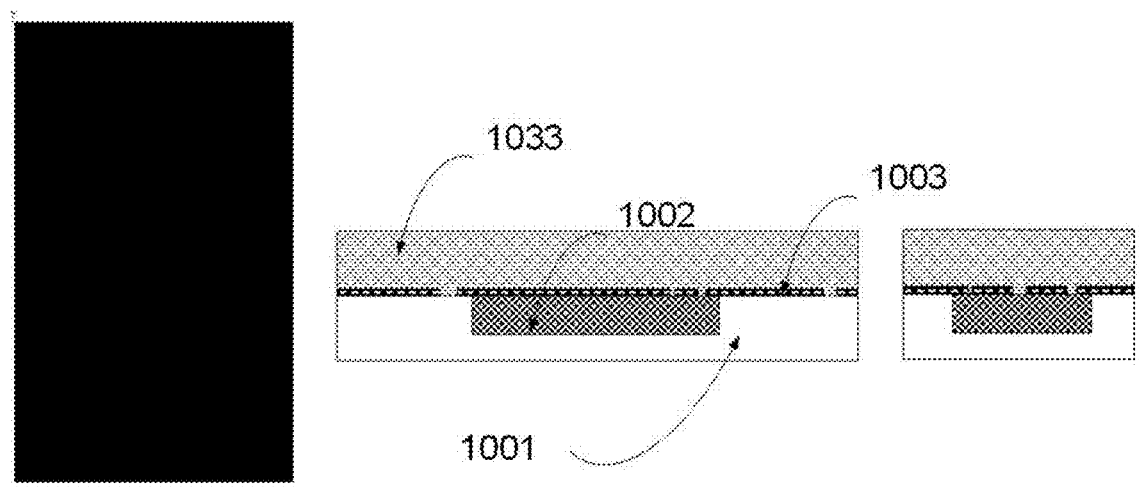
Figure 10C:
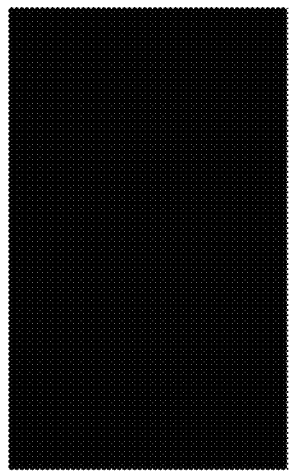
Figure 10C:
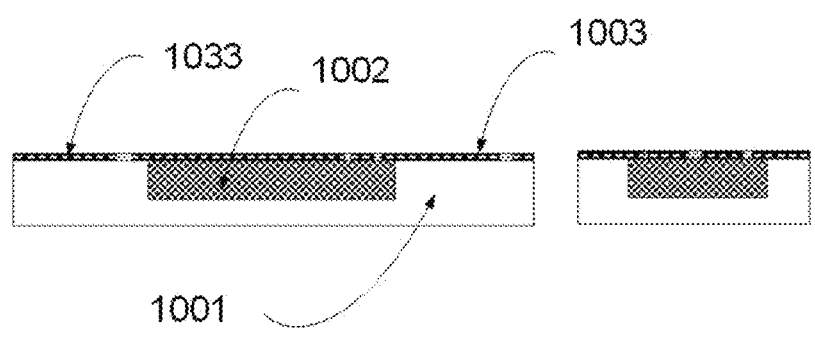
Figure 10D:
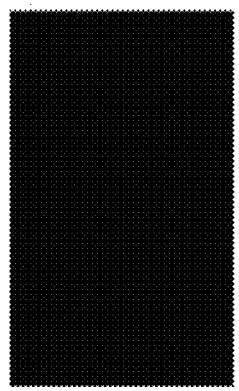
Figure 10D:
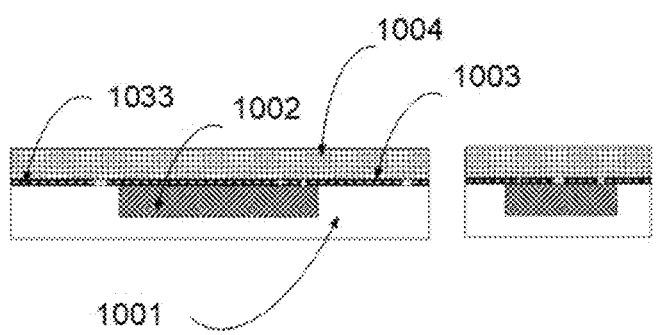

FIGS. 10A to 10D correspond to an embodiment where a different type of active material is used. In this case, a two-dimensional material is employed. In a particularly preferred embodiment, a transition Metal Dichalcogenide (TMD) like $MoS_2$ or $WS_2$ is used. The selection of the most appropriate material depends, among other factors, on whether the transistor is intended to have P-type or N-type character. In that sense, different processes such as doping, annealing or other kind of known manipulations may be used to alter the active layer so as to vary its character. Said 2D materials may be grown via, e.g., chemical vapor deposition (CVD) or atomic layer deposition (ALD), transferred, spin coating deposited, chemical deposition by dip coating etc. The 2D materials are arranged with their plane substantially parallel to the substrate, such that current flows along the thickness of the 2D materials, i.e. transversally to the plane of the 2D material. As shown in FIG. 10A, the arrangement of the layer of 2D material 1003 on the substrate 1001 where the first electrode 1002 is formed may also result in the presence of some voids (G10 in the enlarged view). As a consequence, equivalent steps to those already explained for designs based on CNTs are also required and a conformal dielectric 1033 is used to provide a compact active layer to prevent shorts between the first electrode 1002 and the second electrode 1004.

Vertical FETs in examples of the present disclosure exhibit a vertical current flow, which is particularly advantageous for vertical stacking in complementary circuits comprising at least one P-type transistor and one N-type transistor. By arranging the two transistors vertically, further size reduction becomes feasible for complementary configurations. Nevertheless, it is understood that further examples may be envisaged where a P-type vertical FET and an N-type vertical FET may also be arranged in a horizontal arrangement, i.e. with a first vertical FET arranged on the side (and not on top) of a second vertical FET.

Figure 11A:
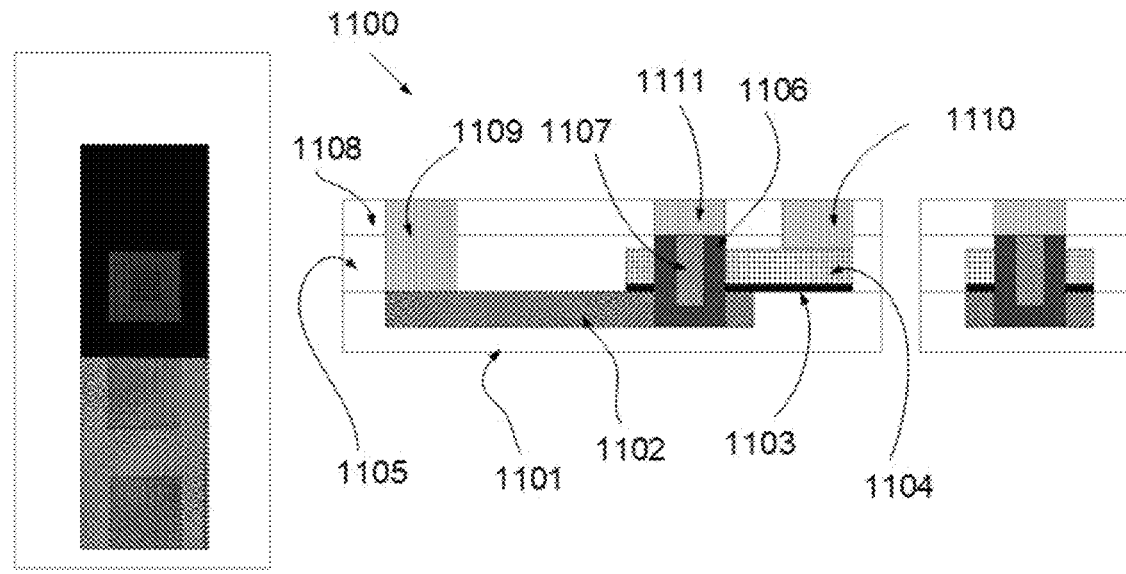
FIGS. 11A-11O schematically illustrate an example of a method to manufacture a complementary field effect transistor (CFET) inverter configuration by arranging a second (upper) vertical FET on a first (lower) vertical FET. The figures illustrate the process after the first (lower) FET is already manufactured according to the example depicted in FIGS. 3A-3L.
Figure 11B:
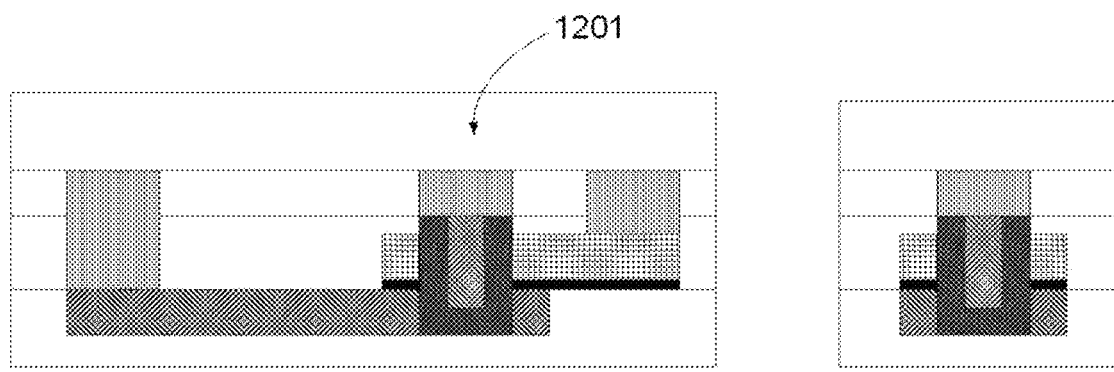
Figure 11C:
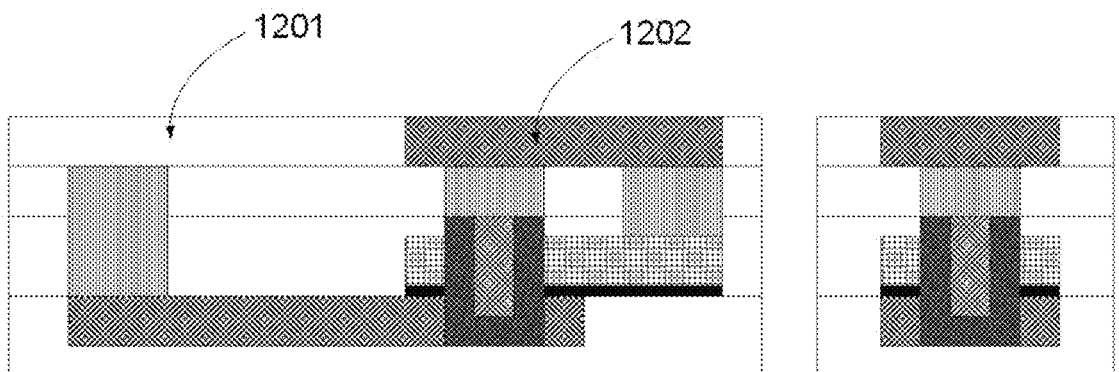
Figure 11D:
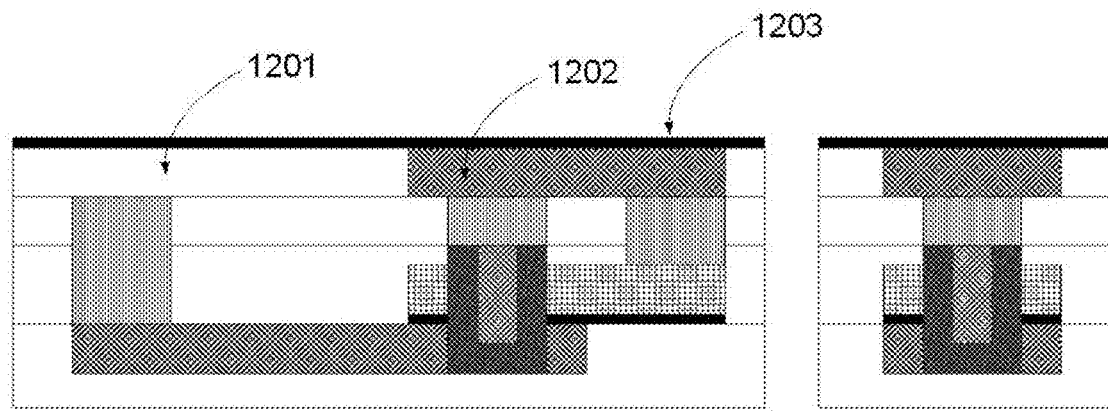
Figure 11E:
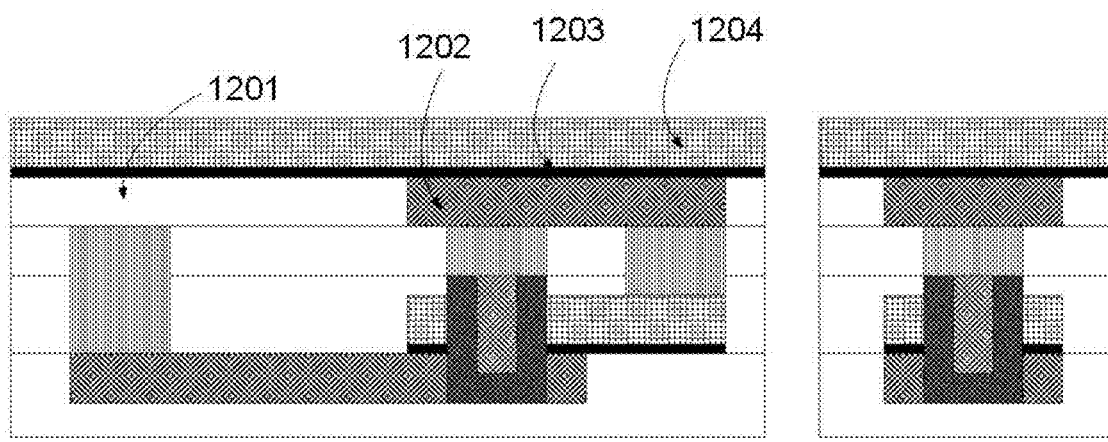
Figure 11F:
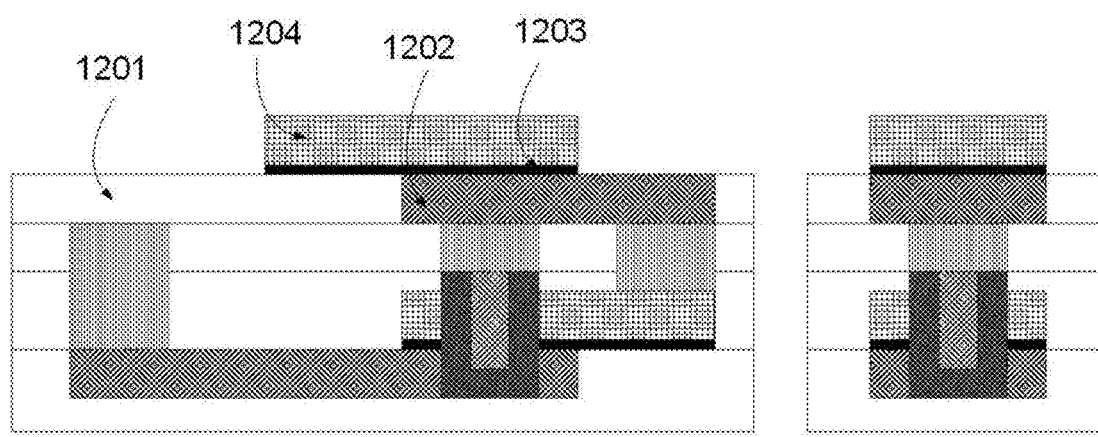
Figure 11G:
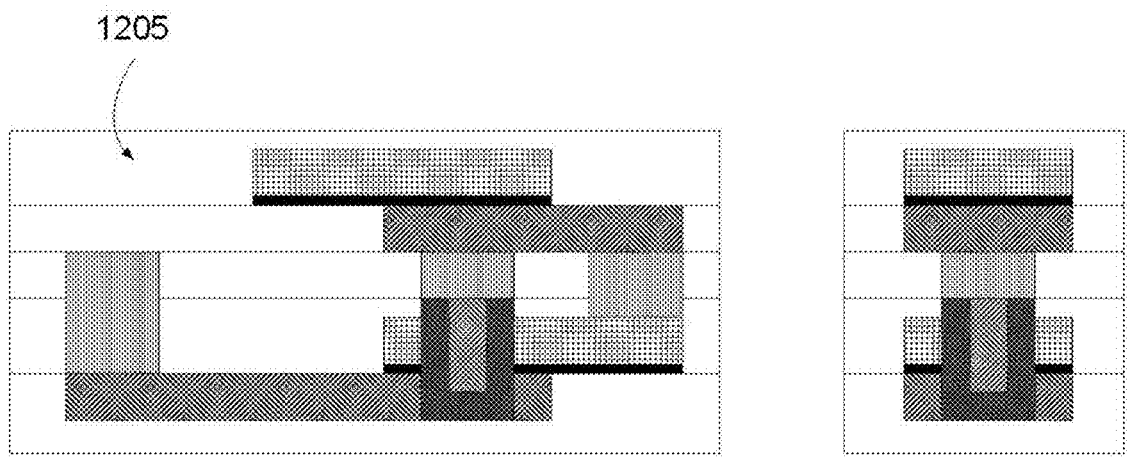
Figure 11H:
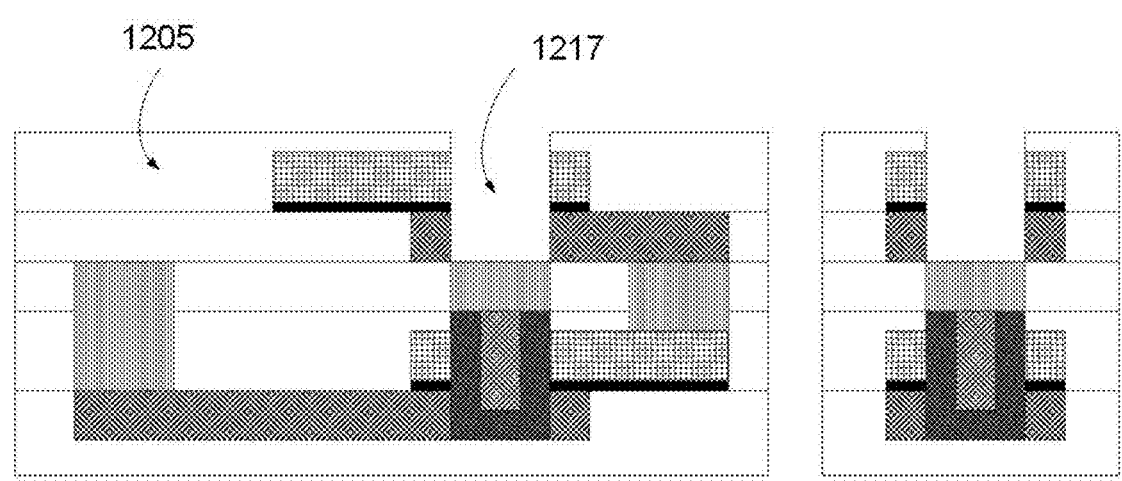
Figure 11I:
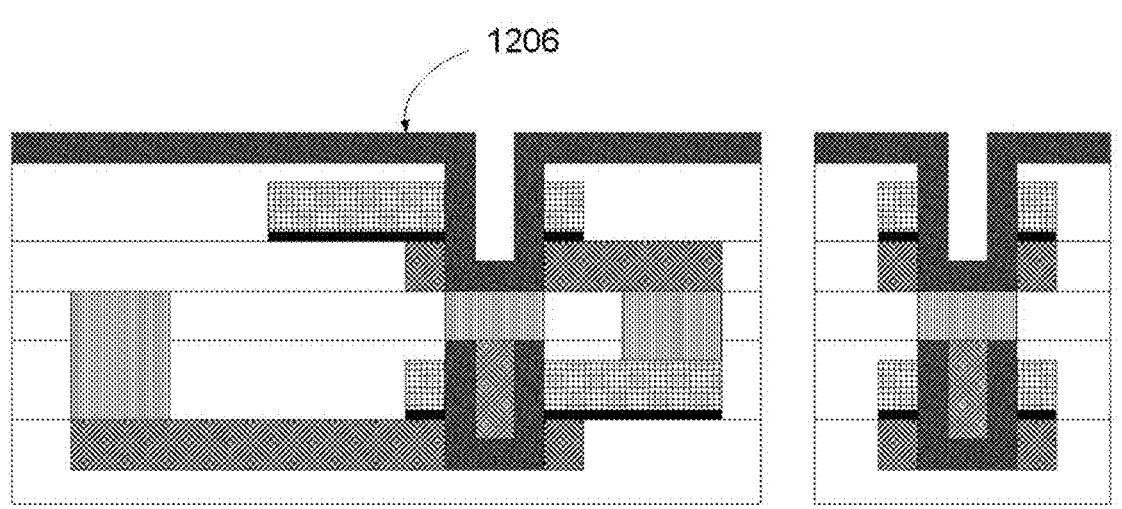
Figure 11J:
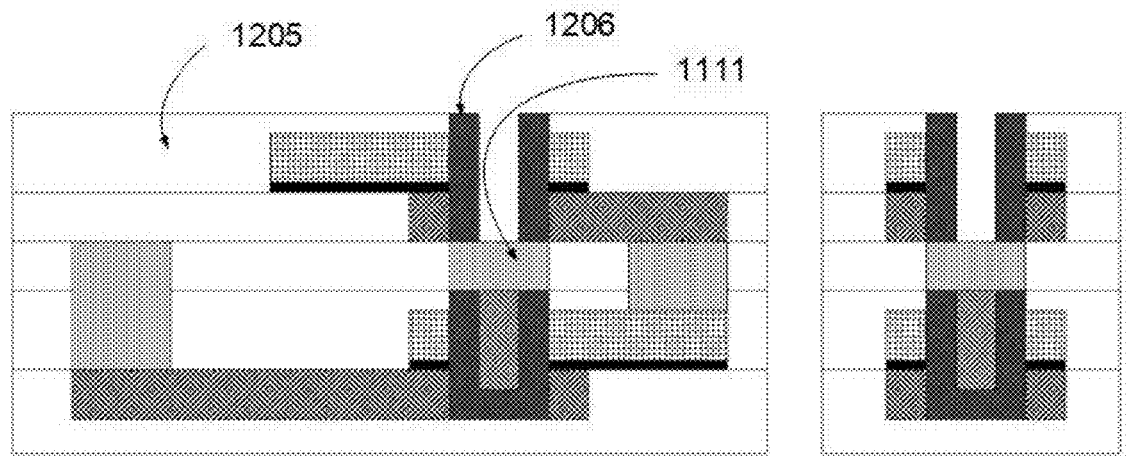
Figure 11K:
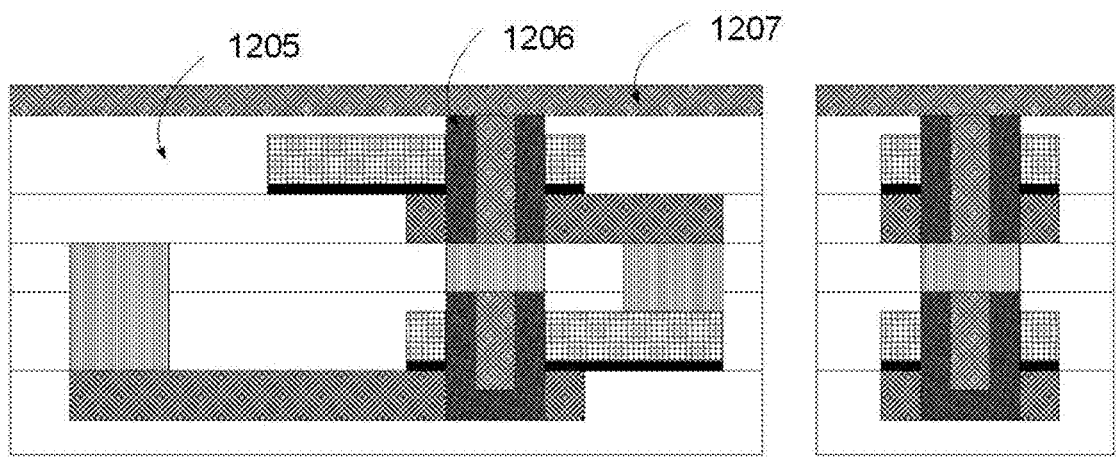
Figure 11L:
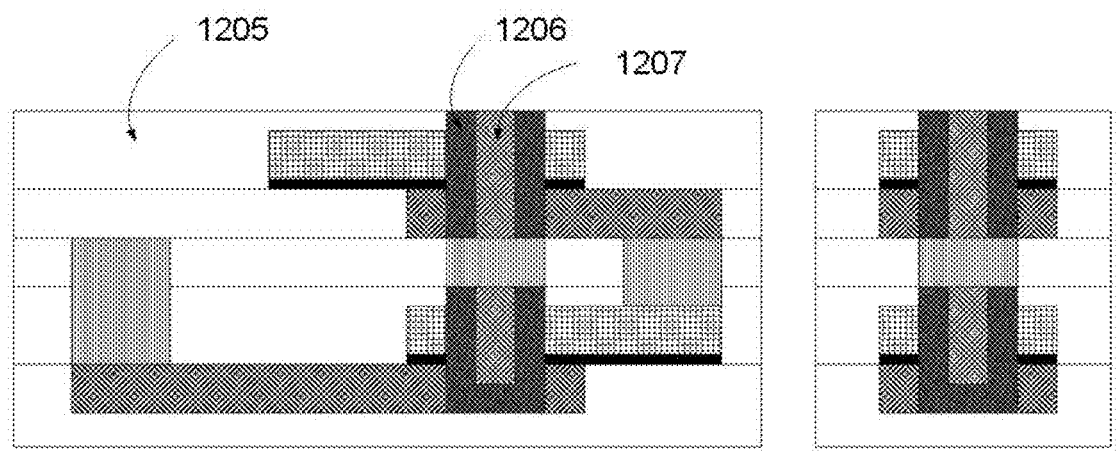
Figure 11M:
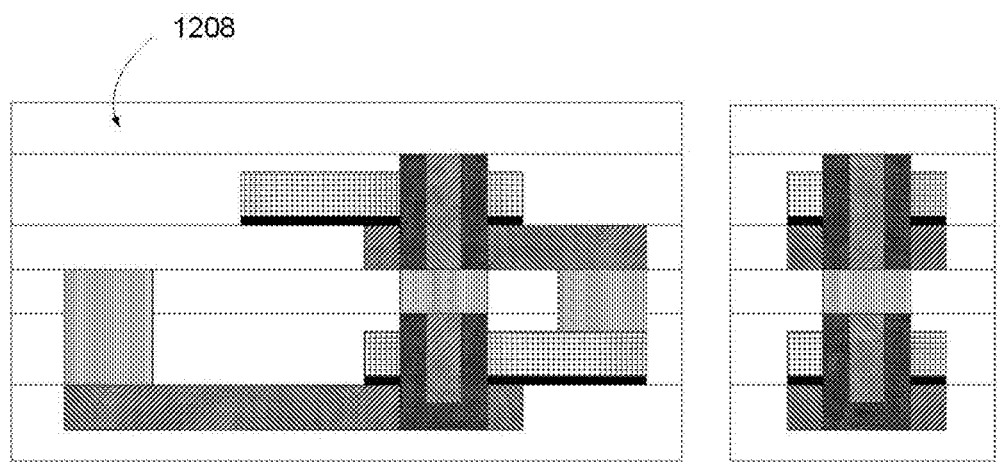
Figure 11N:
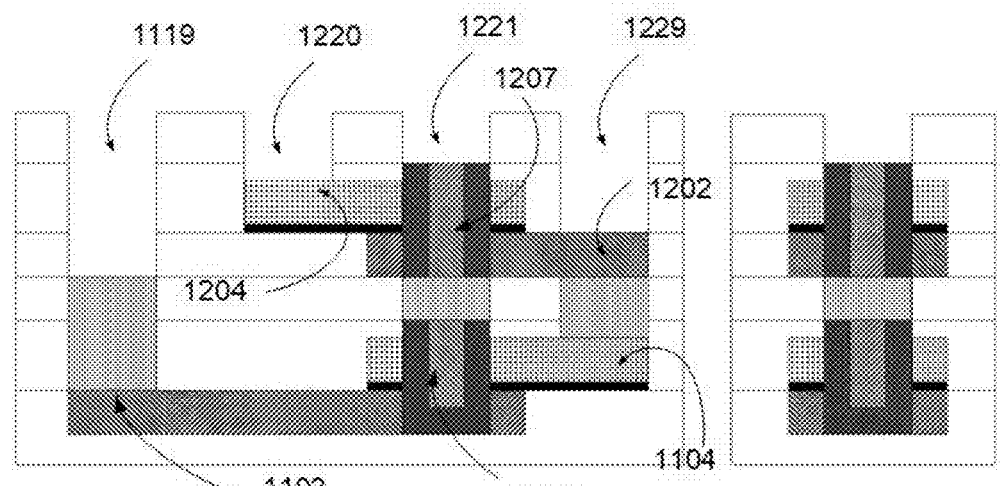
Figure 11O:
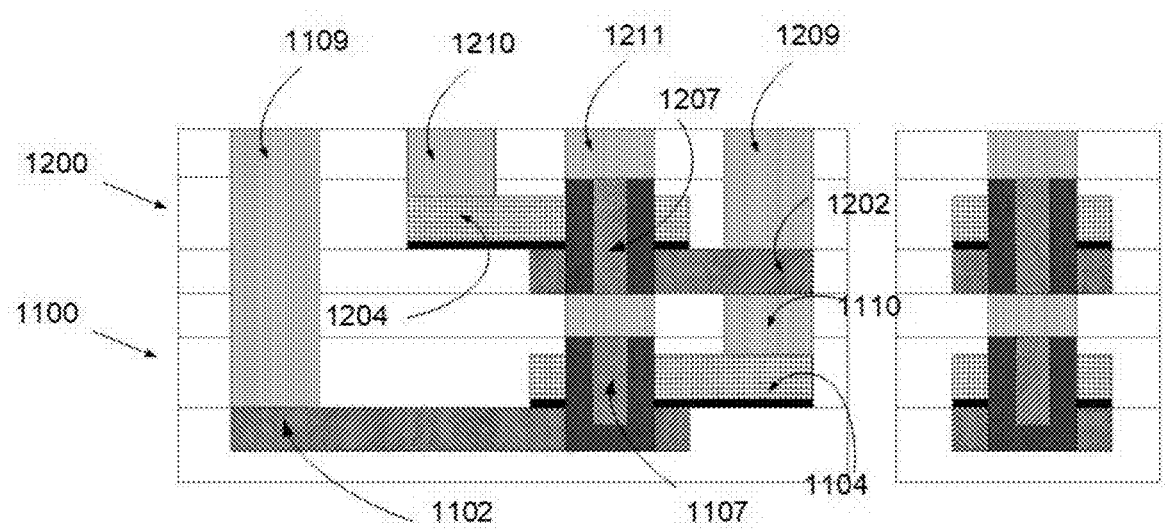

FIGS. 11A to 11O provide an example for the manufacturing process of an inverter. In order not to repeat already provided details, the starting point for this sequence corresponds to FIG. 3L, i.e. to an already manufactured vertical FET 1100. This vertical FET 1100 is assumed to be of either P-type or N-type. The P-type or N-type character of the transistor is determined, among others, by the materials used for each electrode as they determine the deformation of the valence and conduction bands of the semiconductor at the interfaces. The type can be also determined by the characteristics of the semiconductor itself. Dopants may be added to obtain an N-type character (doping with an electron donor) or a P-type character (donor with an electron acceptor). Environment dopant can be used such as contact with organic or inorganic dopant materials/molecules. Furthermore, when applicable, the behavior of the semiconductor may also be defined by the conformal dielectric used to provide a compact active layer. Apart from that, it is known that certain materials exhibit a P-type or N-type character or that certain treatments like doping or annealing can be used to tune its effective semiconductor character. The metal used for source and drain can be changed to tune polarity towards P or N type device.

The different parts of the lower transistor 1100 are presented in FIG. 11A. A substrate 1101 is used onto which the first electrode 1102 is formed. An active layer 1103 is sandwiched between said first electrode 1102 and the second electrode 1104. The gate structure is formed as previously explained and it contains both a gate insulating layer 1106 and a gate conductor 1107. Finally, a first contact 1109 is made for the first electrode 1102, a second contact 1110 is made for the second electrode 1104 and a third contact 1111 is made for the gate conductor 1107. As in previous examples, a first dielectric layer 1105 and a second dielectric layer 108 are also provided.

In order to manufacture the inverter, a second vertical FET 1200 is manufactured on top of the first FET 1100. The type of the second FET 1200 is complementary, i.e. opposite, to the type of the first FET. As indicated in FIG. 11B, an interlayer dielectric layer 1201 is deposited on top of the first (or lower vertical FET 1100). The ILD layer may comprise any of the dielectric materials already mentioned while introducing the other ILD layers. ILD layer 1201 acts as a substrate for the second (i.e. upper) vertical FET 1200. Then, FIGS. 11C to 11I show the following manufacturing steps which, in this particular embodiment, correspond to the steps already presented in, e.g. FIGS. 3A to 3G, i.e. up to the deposition of the gate insulating layer 1206. A first electrode 1202, an active layer 1203 and a second electrode 1204 are created for the upper transistor. Then, an ILD layer 1205 is deposited before defining the region 1217 for the gate arrangement of the upper transistor.

A difference can be identified in FIG. 11J, which is linked to the functionality of the manufactured logical circuit, i.e. an inverter. In order to build an inverter, the gates of both the P-type and N-type transistors are connected. For that reason, the etching of the gate insulating layer 1206 shown in FIG. 11J is such that the insulating layer at the bottom of the gate regions or cavity/well for the upper transistor 1200 is also removed, thus exposing the gate contact 1111 of the lower vertical FET 1100. FIG. 11K shows the deposition of the gate conductor 1207 which, in this case, permits not only the control of the upper vertical FET 1200 but also the electrical connection of the gates of both transistors 1100 and 1200. The gate conductor is deposited over the whole surface so, as with previous cases, a CMP process step is needed so that the gate insulator 1206 and the gate conductor 1207 are only deposited at the gate location (FIG. 11L).

After removal of the gate conductor, the process is ready for the definition of the different device contacts. In order to enable those contacts, a further ILD layer 1208 may be deposited as shown in FIG. 11M. Subsequently, contacts may be patterned with a photolithography and dry etching step as schematically illustrated in FIG. 11N. The location of the contacts is again determined by the functionality of the logical circuit. The contact for the first electrode 1202 of the upper FET transistor 1200 is aligned with the contact 1110 of the second electrode 1104 of the lower vertical FET 1100. In order to enable this connection, a pattern 1229 is made in the structure. This connection corresponds to the output of the inverter. On the other hand, a pattern 1119 is made for the first electrode 1102 of the lower FET 1100 which, in this case, is contacted from the top (see FIG. 12 for an alternative embodiment). A further pattern 1220 is provided for the second electrode 1204 of the upper transistor 1200. Finally, a pattern 1221 for the gates is made.

After all contacts are patterned, the contact conductor is deposited, thus enabling electrical connection and operation of the inverter. In particular, a first contact 1109 is used to connect the first electrode 1102 of the first transistor 1100 to either Vdd or Vss. A second contact 1210 is used for the second electrode 1204 of the upper transistor 1200 which is then connected to the other of Vdd and Vss. A third contact 1211 is used for the gate conductor 1207 of the upper transistor 1200 which, as previously indicated, is also connected to the gate conductor 1107 of the lower transistor 1100. This contact is the input of the inverter. Finally, a fourth contact 1209 is used for the first electrode 1202 of the upper transistor 1200, which is connected to the second electrode 1104 of the lower transistor 1100. This fourth contact is the output of the inverter.

Although the inverter presented in FIG. 11 is based on the vertical FET embodiment presented in FIGS. 3A-3L, i.e. a Semiconductor-All-Around (SAA) transistor with no fins, it is understood that the same principle is applicable to the other embodiments.

Figure 12:
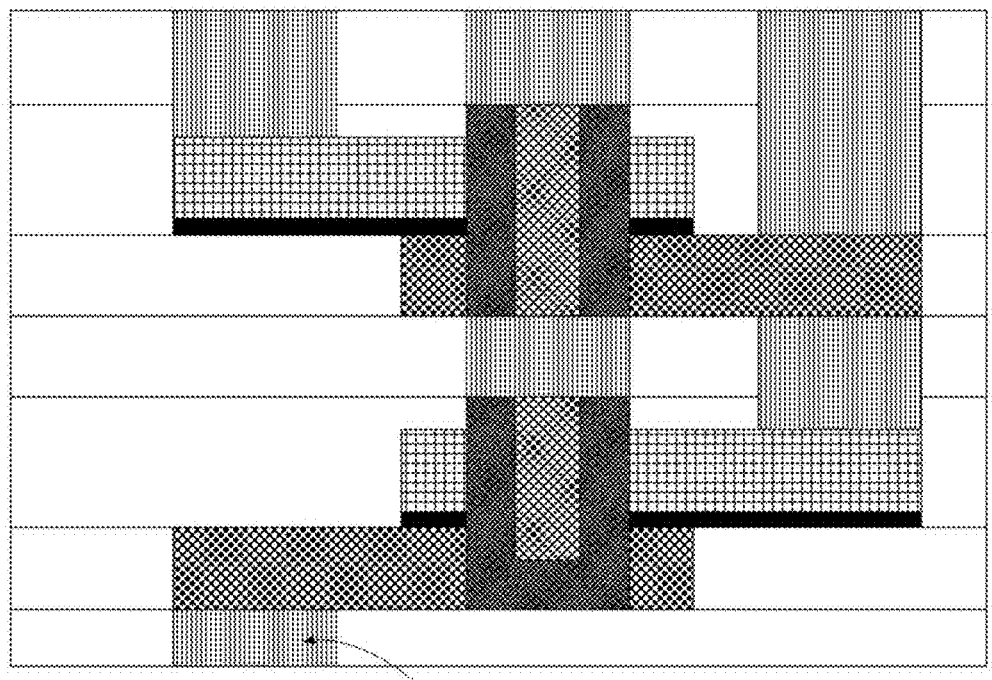
FIG. 12 schematically illustrates an example of a CFET inverter with top and bottom contacts.
Figure 13:
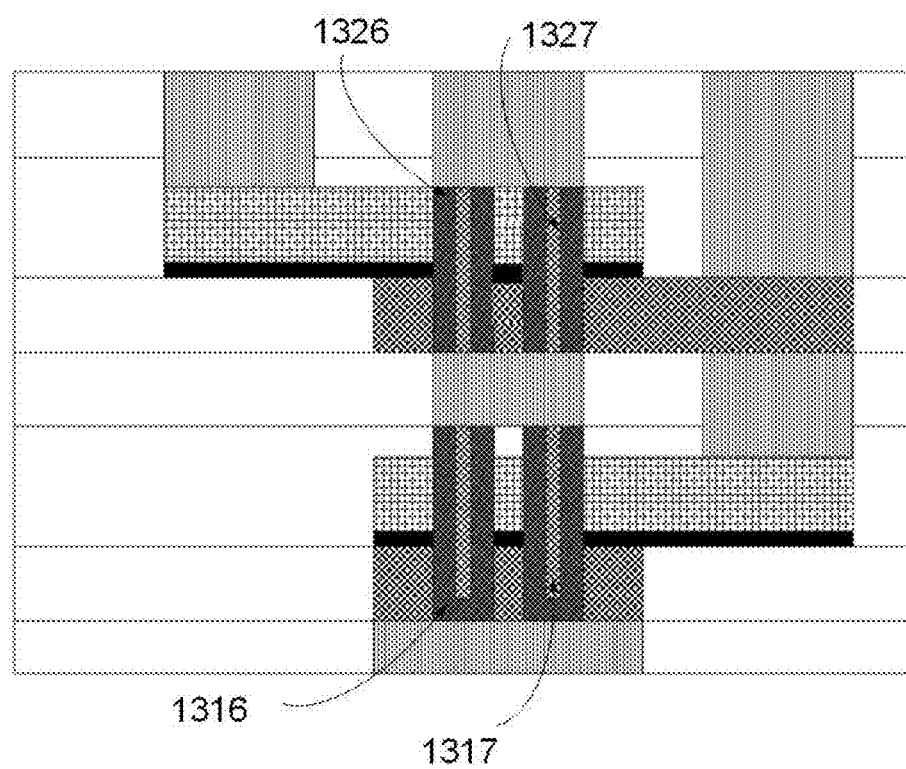
FIG. 13 schematically illustrates an example of a CFET inverter obtained by arranging a second vertical FET on a first vertical FET, the vertical FETs according to the example of the transistor with fins shown in FIGS. 4A-4L.
Figure 14:
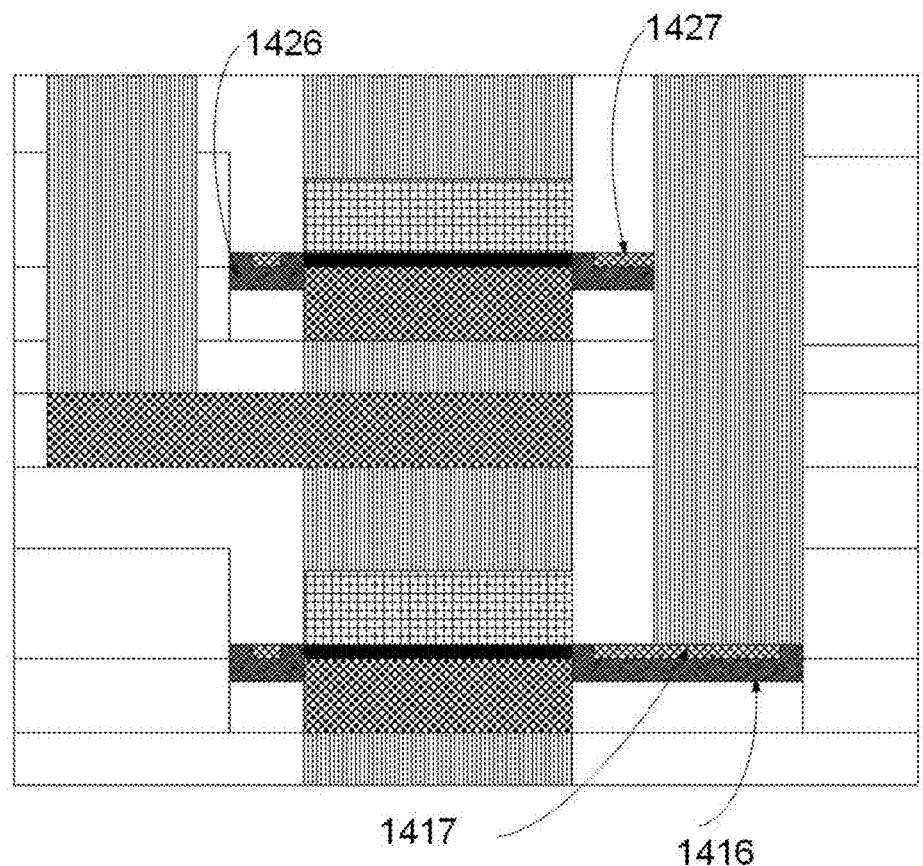
FIG. 14 schematically illustrates an example of a CFET inverter obtained by arranging a second vertical FET on a first vertical FET, the vertical FETs according to the example of the transistor with gate-all-around (GAA) arrangement shown in FIGS. 6A-6O.

By way of non-limiting examples, FIG. 12 shows an inverter arrangement comprising a bottom contact 1249 for the first electrode of the lower vertical FET. Bottom contacts are also used for the inverters depicted in FIG. 13 and FIG. 14, which are respectively based on the architectures introduced in FIGS. 4A-4L (SAA with fins) and FIGS. 5A-5O (GAA). FIG. 13 shows an inverter comprising to vertical FETs, each one of them comprising a fin. The arrangement of the gate insulating layer 1316 and the gate conductor 1317 are such that a transistor with a fin structure is present. The same is true for the upper transistor based on the arrangement of its gate insulation layer 1326 and gate conductor 1327. Regarding FIG. 14, the arrangement of the gate insulation layers 1416 and 1426 and the gate conductors 1417 and 1427 of the lower and upper transistors respectively results in a configuration where the gate completely surrounds the overlapping outer perimeter of the overlapping region for both transistors.

Figure 15:
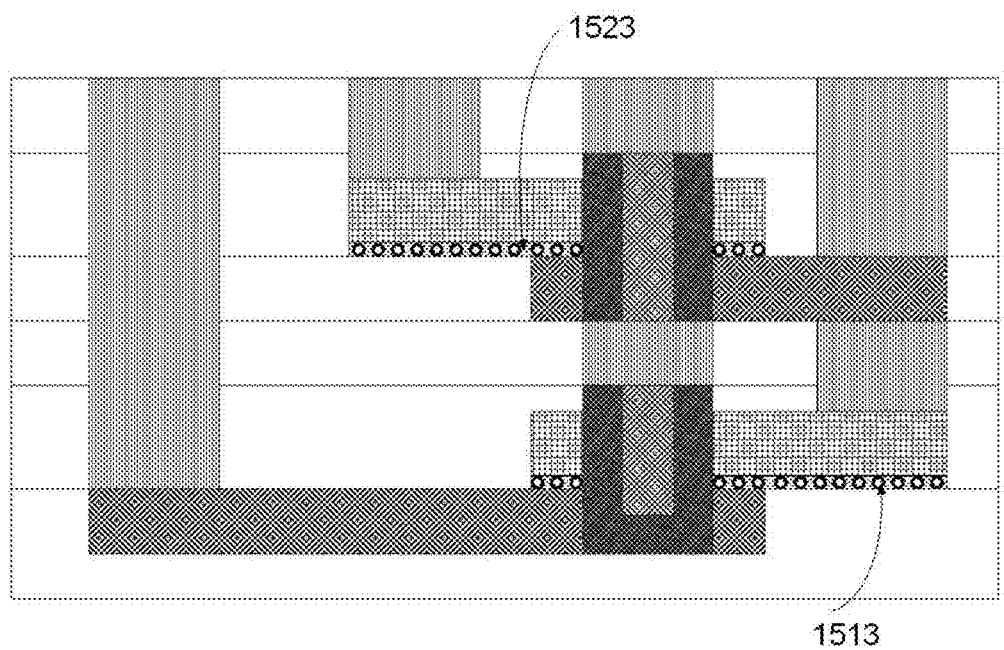
FIG. 15 schematically illustrates an example of a CFET inverter obtained by arranging a second vertical FET on a first vertical FET, the vertical FETs according to the example of the transistor with SWCNT as active material shown in FIGS. 7A-7D.
Figure 16:
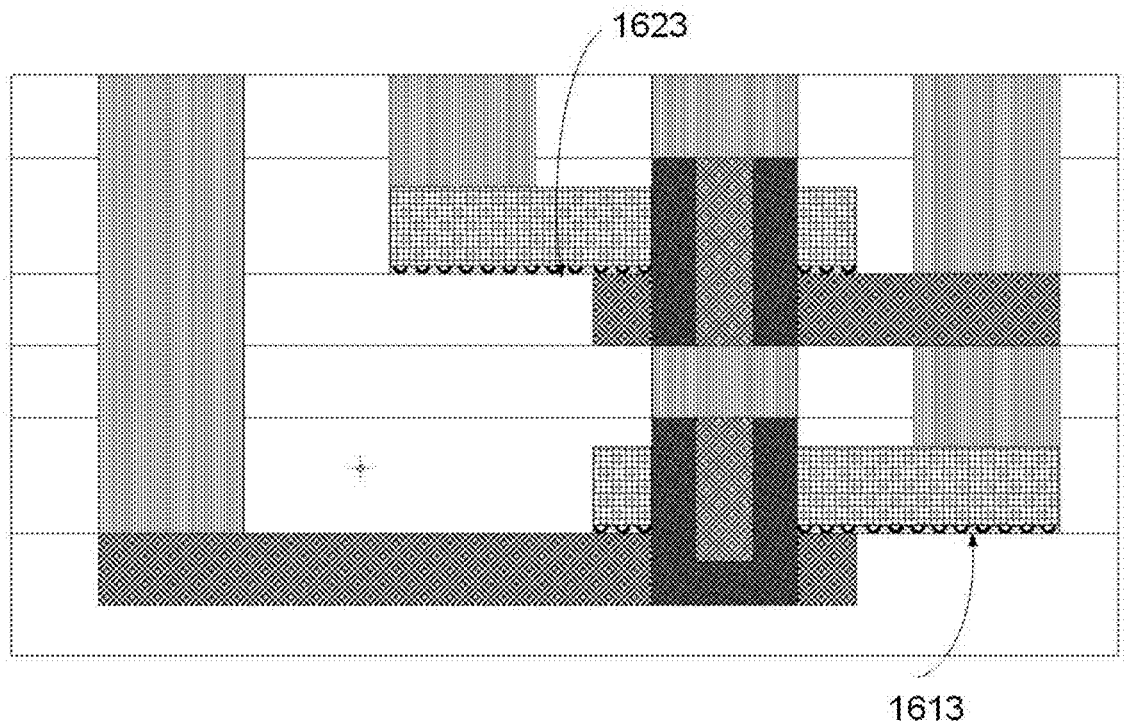
FIG. 16 schematically illustrates an example of a CFET inverter obtained by arranging a second vertical FET on a first vertical FET, the vertical FETs comprising unzipped SWCNTs.
Figure 17:
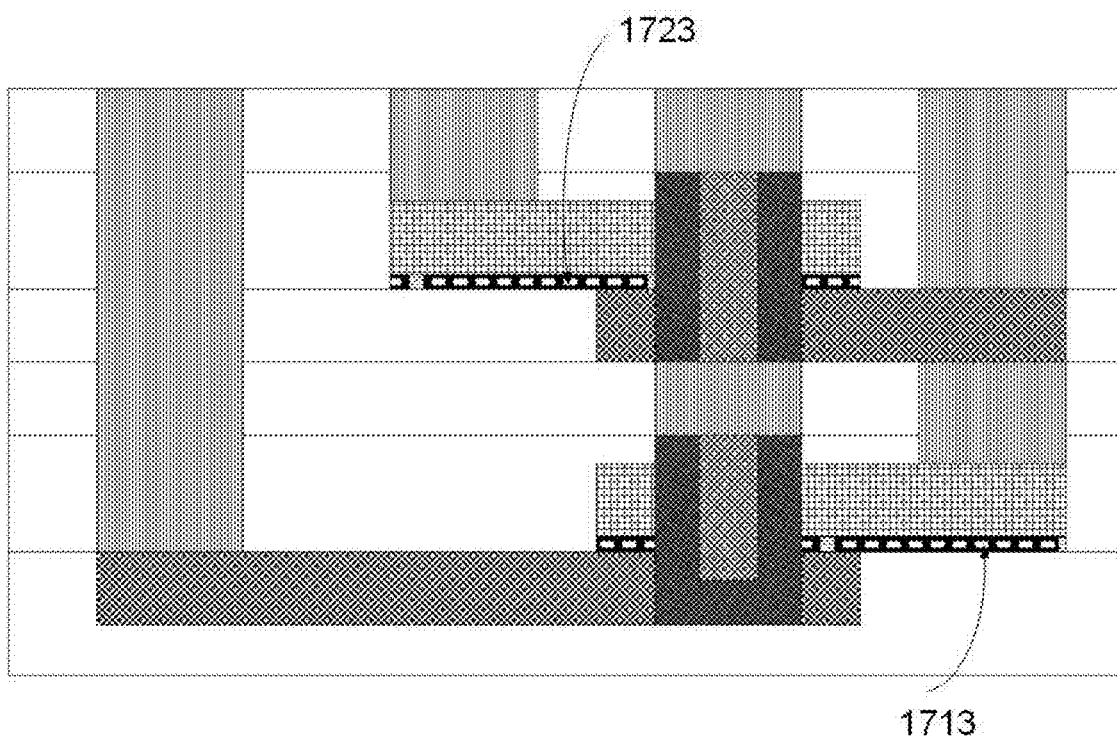
FIG. 17 schematically illustrates an example of a CFET inverter wherein a two-dimensional transitional metal dichalcogenide (TMD) is used as active material as shown in FIGS. 10A-10D.

The use of examples of the present disclosure for the stacking of vertical FETs in complementary arrangements is not limited to the specific active material either. FIG. 15 provides an example of an inverter comprising a single row of SWCNTs 1513 for the lower transistor and another single row of SWCNTs 1523 for the upper transistor. As a matter of fact, even shorter channel lengths may be obtained by using unzipped or partially unwrapped SWCNTs. Such unzipped or unwrapped SWCNTs may be regarded as curved graphene. This is depicted in the inverter of FIG. 16, which comprises a row of unzipped SWCNTs 1613 for the lower transistor and another row of unzipped SWCNTs 1623 for the upper transistor. Such unzipped or partially unwrapped SWCNTs may be prefabricated and deposited on the substrate. Alternatively, a single row of standard SWCNTs may be deposited. Then, a conformal dielectric layer may be deposited as mentioned above to obtain a compact layer. Finally, etching of the dielectric layer may be carried out in such a manner that at least a portion of the SWCNTs is also etched, thus resulting in a layer with unzipped SWCNTs. As in previous examples, in this case, 1D materials other than SWCNTs may be used in further variants of this example. Finally, FIG. 17 provides an example comprising 2D material 1713-1723 for the lower and upper transistor.

Figure 18:
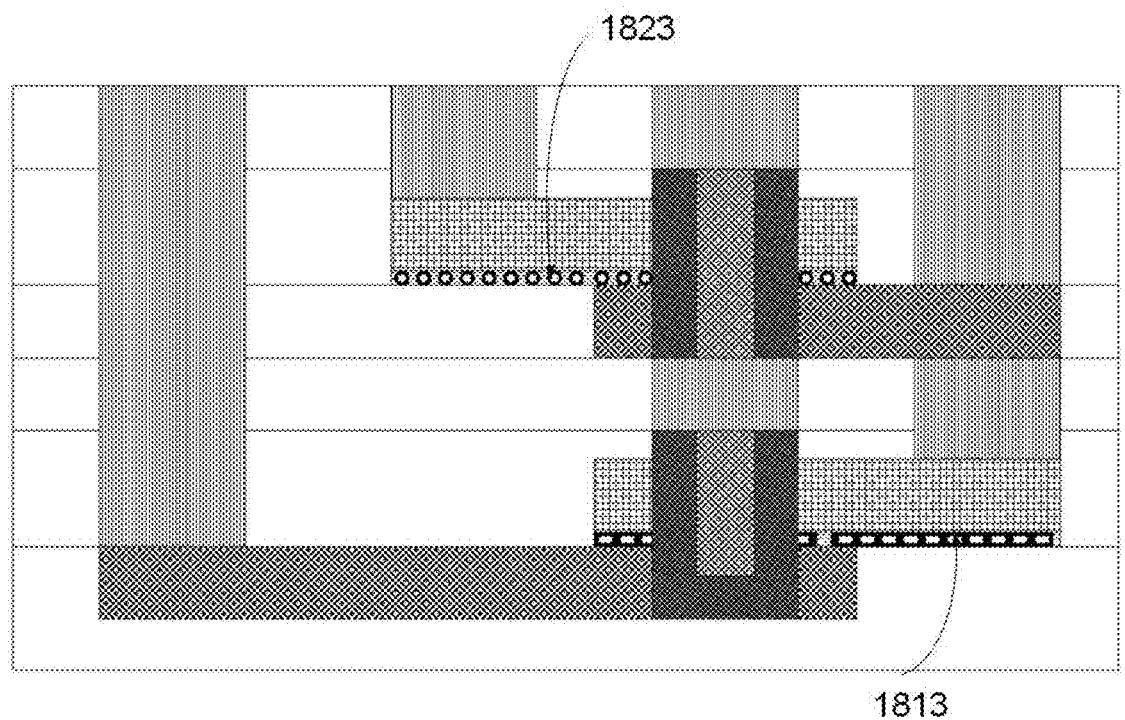
FIG. 18 schematically illustrates an example of a CFET inverter wherein different semiconductors are used for the active layers of the upper and lower transistors.

The flexibility of the manufacturing technique may also be used to combine vertical FETs comprising different types of active material in the same circuit. As an example, FIG. 18 shows an inverter circuit where the lower vertical FET comprises an active layer 1813 with a 2D material whereas the upper vertical FET comprises an active layer 1823 comprising a single row of SWCNTs as the active material. The selection of one active material or another may depend on the functionalities required for each device and, more particularly, on the P-type or N-type character demanded. For instance, it is known in the art that most transition-metal dichalcogenide (TMD) materials exhibit n-type behavior without intentional doping whereas most semiconductor CNTs exhibit p-type behavior.

Figure 19:
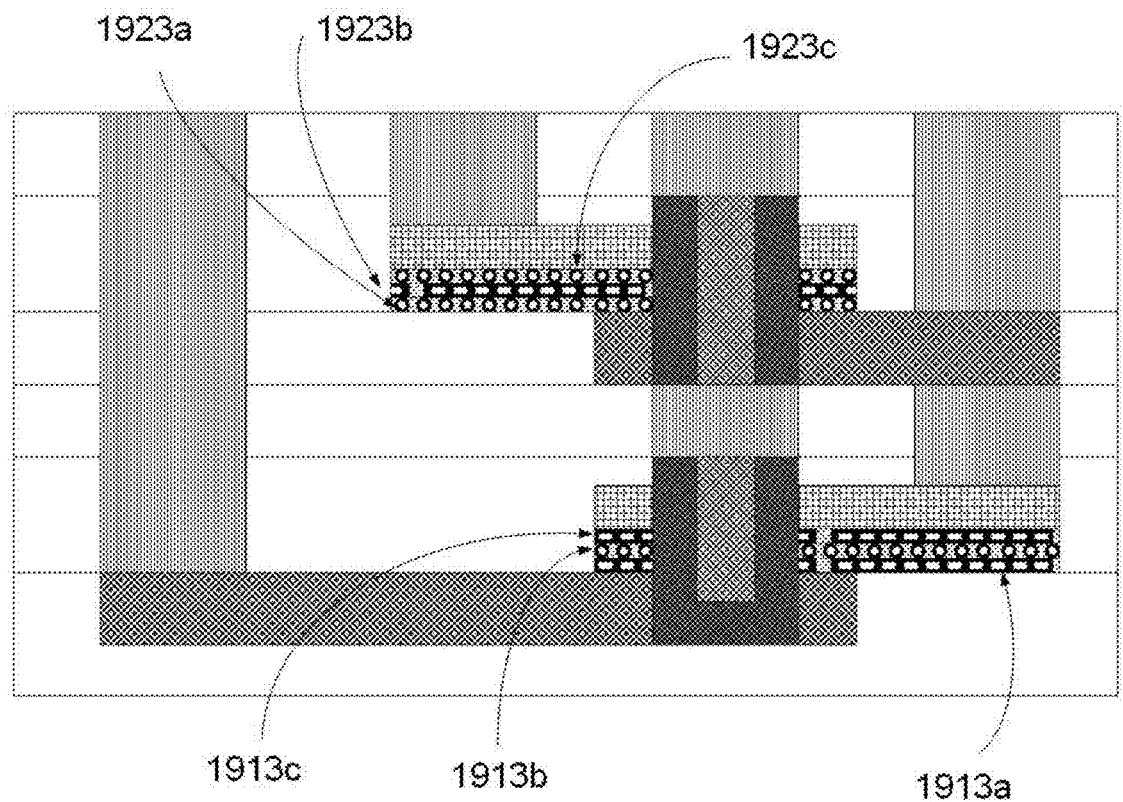
FIG. 19 schematically illustrates an example of a CFET inverter, wherein the active layer of each transistor comprises a plurality of sub-layers, each of them comprising different families of low dimensional materials.
Figure 20:
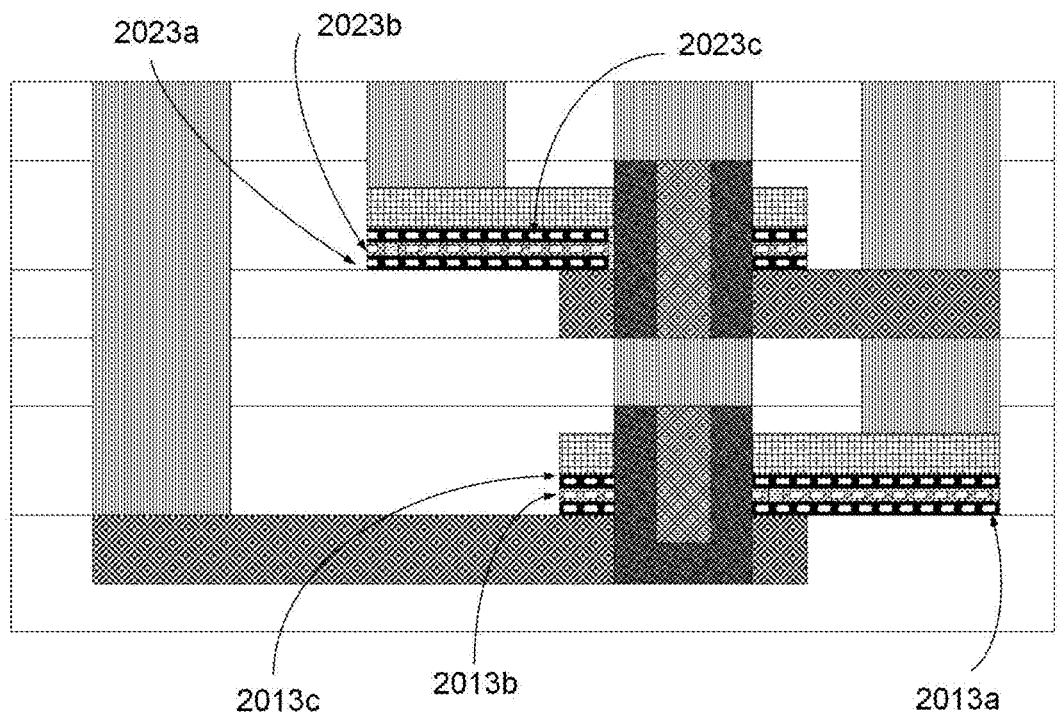
FIG. 20 schematically illustrates an example of a CFET inverter, wherein the active layers comprise a plurality of sub-layers, each of them comprising a similar family of low dimensional materials.

In yet a further example, the vertical FET may be manufactured with an active layer comprising a plurality of sub-layers so as to achieve the desired transistor properties. In that sense, FIG. 19 shows an exemplary inverter in which the lower transistor comprises an active layer with three sub-layers: one of the sub-layers 1913b comprises a single row of SWCNTs and this is sandwiched by two further sub-layers (1913a and 1913c) comprising 2D materials (e.g. $WS_2$ or $MoS_2$). In this particular embodiment, the opposite arrangement is used for the upper transistor which is also employing three sub-layers for its active layer. In this case though, the intermediate sub-layer 1923b is the one comprising a 2D material whereas the other two sub-layers (1923a and 1923c) comprise a single row of SWCNT. Other combinations may be possible. In particular, different number of sub-layers may be used for the lower and the upper transistor. Also the combination of active materials may vary for other embodiments and, for instance, active layers may comprise sub-layers with different types of semiconductors but with similar geometry such as a stack of 2D material sub-layers comprising a combination of, e.g. $MoS_2$ and $WS_2$ sub-layers. Such an arrangement is presented in the inverter of FIG. 20. In this design, both the lower and the upper inverter comprise an active layer with different sublayers but they are made out of materials with similar geometry. The lower vertical FET comprises sub-layers 2013a-c whereas the upper vertical FET comprises sub-layers 2023a-c for their respective active layers.

Although vertical FETs with active layers comprising multiple sub-layers have been presented in the context of an inverter circuit, it is understood that this is just provided as an example. Indeed, the same concept may be used for any other logical circuit and/or for individual transistors. Accordingly, vertical FETs according to examples of this disclosure may be used in any electronic device using integrated circuits. Examples, without limitation, of such electronic devices include mobile phones, personal computers, television, music players, drones, automobiles, radios, healthcare equipment, memories, telecommunication systems, navigation systems or wearables.

Figure 23:
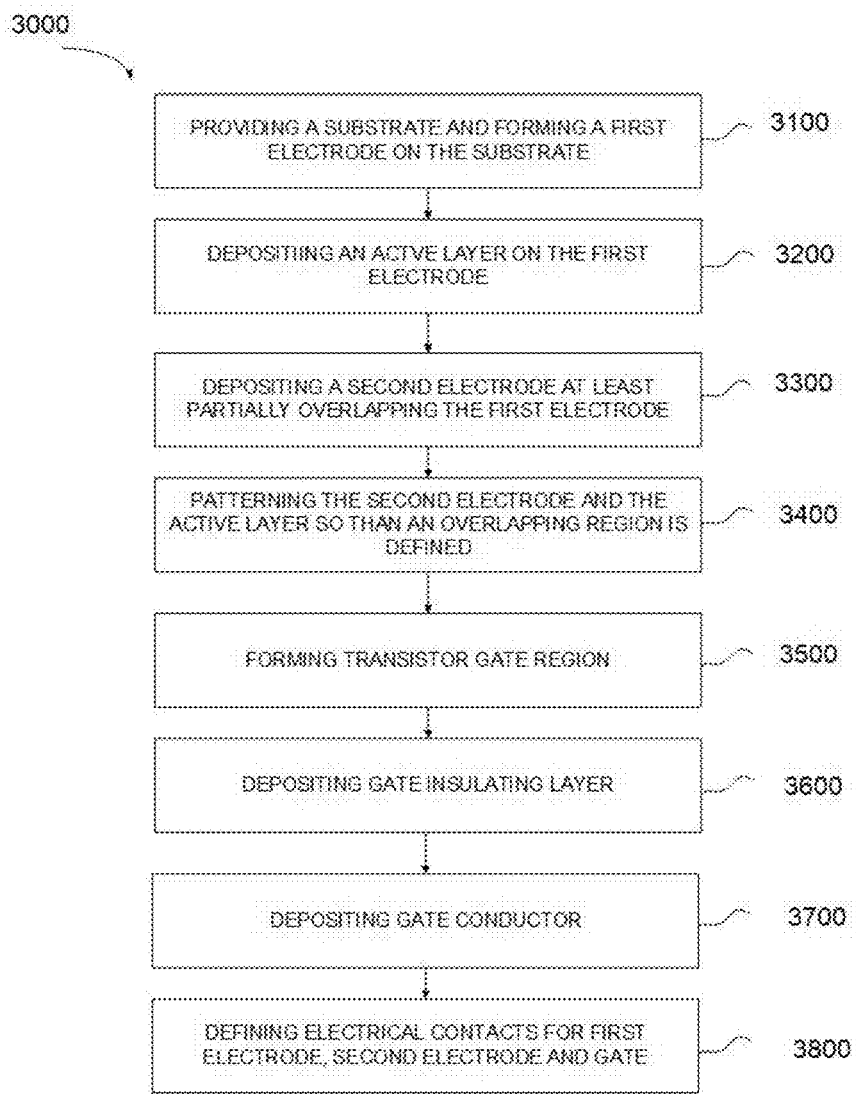
FIG. 23 shows a flow chart of an example of method of manufacturing a vertical field effect transistor.

FIG. 23 shows a flow diagram of a non-limiting method 3000 to fabricate a vertical field effect transistor according to an example. At 3100, the method 3000 includes providing a substrate and forming a first electrode on the substrate. At 3200, an active layer is deposited on the previously obtained first electrode. The method then proceeds to step 3300, where the second electrode is deposited in such a manner that it overlaps the first electrode. The next step 3400 consists in the patterning of the second electrode and the active layer. As a result of this patterning, a certain overlapping region is defined where the second electrode overlaps the first electrode. The overlapping region is defined by an outer perimeter. The next step 3500 of the method 3000 involves the patterning of a region, which may resemble a cavity or a well in some examples, for the transistor gate. Said region is such that at least a portion of the previously deposited active layer is exposed. Formation of the gate structure to control the transistor is then needed. A gate insulating layer is formed covering the exposed portion of the active layer in step 3600 whereas a gate conductor is deposited on the gate insulation layer in step 3700. The gate conductor is used to apply a voltage that controls the conduction state of the active layer whereas the gate insulating layer ensures the gate conductor is not in direct contact with the electrodes or with the channel. Finally, in step 3800, contacts are deposited to enable the connection of the first electrode, second electrode and gate to the exterior.

Figure 24:
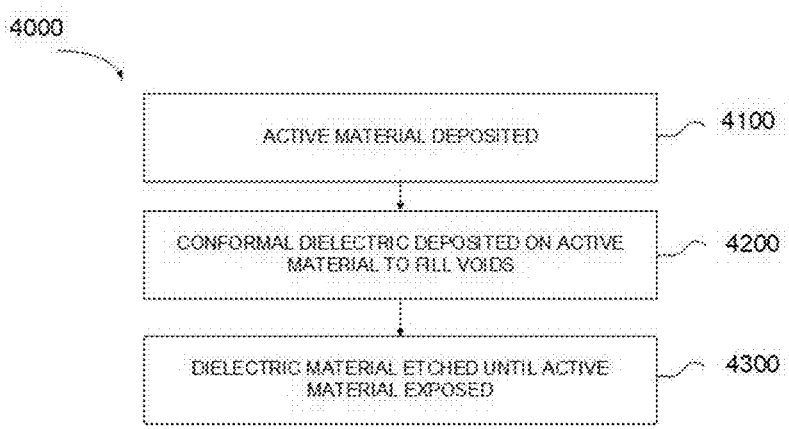
FIG. 24 shows a flow chart of an example of a method for manufacturing the active layer of a vertical field effect transistor.

As shown in the flow diagram of FIG. 23, an active layer needs to be deposited on the first electrode in step 3200. This step becomes particularly challenging when using active materials that, because of their nature or formation process, are likely to result in a non-compact layer featuring voids or gaps. This may be the case when using 2D materials or carbon nanotubes. Those gaps may result in a direct electrical contact between the first electrode and the second electrode, thus shorting the transistor. In order to prevent such failure mechanism, a method 4000 of manufacturing the active layer is shown in FIG. 24. At 4100, a first layer of active material is obtained on the first electrode of the transistor. This layer can exhibit different degrees of porosity. The process then moves to step 4200, in which a conformal filing interlayer dielectric (ILD) layer is deposited on top of the active material. This dielectric is filling the gaps in the initial active layer thus giving place to a compact structure. The active material must be obviously in contact with the second electrode. For that reason, a third step 4300 is required to complete the active layer. In this step, the ILD layer is etched (if necessary) in a controlled manner until the active material is exposed and, accordingly, in contact with the second electrode deposited on its surface in a later step of the overall process as depicted in step 3300 of FIG. 23.

For the sake of clarification, and even if most examples comprising 1D materials have been described with reference to CNTs, it is to be understood that other 1D materials, such as $MoS_2$ nanotubes, $WS_2$ nanotubes, nanowires or nanorods may also be used in the shown examples. Similarly, examples comprising 2D materials are not to be understood as limited to specific 2D materials and it should be clear that different materials such as graphene, $MoS_2$ or $WS_2$ may be used in different variants.

For reasons of completeness, various aspects of the present disclosure are set out in the following numbered clauses:

Clause 1. A vertical field effect transistor, comprising:
a substrate;
a first electrode on the substrate and configured as either a source or a drain of the transistor;
a second electrode configured as the other of the source and the drain of the transistor, wherein the second electrode at least partially overlaps the first electrode in an overlapping region;
an active layer sandwiched between the first electrode and the second electrode; and
a gate having a gate conductor portion and a gate insulating layer, the gate insulating layer being arranged between the gate conductor portion and the active layer.

Clause 2. A vertical field effect transistor according to clause 1 wherein the active layer comprises a 1D material, specifically carbon nanotubes (CNTs), and particularly wherein the 1D material is arranged with its longitudinal axis parallel to the substrate.

Clause 3. A vertical field effect transistor according to clause 2 wherein the active layer comprises carbon nanotubes (CNTs) in at least one of the following forms: a single layer of single wall carbon nanotubes (SWCNTs); a single layer of multi-walled CNTs, a single layer of unzipped SWCNTs; a layer with multiple rows of aligned SWCNTs; a layer with multiple rows of aligned multi-walled CNTs; a network of non-aligned SWCNTs and a network of non-aligned multi-walled CNTs.

Clause 4. A vertical field effect transistor according to any previous clause wherein the active layer comprises a two-dimensional (2D) material, specifically wherein the active layer comprises a transition metal dichalcogenide (TMD) material and, more specifically comprises $MX_2$ such as $MoS_2$, $WeS_2$ or $WS_2$, and particularly wherein the 2D material is arranged with its plane parallel to the substrate.

Clause 5. A vertical field effect transistor according to clause 4 wherein the active layer comprises a stack of 2D material sheets.

Clause 6. A vertical field effect transistor according to any of clauses 2 to 5, wherein the active layer further comprises a conformal dielectric.

Clause 7. A vertical field effect transistor according to any previous clause wherein at least one of the first electrode and the second electrode comprises either a metal, or a semi-metal, or a 1D conductor, or a 2D conductor, or a doped semiconductor.

Clause 8. A vertical field effect transistor according to any previous clause wherein the gate conductor portion comprises at least one of a metal, or a semi-metal, or a 1D conductor, or a 2D transition metal dichalcogenide, or a doped semiconductor.

Clause 9. A vertical field effect transistor according to any previous clause, wherein the overlapping region has an outer perimeter, and wherein the gate is at least partially arranged inside the outer perimeter of the overlapping region.

Clause 10. A vertical field effect transistor according to clause 9, wherein the gate comprises a first insulating layer with a U-shaped cross-section, and a second insulating layer with a U-shaped cross-section, wherein the first insulating layer and the second U-shaped insulating layer are separated by a portion of the first electrode, the active layer and the second electrode.

Clause 11. A vertical field effect transistor according to clause 9 or clause 10, wherein the gate is completely arranged inside the outer perimeter of the overlapping area.

Clause 12. A vertical field effect transistor according to clause 9 or clause 10, wherein the gate extends beyond at least one side of the outer perimeter of the overlapping region.

Clause 13. A vertical field effect transistor according to any of clauses 1 to 8, wherein the overlapping region has an outer perimeter, and wherein the gate is arranged outside and adjacent to the outer perimeter of the overlapping region.

Clause 14. A vertical field effect transistor according to clause 12 or 13, wherein the gate is arranged substantially flush with the active layer.

Clause 15. A vertical field effect transistor according to any previous clause, wherein the active layer comprises a plurality of sub-layers.

Clause 16. A vertical field effect transistor according to clause 15, wherein at least two sub-layers comprise a different type of active material each.

Clause 17. A vertical field effect transistor according to clause 16, wherein at least a first sub-layer comprises a 1D semiconductor and at least a second sub-layer comprises a 2D semiconductor.

Clause 18. A vertical field effect transistor according to any previous clause wherein the materials of the first electrode, of the second electrode, and/or of the active layer are selected so that the transistor behaves as either a P-type or N-type field effect transistor.

Clause 19. A semiconducting structure comprising a first vertical field effect transistor according to any previous clause and a second vertical field effect transistor according to any previous clause, the second vertical field effect transistor being disposed on top of the first field effect transistor.

Clause 20. A semiconducting structure comprising a first vertical field effect transistor according to any previous clause and a second vertical field effect transistor according to any previous clause, the second vertical field effect transistor being disposed on side of the first field effect transistor.

Clause 21. A semiconducting structure according to clauses 19 or 20, wherein the first field effect transistor is either a P-type or N-type transistor and the second field effect transistor is the other of a P-type and N-type transistor.

Clause 22. A method of manufacturing a vertical field effect transistor, specifically a vertical field effect transistor according to any of clauses 1-18, the method comprising:
  forming a first electrode on a substrate;
  depositing an active layer on the first electrode;
  depositing a second electrode on the active layer to form a sandwich structure with an overlapping region having an outer perimeter;
  forming a gate region, the gate region exposing at least a portion of the active layer;
  depositing a gate insulating layer covering the portion of the exposed active layer;
  depositing a gate conductor on the gate insulating layer such that the gate insulating layer is arranged between the gate conductor and the active layer;
  forming electrical contacts for the first electrode, the second electrode and the gate conductor.

Clause 23. A method of manufacturing a vertical field effect transistor according to clause 22, wherein depositing an active layer comprises depositing a layer comprising CNTs and/or 2D materials as semiconductor material.

Clause 24. A method of manufacturing a vertical field effect transistor according to clause 23, wherein depositing an active layer comprises depositing a single row of CNTs, particularly of SWCNTs.

Clause 25. A method of manufacturing a vertical field effect transistor according to clause 23, wherein depositing an active layer comprises depositing a plurality of rows of aligned CNTs, particularly of SWCNTs.

Clause 26. A method of manufacturing a vertical field effect transistor according to any of clauses 23 to 25, the method further comprising
  depositing a conformal dielectric layer on top of the active layer after the deposition of the active layer;
  etching the conformal dielectric layer to expose the active material of the active layer before depositing the second electrode.

Clause 27. A method of manufacturing a vertical field effect transistor according to clause 26, wherein etching the conformal dielectric to expose the active materials of the active layer before depositing the second electrode comprises partially etching the active material.

Clause 28. A method of manufacturing a vertical field effect transistor according to any of clauses 22 to 27, wherein forming the gate region comprises forming a gate region that at least partially overlaps the overlapping region.

Clause 29. A method of manufacturing a vertical field effect transistor according to clause 28, wherein forming the gate region comprises forming at least two gate regions, the two gate regions being separated by a portion of the first electrode, the active layer and the second electrode.

Clause 30. A method of manufacturing a vertical field effect transistor according to clauses 28 or 29, wherein forming the gate region comprises forming the gate region in an area that is completely arranged inside the outer perimeter of the overlapping region.

Clause 31. A method of manufacturing a vertical field effect transistor according to clause 28 or 29, wherein forming the gate region comprises forming the gate region in an area that extends beyond the outer perimeter of the overlapping region.

Clause 32. A method of manufacturing a vertical field effect transistor according to any of clauses 22 to 27, wherein forming the gate region comprises forming the gate region in an area that surrounds the outer perimeter of the overlapping region.

Clause 33. A method of manufacturing a vertical field effect transistor according to clauses 31 or 32, the method further comprising:
  before depositing the gate insulating layer, forming a spacer in the gate region so that a bottom level of the resulting gate region has a height that results in a bottom surface of the gate conductor being flush with a bottom surface of the active layer; and
  etching the gate insulating layer and the gate conductor upon their deposition so that a top part of the remaining gate insulating layer and gate conductor are substantially flush with an upper surface of the active layer.

Clause 34. A method of manufacturing a vertical field effect transistor according to any of clauses 22-33, wherein forming the gate region comprises forming a cavity, and depositing the gate insulating layer comprises depositing the gate insulating layer covering inner walls of the cavity.

Clause 35. A method of manufacturing a vertical field effect transistor according to any of clauses 22 to 34, wherein depositing an active layer on the first electrode comprises depositing a plurality of sub-layers.

Clause 36. A method of manufacturing a vertical field effect transistor according to clause 35, wherein depositing a plurality of sub-layers comprises depositing at least a first sub-layer and a second sub-layer, the first sub-layer comprising a different active material than the second sub-layer.

Clause 37. A method of manufacturing a vertical semiconducting structure comprising manufacturing of a first vertical field effect transistor according to the method of any of clauses 22 to 36 and manufacturing a second field effect transistor on top of the previously manufactured transistor.

This written description uses examples to disclose the teaching, including the preferred embodiments, and also to enable any person skilled in the art to practice the teaching, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application. If reference signs related to drawings are placed in parentheses in a claim, they are solely for attempting to increase the intelligibility of the claim, and shall not be construed as limiting the scope of the claim.

The invention claimed is:

1. A vertical field effect transistor, comprising:
a substrate;
a first electrode on the substrate and configured as either a source or a drain of the transistor;
a second electrode configured as the other of the source and the drain of the transistor, wherein the second electrode at least partially overlaps the first electrode in an overlapping region;
an active layer sandwiched between the first electrode and the second electrode; and
a gate having a gate conductor portion and a gate insulating layer, the gate insulating layer being arranged between the gate conductor portion and the active layer, wherein the active layer comprises a 1D material arranged with its longitudinal axis substantially parallel to the substrate and/or the active layer comprise a 2D material arranged with its plane substantially parallel to the substrate.

2. The vertical field effect transistor according to claim 1 wherein the active layer comprises carbon nanotubes (CNTs).

3. The vertical field effect transistor according to claim 1, wherein the active layer further comprises a conformal dielectric.

4. The vertical field effect transistor according to claim 1, wherein the overlapping region has an outer perimeter, and wherein the gate is at least partially arranged inside the outer perimeter of the overlapping region.

5. The vertical field effect transistor according to claim 4, wherein the gate comprises a first insulating layer with a U-shaped cross-section, and a second insulating layer with a U-shaped cross-section, wherein the first insulating layer and the second U-shaped insulating layer are separated by a portion of the first electrode, the active layer and the second electrode.

6. The vertical field effect transistor according to claim 4, wherein the gate is completely arranged inside the outer perimeter of the overlapping area.

7. The vertical field effect transistor according to claim 4, wherein the gate extends beyond at least one side of the outer perimeter of the overlapping region.

8. The vertical field effect transistor according to claim 1, wherein the overlapping region has an outer perimeter, and wherein the gate is arranged outside and adjacent to the outer perimeter of the overlapping region.

9. The vertical field effect transistor according to claim 8, wherein the gate is arranged substantially flush with the active layer.

10. The vertical field effect transistor according to claim 1, wherein the active layer comprises a plurality of sublayers, optionally wherein at least two sublayers comprise a different type of active material each.

11. A method of manufacturing a vertical field effect transistor according to claim 1, the method comprising:
forming a first electrode on a substrate;
depositing an active layer on the first electrode;
depositing a second electrode on the active layer to form a sandwich structure with an overlapping region having an outer perimeter;
forming a gate region exposing at least a portion of the active layer;
depositing a gate insulating layer covering the exposed portion of the active layer;
depositing a gate conductor on the gate insulating layer such that the gate insulating layer is arranged between the gate conductor and the active layer; and
forming electrical contacts for the first electrode, the second electrode and the gate conductor.

12. The method of manufacturing a vertical field effect transistor according to claim 11, wherein forming the gate region comprises forming the gate region in an area that extends beyond the outer perimeter of the overlapping region or forming the gate region in an area that surrounds the outer perimeter of the overlapping region, the method further comprising:
before depositing the gate insulating layer, forming a spacer in the gate region so that a bottom level of the resulting gate region has a height that results in a bottom surface of the gate conductor being substantially flush with a bottom surface of the active layer; and
etching the gate insulating layer and the gate conductor upon their deposition so that a top part of the remaining gate insulating layer and gate conductor are substantially flush with an upper surface of the active layer.

13. The method of manufacturing a vertical field effect transistor according to claim 11, wherein forming the gate region comprises forming a cavity, and depositing the gate insulating layer comprises depositing the gate insulating layer covering inner walls of the cavity.

14. The method of manufacturing a vertical field effect transistor according to claim 11, wherein depositing an active layer comprises depositing a layer comprising CNTs and/or 2D materials as semiconductor material, and the method further comprising:
depositing a conformal dielectric layer on top of the active layer after the deposition of the active layer; and
etching the conformal dielectric layer to expose the active material of the active layer before depositing the second electrode.

15. The vertical field effect transistor according to claim 2, wherein the active layer comprises carbon nanotubes (CNTs) in at least one of the following forms: a single layer of single wall carbon nanotubes (SWCNTs); a single layer of multi-walled CNTs, a single layer of unzipped SWCNTs; a layer with multiple rows of aligned SWCNTs; a layer with multiple rows of aligned multi-walled CNTs; a network of non-aligned SWCNTs and a network of non-aligned multi-walled CNTs.

16. The vertical field effect transistor according to claim 1, wherein the active layer comprises a transition metal dichalcogenide (TMD) material and, specifically comprises $MX_2$ such as $MoS_2$, $WeS_2$ or $WS_2$.

17. A semiconducting structure comprising a first vertical field effect transistor and a second vertical field effect transistor, each of the first vertical field effect transistor and the second vertical field effect transistor comprising:
a substrate;
a first electrode on the substrate and configured as either a source or a drain of the transistor;
a second electrode configured as the other of the source and the drain of the transistor, wherein the second electrode at least partially overlaps the first electrode in an overlapping region;
an active layer sandwiched between the first electrode and the second electrode; and a gate having a gate conductor portion and a gate insulating layer, the gate insulating layer being arranged between the gate conductor portion and the active layer, wherein the active layer comprises a 1D material arranged with its longitudinal axis substantially parallel to the substrate and/or the active layer comprise a 2D material arranged with its plane substantially parallel to the substrate and wherein the second vertical field effect transistor is disposed on top of the first field effect transistor or on a side of the first field effect transistor, and optionally wherein the first field effect transistor is either a P-type or N-type transistor and the second field effect transistor is the other of a P-type and N-type transistor.

* * * * *